(12) United States Patent
Kato et al.

(10) Patent No.: US 10,522,688 B2
(45) Date of Patent: Dec. 31, 2019

(54) SEMICONDUCTOR DEVICE INCLUDING TRANSISTOR WHICH INCLUDES FIRST GATE AND SECOND GATE

(71) Applicant: SEMICONDUCTOR ENERGY LABORATORY CO., LTD., Atsugi-shi, Kanagawa-ken (JP)

(72) Inventors: Kiyoshi Kato, Kanagawa (JP); Tomoaki Atsumi, Kanagawa (JP); Shunpei Yamazaki, Takyo (JP); Haruyuki Baba, Kanagawa (JP); Shinpei Matsuda, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/380,502

(22) Filed: Dec. 15, 2016

(65) Prior Publication Data
US 2017/0179294 A1 Jun. 22, 2017

(30) Foreign Application Priority Data
Dec. 18, 2015 (JP) ................................ 2015-247680

(51) Int. Cl.
*H01L 29/786* (2006.01)
*H01L 27/088* (2006.01)
(Continued)

(52) U.S. Cl.
CPC ........ *H01L 29/7869* (2013.01); *H01L 27/088* (2013.01); *H01L 27/108* (2013.01);
(Continued)

(58) Field of Classification Search
CPC . H01L 29/7869; H01L 27/108; H01L 27/088; H01L 27/1255; H01L 29/78696;
(Continued)

(56) References Cited

U.S. PATENT DOCUMENTS 7,487,373 B2   2/2009   Koyama
7,851,279 B2   12/2010  Takano et al.
(Continued)

FOREIGN PATENT DOCUMENTS

JP   2012-069932 A   4/2012
JP   2012-146965 A   8/2012
(Continued)

*Primary Examiner* — Steven H Loke
*Assistant Examiner* — Juanita B Rhodes
(74) *Attorney, Agent, or Firm* — Nixon Peabody LLP; Jeffrey L. Costellia

(57) ABSTRACT

A semiconductor device capable of holding data for a long time is provided. The semiconductor device includes a first transistor, a second transistor, and a circuit. The first transistor includes a first gate and a second gate. The first transistor includes a first semiconductor in a channel formation region. The first gate and the second gate overlap with each other in a region with the first semiconductor provided therebetween. The second transistor includes a second semiconductor in a channel formation region. A first terminal of the second transistor is electrically connected to a gate of the second transistor and the second gate. A second terminal of the second transistor is electrically connected to the circuit. The circuit has a function of generating a negative potential. The second semiconductor has a wider bandgap than the first semiconductor.

15 Claims, 38 Drawing Sheets

(51) Int. Cl.
*H01L 27/12* (2006.01)
*H01L 27/108* (2006.01)

(52) U.S. Cl.
CPC ........ *H01L 27/124* (2013.01); *H01L 27/1225* (2013.01); *H01L 27/1255* (2013.01); *H01L 29/78648* (2013.01); *H01L 29/78696* (2013.01)

(58) Field of Classification Search
CPC ........... H01L 27/1225; H01L 29/78648; H01L 27/124
See application file for complete search history.

(56) References Cited

U.S. PATENT DOCUMENTS

| | | | |
|---|---|---|---|
| 8,421,081 B2 | 4/2013 | Kato et al. | |
| 8,541,846 B2 | 9/2013 | Saito | |
| 8,604,476 B2 | 12/2013 | Kato et al. | |
| 8,737,109 B2 | 5/2014 | Yamazaki et al. | |
| 8,760,959 B2 | 6/2014 | Matsubayashi | |
| 8,907,392 B2 | 12/2014 | Yamazaki et al. | |
| 8,947,158 B2 | 2/2015 | Watanabe | |
| 8,981,367 B2 | 3/2015 | Yoneda et al. | |
| 9,024,317 B2 | 5/2015 | Endo et al. | |
| 9,076,505 B2 | 7/2015 | Atsumi et al. | |
| 9,299,848 B2 | 3/2016 | Kato | |
| 9,312,280 B2 | 4/2016 | Kobayashi | |
| 9,337,826 B2 | 5/2016 | Koyama et al. | |
| 9,385,592 B2 | 7/2016 | Watanabe et al. | |
| 9,449,706 B2 | 9/2016 | Yamazaki et al. | |
| 9,501,119 B2 | 11/2016 | Watanabe | |
| 2009/0001452 A1* | 1/2009 | Takano | H01L 27/105 257/326 |
| 2010/0054024 A1 | 3/2010 | La Rosa | |
| 2010/0134396 A1* | 6/2010 | Umezaki | G09G 3/3413 345/92 |
| 2011/0156025 A1 | 6/2011 | Shionoiri et al. | |
| 2012/0313103 A1* | 12/2012 | Yamada | H01L 29/78633 257/66 |
| 2013/0285050 A1* | 10/2013 | Yamazaki | H01L 29/7869 257/43 |
| 2014/0002426 A1* | 1/2014 | Tanada | H03K 3/01 345/204 |
| 2015/0171117 A1 | 6/2015 | Endo et al. | |
| 2015/0263008 A1* | 9/2015 | Atsumi | G11C 7/1006 257/300 |
| 2015/0381036 A1 | 12/2015 | Watanabe et al. | |
| 2016/0043110 A1 | 2/2016 | Atsumi et al. | |
| 2016/0172010 A1 | 6/2016 | Kato | |
| 2016/0248419 A1 | 8/2016 | Koyama et al. | |
| 2016/0336068 A1 | 11/2016 | Yamazaki et al. | |
| 2017/0060217 A1 | 3/2017 | Watanabe | |
| 2017/0062433 A1 | 3/2017 | Miyairi et al. | |
| 2017/0186749 A1 | 6/2017 | Ohshima et al. | |
| 2017/0186751 A1 | 6/2017 | Akasawa et al. | |
| 2017/0207244 A1 | 7/2017 | Kato | |

FOREIGN PATENT DOCUMENTS

| | | |
|---|---|---|
| JP | 2013-168631 A | 8/2013 |
| JP | 2015-164366 A | 9/2015 |

* cited by examiner

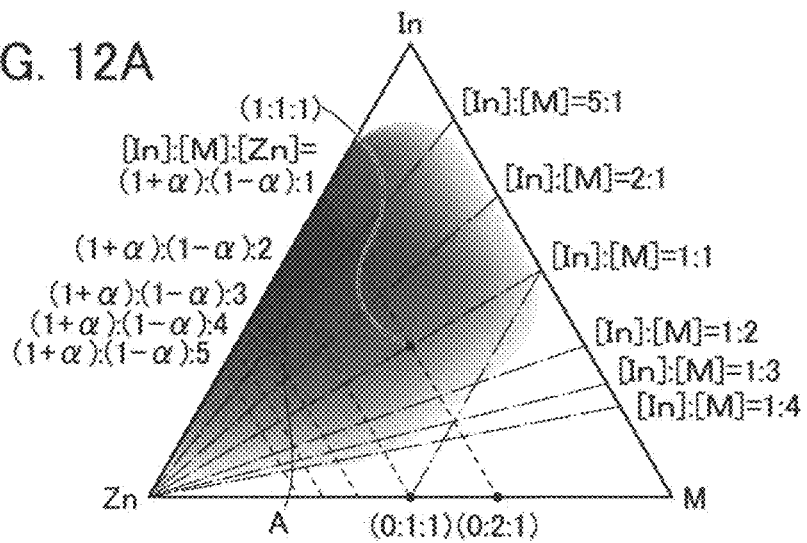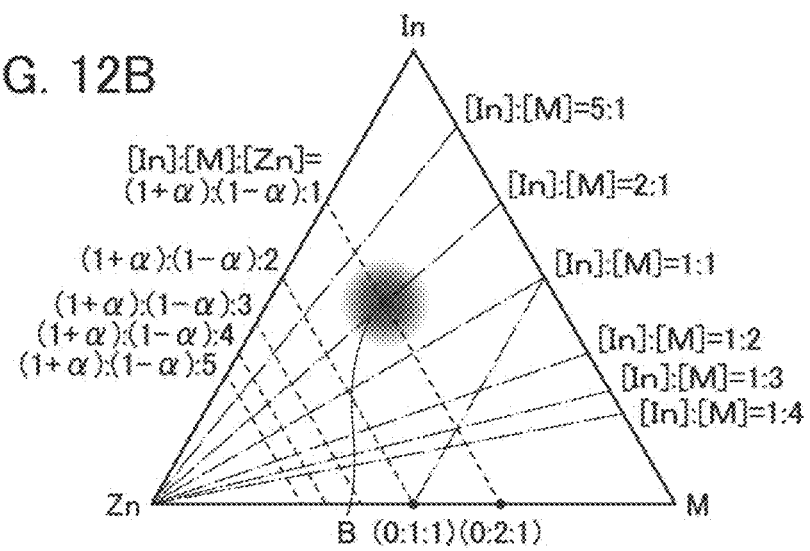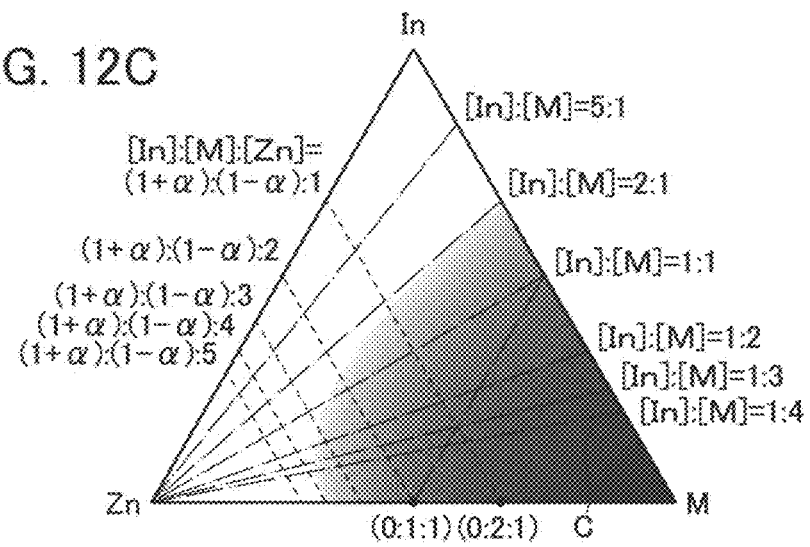

in-plane method φ scan
CAAC-OS in-plane method φ scan
Single crystal OS

FIG. 27A
FIG. 27B
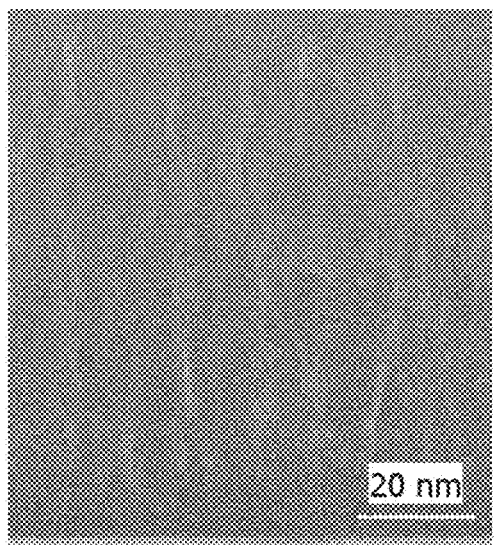
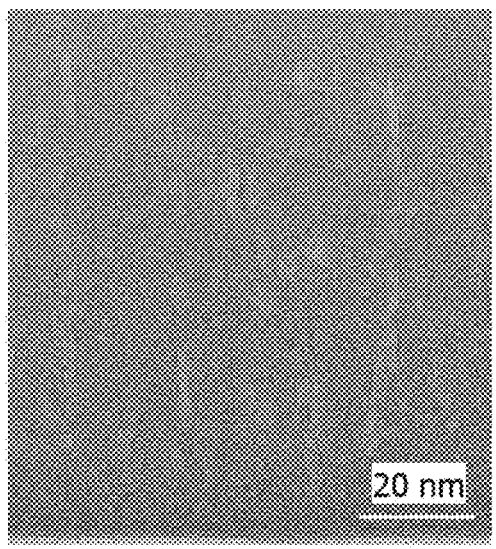

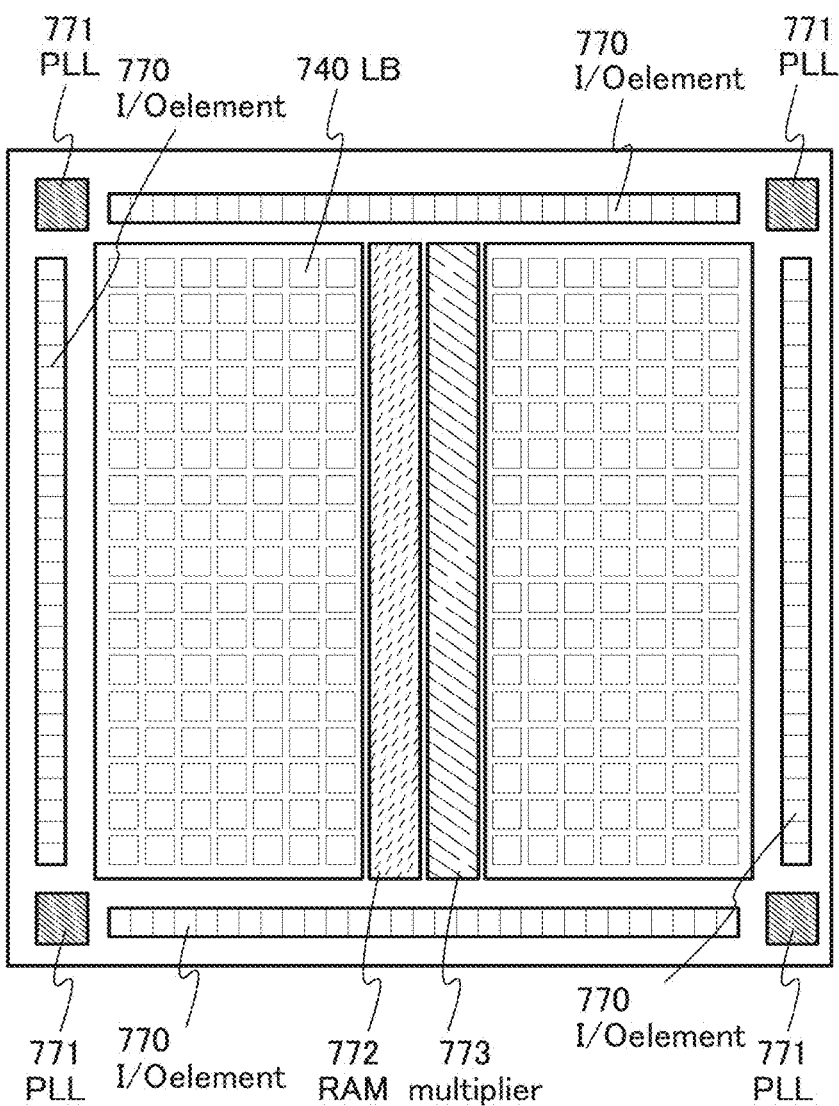

SEMICONDUCTOR DEVICE INCLUDING TRANSISTOR WHICH INCLUDES FIRST GATE AND SECOND GATE

BACKGROUND OF THE INVENTION

1. Field of the Invention

One embodiment of the present invention relates to a semiconductor device.

One embodiment of the present invention relates to an object, a method, and a manufacturing method. In addition, one embodiment of the present invention relates to a process, a machine, manufacture, and a composition of matter. One embodiment of the present invention relates to a driving method of the semiconductor device and a manufacturing method of the semiconductor device.

In this specification and the like, a semiconductor device generally means a device that can function by utilizing semiconductor characteristics. In some cases, a memory device, a display device, an electro-optical device, a semiconductor circuit, and an electronic device include a semiconductor device.

2. Description of the Related Art

A transistor including an oxide semiconductor (OS) in a channel formation region (hereinafter referred to as an OS transistor) is known. A variety of semiconductor devices including OS transistors have been proposed.

Patent Document 1 discloses an example in which an OS transistor is used in a dynamic random access memory (DRAM). The OS transistor has extremely low leakage current in an off state (off-state current); thus, a DRAM having a low refresh frequency and low power consumption can be formed.

Patent Document 2 discloses a nonvolatile memory including an OS transistor. Unlike a flash memory, the nonvolatile memory has unlimited cycling capability, can easily operate at high speed, and consumes less power.

The off-state current of a memory including the OS transistor can be reduced when the threshold voltage of the OS transistor is increased, so that the data holding characteristics of the memory can be improved. Patent Document 2 discloses an example in which an OS transistor has a second gate (also referred to as a back gate) to control the threshold voltage of the OS transistor so that the off-state current is lowered.

In order for the memory to hold data for a long time, a constant negative potential needs to be continuously applied to the second gate of the OS transistor. Patent Documents 2 and 3 each disclose a configuration example of a circuit for driving a second gate of an OS transistor.

Patent Document 4 discloses a method in which a negative potential is generated by a charge pump and applied to a second gate of an OS transistor.

REFERENCE

Patent Document

[Patent Document 1] Japanese Published Patent Application No. 2013-168631
[Patent Document 2] Japanese Published Patent Application No. 2012-069932
[Patent Document 3] Japanese Published Patent Application No. 2012-146965
[Patent Document 4] Japanese Published Patent Application No. 2015-164386

SUMMARY OF THE INVENTION

An object of one embodiment of the present invention is to provide a semiconductor device capable of holding data for a long time. Another object of one embodiment of the present invention is to provide a semiconductor device capable of reducing power consumption. Another object of one embodiment of the present invention is to provide a novel semiconductor device.

Note that the description of a plurality of objects does not mutually preclude the existence. One embodiment of the present invention does not necessarily achieve all the objects listed above. Objects other than those listed above are apparent from the description of the specification, drawings, claims, and the like, and such objects could be an object of one embodiment of the present invention.

One embodiment of the present invention is a semiconductor device including a first transistor, a second transistor, and a circuit. The first transistor includes a first gate and a second gate. The first transistor includes a first semiconductor in a channel formation region. The first gate and the second gate overlap with each other in a region with the first semiconductor provided therebetween. The second transistor includes a second semiconductor in a channel formation region. A gate of the second transistor is electrically connected to a first terminal of the second transistor. The first terminal of the second transistor is electrically connected to the second gate. A second terminal of the second transistor is electrically connected to the circuit. The circuit has a function of generating a negative potential. The second semiconductor preferably has a wider bandgap than the first semiconductor.

One embodiment of the present invention is a semiconductor device including a first transistor, a second transistor, and a circuit. The first transistor includes a first gate and a second gate. The first transistor includes a first oxide semiconductor in a channel formation region. The first gate and the second gate overlap with each other in a region with the first oxide semiconductor provided therebetween. The second transistor includes a second oxide semiconductor in a channel formation region. A gate of the second transistor is electrically connected to a first terminal of the second transistor. The first terminal of the second transistor is electrically connected to the second gate. A second terminal of the second transistor is electrically connected to the circuit. The circuit has a function of generating a negative potential. The first oxide semiconductor preferably contains In and M (M is Ga, Al, B, Si, Ti, Zr, La, Ce, Y, Hf, Ta, Nb, or Sc). The second oxide semiconductor preferably contains In and M. The ratio of the number of M atoms to the number of In atoms in the second oxide semiconductor is preferably higher than that in the first oxide semiconductor.

One embodiment of the present invention is a semiconductor device including first to third transistors, a capacitor, and a circuit. The first transistor includes a first gate and a second gate. The first transistor includes a first semiconductor in a channel formation region. The first gate and the second gate overlap with each other in a region with the first semiconductor provided therebetween. The second transistor includes a second semiconductor in a channel formation region. The bandgap of the second semiconductor is preferably greater than or equal to 2.2 eV. A gate of the second transistor is electrically connected to a gate of the third transistor. The gate of the third transistor is electrically connected to a first terminal of the capacitor. A first terminal of the second transistor is electrically connected to the second gate. A second terminal of the second transistor is electrically connected to the circuit. The circuit has a function of generating a negative potential.

In the above embodiment, the second semiconductor preferably has a wider bandgap than the first semiconductor.

One embodiment of the present invention is a semiconductor device including first to third transistors, a capacitor, and a circuit. The first transistor includes a first gate and a second gate. The first transistor includes a first oxide semiconductor in a channel formation region. The first gate and the second gate overlap with each other in a region with the first oxide semiconductor provided therebetween. The second transistor includes a second oxide semiconductor in a channel formation region. A gate of the second transistor is electrically connected to a gate of the third transistor. The gate of the third transistor is electrically connected to a first terminal of the capacitor. A first terminal of the second transistor is electrically connected to the second gate. A second terminal of the second transistor is electrically connected to the circuit. The circuit has a function of generating a negative potential.

In the above embodiment, the first oxide semiconductor preferably contains In and M. The second oxide semiconductor preferably contains In and M. The ratio of the number of M atoms to the number of In atoms in the second oxide semiconductor is preferably higher than that in the first oxide semiconductor.

One embodiment of the present invention is a semiconductor device including a first transistor, a second transistor, and a circuit. The first transistor includes a first gate and a second gate. The first transistor includes a first semiconductor in a channel formation region. The first gate and the second gate overlap with each other in a region with the first semiconductor provided therebetween. The second transistor includes a third gate and a fourth gate. The second transistor includes a second semiconductor in a channel formation region. The third gate and the fourth gate overlap with each other in a region with the second semiconductor provided therebetween. The fourth gate and the second semiconductor overlap with each other in a region with a charge accumulation layer provided therebetween. The third gate is electrically connected to a first terminal of the second transistor. The first terminal of the second transistor is electrically connected to the second gate. A second terminal of the second transistor is electrically connected to the circuit. The circuit has a function of generating a negative potential. The second semiconductor preferably has a wider bandgap than the first semiconductor.

One embodiment of the present invention is a semiconductor device including a first transistor, a second transistor, and a circuit. The first transistor includes a first gate and a second gate. The first transistor includes a first oxide semiconductor in a channel formation region. The first gate and the second gate overlap with each other in a region with the first oxide semiconductor provided therebetween. The second transistor includes a third gate and a fourth gate. The second transistor includes a second oxide semiconductor in a channel formation region. The third gate and the fourth gate overlap with each other in a region with the second oxide semiconductor provided therebetween. The fourth gate and the second oxide semiconductor overlap with each other in a region with a charge accumulation layer provided therebetween. The third gate is electrically connected to a first terminal of the second transistor. The first terminal of the second transistor is electrically connected to the second gate. A second terminal of the second transistor is electrically connected to the circuit. The circuit has a function of generating a negative potential. The first oxide semiconductor preferably contains In and M. The second oxide semiconductor preferably contains In and M. The ratio of the number of M atoms to the number of In atoms in the second oxide semiconductor is preferably higher than that in the first oxide semiconductor.

One embodiment of the present invention is a memory device including the semiconductor device in any of the above embodiments.

One embodiment of the present invention is an electronic device including the semiconductor device in any of the above embodiments and a display device, a microphone, a speaker, an operation key, or a housing.

According to one embodiment of the present invention, a semiconductor device capable of holding data for a long time is provided. In addition, according to one embodiment of the present invention, a semiconductor device capable of reducing power consumption is provided. In addition, according to one embodiment of the present invention, a novel semiconductor device is provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 12A to 12C each show the range of the atomic ratio of an oxide semiconductor;

FIGS. 27A and 27B show cross-sectional TEM images of an a-like OS;

FIG. 32 is a block diagram illustrating a configuration example of a PLD;

DETAILED DESCRIPTION OF THE INVENTION

Figure 1:
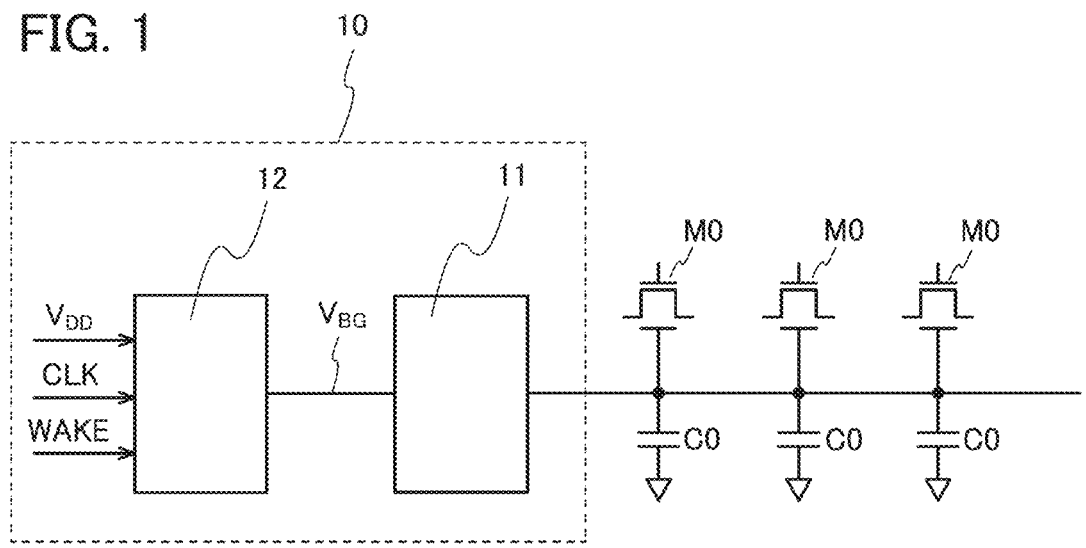
FIG. 1 is a circuit diagram illustrating a configuration example of a semiconductor device.

Embodiments and examples of the present invention will be described in detail with reference to the drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments and examples.

Note that in the structures of the present invention described below, the same portions or portions having similar functions are denoted by the same reference numerals in different drawings, and a description thereof is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Unless otherwise specified, an on-state current in this specification refers to a drain current of a transistor in the on state. Unless otherwise specified, the on state of an n-channel transistor means that voltage ($V_{GS}$) between its gate and source is higher than or equal to the threshold voltage ($V_{th}$), and the on state of a p-channel transistor means that $V_{GS}$ is lower than or equal to $V_{th}$. For example, the on-state current of an n-channel transistor sometimes refers to a drain current that flows when $V_{GS}$ is higher than or equal to $V_{th}$. The on-state current of a transistor depends on voltage ($V_{DS}$) between its drain and source in some cases.

Unless otherwise specified, an off-state current in this specification refers to a drain current of a transistor in the off state. Unless otherwise specified, the off state of an n-channel transistor means that $V_{GS}$ is lower than $V_{th}$, and the off state of a p-channel transistor means that $V_{GS}$ is higher than $V_{th}$. For example, the off-state current of an n-channel transistor sometimes refers to a drain current that flows when $V_{GS}$ is lower than $V_{th}$. The off-state current of a transistor depends on $V_{GS}$ in some cases. Thus, "the off-state current of a transistor is lower than $10^{-21}$ A" sometimes means that there is $V_{GS}$ at which the off-state current of a transistor is lower than $10^{-21}$ A.

The off-state current of a transistor depends on $V_{DS}$ in some cases. Unless otherwise specified, the off-state current in this specification may be an off-state current at $V_{DS}$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{DS}$ used in a semiconductor device or the like including the transistor.

In this specification and the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification, a high power supply potential is referred to as an H level (or $V_{DD}$), and a low power supply potential is referred to as an L level (or GND), in some cases.

Furthermore, in this specification, any of the embodiments and the examples described below can be combined as appropriate. In addition, in the case where a plurality of structure examples are described in one embodiment, any of the structure examples can be combined as appropriate.

Embodiment 1

In this embodiment, a circuit configuration of a semiconductor device of one embodiment of the present invention is described.

<<Circuit 10>>

A circuit 10 illustrated in FIG. 1 is a semiconductor device for driving second gates of transistors M0. The circuit 10 includes a voltage generation circuit 12 and a voltage holding circuit 11.

The transistors M0 represent transistors used in a variety of circuits such as a memory circuit, an arithmetic circuit, and a pixel circuit. Although three transistors M0 are illustrated in FIG. 1, one embodiment of the present invention is not limited thereto, and the circuit 10 may be connected to more transistors M0. Note that in the following description, the transistors M0 are n-channel transistors.

The transistors M0 each include a first gate and a second gate. The second gates have a function of controlling $V_{th}$ of the respective transistors M0. Capacitors C0 correspond to wiring capacitance added to the second gates. In each of the transistors M0, the first gate and the second gate preferably overlap with each other in a region with a semiconductor layer provided therebetween.

The circuit 10 has a function of writing a potential to the second gates of the transistors M0 and holding the potential.

For example, in the case where a negative potential is written to the second gates of the transistors M0 by the circuit 10, $V$ of the transistors M0 can be kept high while the negative potential of the second gates is held. When $V_{th}$ of the transistors M0 is kept high, the transistors M0 can be prevented from being normally-on and therefore power consumption of the whole semiconductor device including the transistors M0 can be reduced. For example, in the case where the transistor M0 is used as a selection transistor of a memory cell, charge in a capacitor functioning as a storage can be held for a long time.

The voltage holding circuit 11 has a function of applying a potential $V_{BG}$ generated in the voltage generation circuit 12 to the second gates of the transistors M0 and holding the potential.

The voltage generation circuit 12 has a function of generating $V_{BG}$ from GND or $V_{DD}$. $V_{DD}$, a signal CLK, and a signal WAKE are input to the voltage generation circuit 12. The signal CLK is a clock signal and used to operate the voltage generation circuit 12. The signal WAKE has a function of controlling the input of the signal CLK to the voltage generation circuit 12. For example, when an H-level signal is supplied as the signal WAKE, the signal CLK is input to the voltage generation circuit 12 and the voltage generation circuit 12 generates $V_{BG}$.

Next, a specific configuration example of the voltage holding circuit 11 is described with reference to FIGS. 2A to 2C, FIGS. 3A and 3B, FIGS. 4A to 4C, and FIGS. 5A and 5B.

<Voltage Holding Circuit 11a>

Figure 2A:
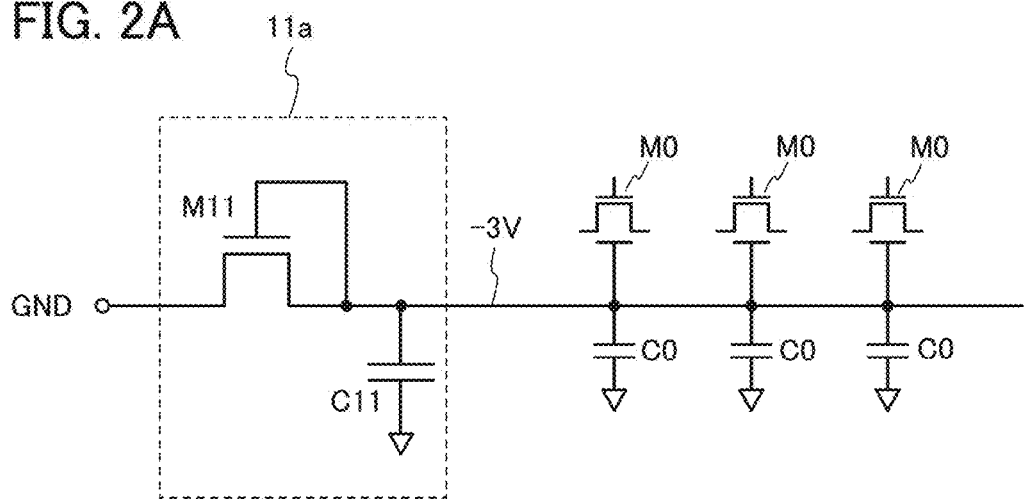
FIGS. 2A and 2B are circuit diagrams each illustrating a configuration example of a voltage holding circuit.

A voltage holding circuit 11a illustrated in FIG. 2A includes a transistor M11 and a capacitor C11. A first terminal of the transistor M11 is electrically connected to a gate of the transistor M11, a first terminal of the capacitor C11, and the second gates of the transistors M0. A second terminal of the transistor M11 is electrically connected to the voltage generation circuit 12 and supplied with $V_{BG}$. Note that in the following description, the transistor M11 is an n-channel transistor.

In FIG. 2A, the transistor M11 functioning as a diode and the capacitor C11 are connected to the second gates of the transistors M0. The transistor M11 has a function of writing a potential to the second gates of the transistors M0 and holding the potential. FIG. 2A illustrates an example in which a negative potential (−3 V) is written to the second gates of the transistors M0. $V_{th}$ of the transistors M0 is shifted in the positive direction by the negative potential written to the second gates of the transistors M0. When the first terminal of the transistor M11 is set to GND, the written negative potential can be held, and the transistors M0 can maintain the normally-off state.

Figure 2B:
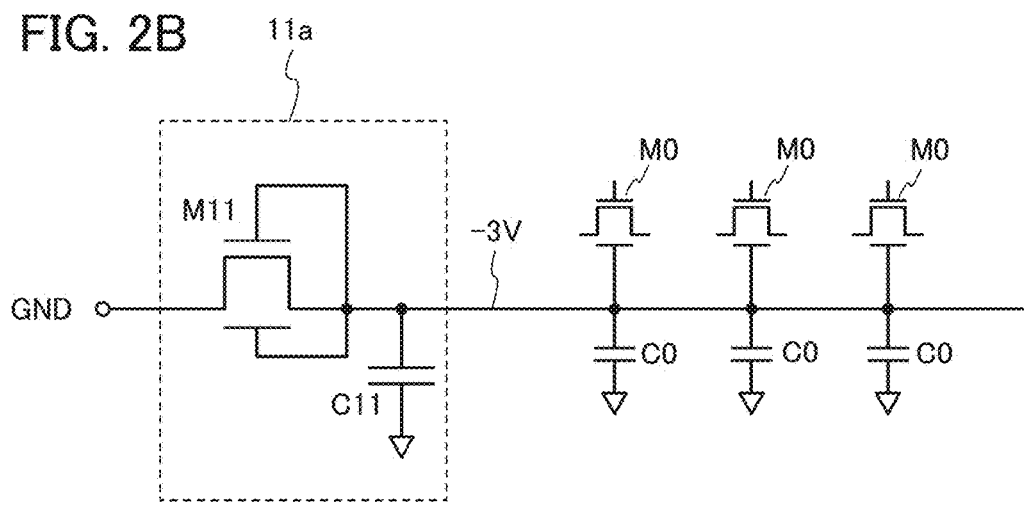

The transistor M11 may include a first gate and a second gate. FIG. 2B is a circuit diagram in that case. The second gate of the transistor M11 is electrically connected to the first gate and the first terminal of the transistor M11. In the transistor M11, the first gate and the second gate preferably overlap with each other in a region with a semiconductor layer provided therebetween.

In FIGS. 2A and 2B, $V_{GS}$ of the transistor M11 is 0 V. When a drain current at $V_{GS}$=0 V (hereinafter referred to as cutoff current) is sufficiently low, the transistor M11 interrupts the charge flow and the voltage holding circuit 11a can hold the negative potential for a long time (a point a in FIG. 2C).

Figure 2C:
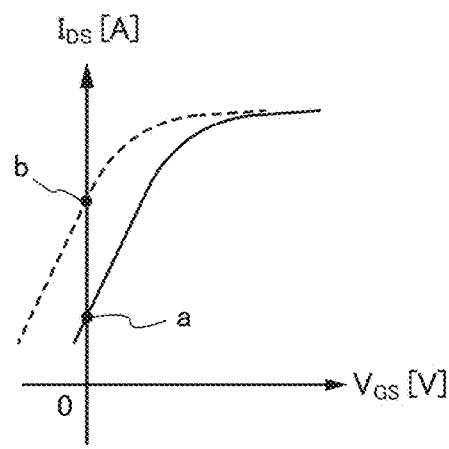
FIG. 2C shows $V_{GS}$-$I_{DS}$ characteristics for illustrating cutoff current.

However, when $V_{th}$ of the transistor M11 is low, the cutoff current of the transistor M11 is increased and the voltage holding circuit 11a cannot hold the negative potential for a long time (a point b in FIG. 2C).

That is, in order to operate the voltage holding circuit 11a properly, the cutoff current of the transistor M11 needs to be reduced.

Furthermore, withstand voltage between a source and a drain (hereinafter referred to as source-drain withstand voltage) of the transistor M11 is preferably high. When the source-drain withstand voltage of the transistor M11 is high, the voltage generation circuit 12 generating high voltage and the transistor M0 can be easily connected to each other.

The channel length of the transistor M11 is preferably longer than that of the transistor M0. In the case where the channel length of the transistor M0 is less than 1 μm, for example, the channel length of the transistor M11 is greater than or equal to 1 μm, preferably greater than or equal to 3 μm, further preferably greater than or equal to 5 μm, and still further preferably greater than or equal to 10 μm.

When the channel length of the transistor M11 is long, the transistor M11 is not affected by a short-channel effect and the cutoff current can be low. Furthermore, the source-drain withstand voltage of the transistor M11 can be increased.

For example, when the transistor M0 is used in a circuit for which high integration is required, such as a memory cell, the channel length of the transistor M0 is preferably short. Meanwhile, the transistor M11 can be manufactured outside the memory cell; thus, a long channel length does not become a problem. When the channel length of the transistor is long, the on-state current of the transistor is decreased; however, the transistor M11 is generally used in the off state and therefore high on-state current is not required.

An OS transistor or a transistor including a wide bandgap semiconductor in a channel formation region is preferably used as the transistor M11. The off-state current is low and the source-drain withstand voltage is high in the OS transistor and the transistor including the wide bandgap semiconductor. Note that in this specification, the term "wide bandgap semiconductor" is a semiconductor whose bandgap is 2.2 eV or greater. Examples of the wide bandgap semiconductor include silicon carbide, gallium nitride, and diamond.

The cutoff current of the OS transistor or the transistor including the wide bandgap semiconductor remains low even in a high-temperature environment; thus, when such a transistor is used as the transistor M11, the circuit 10 can be operated in a high-temperature environment.

The transistor M11 preferably includes a semiconductor having low electron affinity in a channel formation region. With the use of the semiconductor having low electron affinity, $V_{th}$ of the transistor M11 can be shifted in the positive direction and the cutoff current can be reduced.

The transistor M11 is required to have the cutoff current lower than that of the transistor M0 and the source-drain withstand voltage higher than that of the transistor M0. In contrast, the transistor M0 is required to have the on-state current higher than that of the transistor M11. As described above, in the case where transistors having different required properties are manufactured over the same substrate, the transistors are formed using different semiconductors. The transistor M11 preferably includes a semiconductor having a wider bandgap than that of the transistor M0 in the channel formation region. Furthermore, the transistor M11 preferably includes a semiconductor having lower electron affinity than that of the transistor M0 in the channel formation region. The transistor M0 preferably includes a semiconductor having higher electron mobility than that of the transistor M11 in a channel formation region.

Here, an oxide semiconductor containing indium (In) and an element M (an In-M oxide semiconductor) and an oxide semiconductor containing In, zinc (Zn), and the element M (an In-M-Zn oxide semiconductor) are considered. The element M is an element having higher bonding energy with oxygen than that of In. The element M is preferably gallium (Ga), for example. Other elements that can be used as the element M are aluminum (Al), boron (B), silicon (Si), titanium (Ti), zirconium (Zr), lanthanum (La), cerium (Ce), yttrium (Y), hafnium (Hf), tantalum (Ta), niobium (Nb), scandium (Sc), and the like. Our investigation shows that as the ratio of the number of M atoms [M] to the number of In atoms [In] ([M]/[In]) is increased, the bandgaps of the above-described In-M oxide semiconductor and In-M-Zn oxide semiconductor are increased.

Table 1 shows the electron affinity ($\chi$) and the bandgap ($E_G$) of an In—Ga oxide semiconductor, and Table 2 shows the electron affinity and the bandgap of an In—Ga—Zn oxide semiconductor in the case where the element M is Ga, for example. The values in Table 1 and Table 2 are measured by ultraviolet photoelectron spectroscopy (UPS) and a photoluminescence (PL) method.

In Table 1, IGO($\alpha$:$\beta$) is an In—Ga oxide semiconductor formed by a sputtering method using an In—Ga oxide target having a ratio of In:Ga=$\alpha$:$\beta$. Similarly, in Table 2, IGZO ($\alpha$:$\beta$:$\gamma$) is an In—Ga—Zn oxide semiconductor formed by a sputtering method using an In—Ga—Zn oxide target having a ratio of In:Ga:Zn=$\alpha$:$\beta$:$\gamma$.

TABLE 1

|  | IGO(1:1) | IGO(22:78) | IGO(13:87) |
|---|---|---|---|
| $\chi$ [eV] | 4.7 | 4.6 | 4.2 |
| $E_G$ [eV] | 3.2 | 3.7 | 4.1 |

TABLE 2

|  | IGZO(1:1:1) | IGZO(1:3:4) | IGZO(1:6:4) |
|---|---|---|---|
| $\chi$ [eV] | 4.7 | 4.5 | 4.2 |
| $E_G$ [eV] | 3.2 | 3.4 | 3.8 |

According to Table 1, as the ratio of the number of Ga atoms to the number of In atoms increases, the In—Ga oxide semiconductor has a lower electron affinity and a wider bandgap. Similarly, according to Table 2, as the ratio of the number of Ga atoms to the number of In atoms increases, the In—Ga—Zn oxide semiconductor has a lower electron affinity and a wider bandgap.

According to the above description, in the case where the In-M oxide semiconductor is used for the channel formation regions of the transistor M11 and the transistor M0, the ratio of the number of M atoms to the number of In atoms in the channel formation region of the transistor M11 is preferably higher than that in the channel formation region of the transistor M0.

Similarly, in the case where the In-M-Zn oxide semiconductor is used for the channel formation regions of the transistor M11 and the transistor M0, the ratio of the number of M atoms to the number of In atoms in the channel formation region of the transistor M11 is preferably higher than that in the channel formation region of the transistor M0.

When the transistor M11 has such a structure, the voltage holding circuit 11a can hold a potential for a long time.

<Voltage Holding Circuit 11b>

Figure 3A:
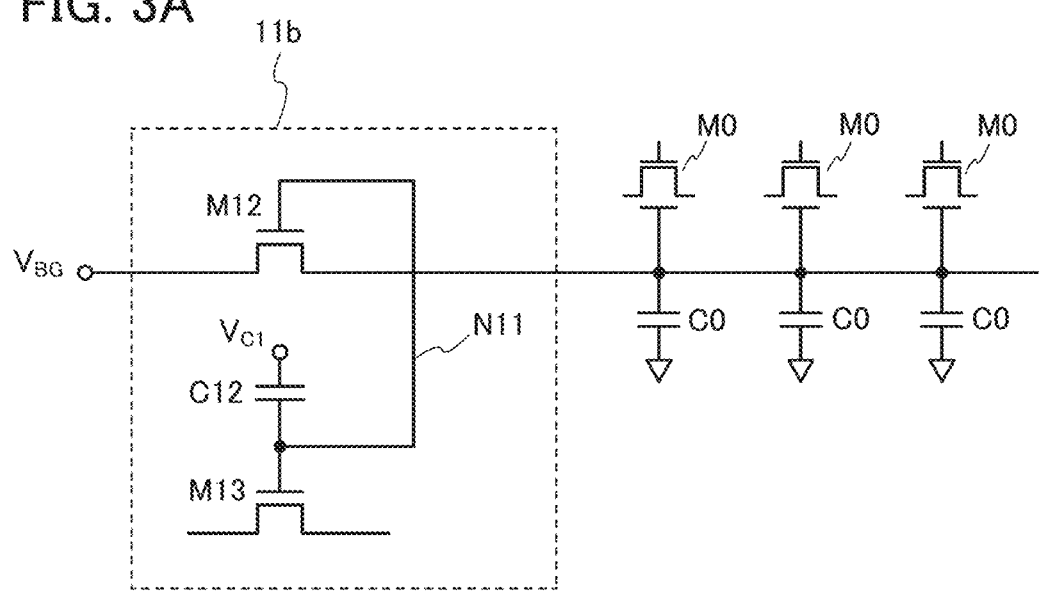
FIGS. 3A and 3B are circuit diagrams each illustrating a configuration example of a voltage holding circuit.

A voltage holding circuit 11b illustrated in FIG. 3A includes a transistor M12, a transistor M13, and a capacitor C12. Note that in the following description, the transistors M12 and M13 are n-channel transistors.

A gate of the transistor M13 is electrically connected to a first terminal of the capacitor C12 and a gate of the transistor M12. A first terminal of the transistor M12 is electrically connected to the second gates of the transistors M0, and a second terminal of the transistor M12 is supplied with the potential $V_{BG}$ from the voltage generation circuit 12.

The gate of the transistor M12, the first terminal of the capacitor C12, and the gate of the transistor M13 are in an electrically floating state. These wirings in the electrically floating state are referred to as a node N11.

Figure 3B:
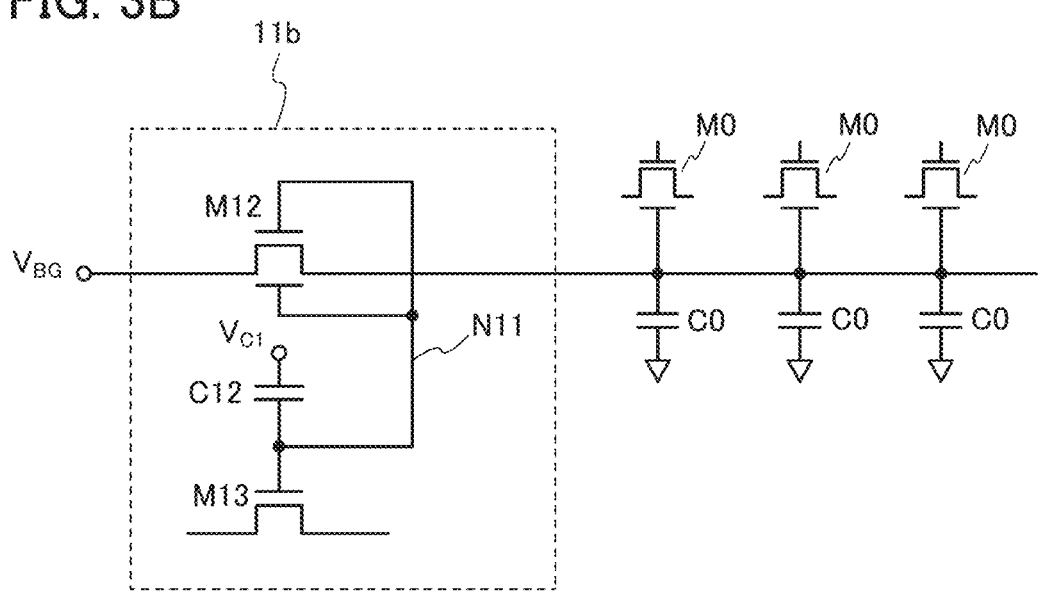

Note that the transistor M12 may include a first gate and a second gate. FIG. 3B is a circuit diagram in that case. In the transistor M12, the first gate and the second gate preferably overlap with each other in a region with a semiconductor layer provided therebetween. The second gate of the transistor M12 is electrically connected to the first gate of the transistor M12, the gate of the transistor M13, and the first terminal of the capacitor C12.

Next, operation of the voltage holding circuit 11b is described with reference to FIGS. 4A to 4C.

First, a positive potential ($V_{C1}$) is applied to a second terminal of the capacitor C12 in order to supply a tunnel current to a gate insulating film of the transistor M13, so that negative charge is injected into the node N11. FIG. 4A illustrates an example in which $V_{C1}$ is set to a potential higher than 10 V and lower than or equal to 20 V.

At this time, a potential difference is preferably generated between a source and a drain of the transistor M13 so that a drain current flows in the transistor M13. When the drain current flows in the transistor M13, charge can be injected into the node N11 by utilizing hot-electron injection. Note that the charge can be injected in a short time by the hot-electron injection; however, deterioration of a device is easily caused. In that case, the potential difference is not generated between the source and the drain of the transistor M13, and the charge may be injected by a Fowler-Nordheim tunneling method.

By the negative charge injected into the node N11, $V_{th}$ of the transistor M12 can be increased (shifted in the positive direction). When $V_{th}$ of the transistor M12 is increased, the cutoff current of the transistor M12 can be reduced.

Next, the potential $V_{BG}$ is applied in order to write the potential to the second gates of the transistors M0. FIG. 4B illustrates an example in which −3 V is written to the second gates of the transistors M0.

At this time, it is preferable that $V_{C1}$ be set to approximately a potential that supplies a tunnel current to the transistor M13 and that turns on the transistor M12. FIG. 4B illustrates an example in which $V_{C1}$ is set to a potential higher than 0 V and lower than or equal to 10 V.

Figure 4A:
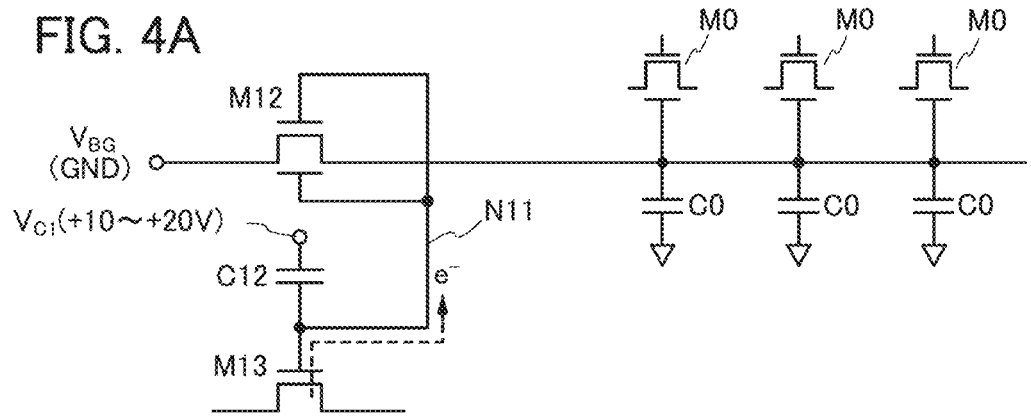
FIGS. 4A to 4C are circuit diagrams illustrating an operation example of a voltage holding circuit.
Figure 4B:
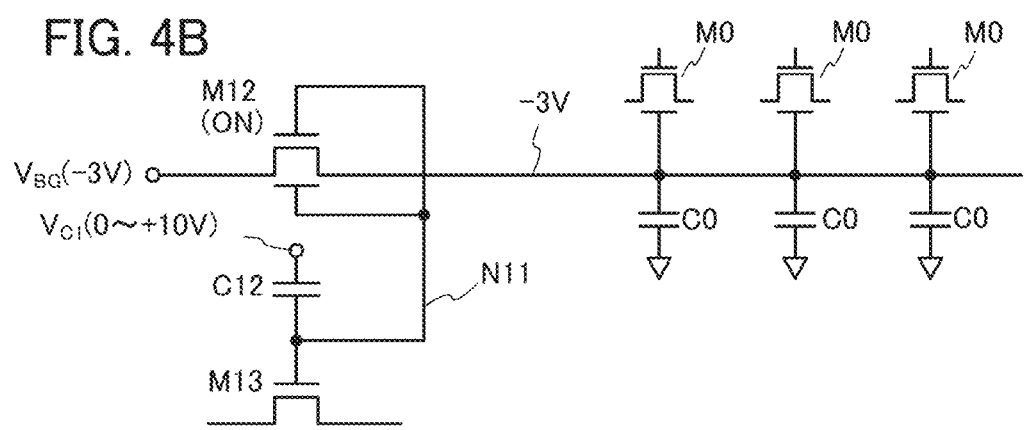
Figure 4C:
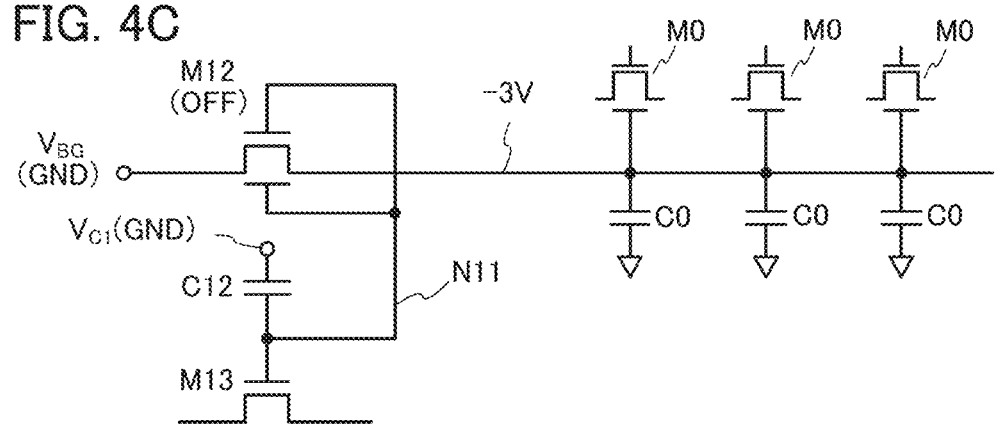

Next, $V_{BG}$ and $V_{C1}$ are set to GND, so that the potential of the second gates of the transistors M0 is held (FIG. 4C).

The negative charge is preferably injected into the node N11 in advance at the time of FIG. 4A so that $V_{GS}$ of the transistor M12 is lower than or equal to 0 V. The leakage current flowing in the transistor M12 is low because $V_{th}$ of the transistor M12 is adjusted so that cutoff current becomes low. Thus, the voltage holding circuit 11b can hold the potential written to the second gates of the transistors M0 for a long time.

The transistor M12 may have the same characteristics as the transistor M11 of the voltage holding circuit 11a in order to reduce the cutoff current.

The channel length of the transistor M12 is preferably longer than that of the transistor M0. In the case where the channel length of the transistor M0 is less than 1 μm, for example, the channel length of the transistor M12 is greater than or equal to 1 μm, preferably greater than or equal to 3 μm, further preferably greater than or equal to 5 μm, and still further preferably greater than or equal to 10 μm.

An OS transistor or a transistor including a wide bandgap semiconductor in a channel formation region is preferably used as the transistor M12.

The transistor M12 preferably includes a semiconductor having a wider bandgap than that of the transistor M0 in a channel formation region. The transistor M0 preferably includes a semiconductor having higher electron mobility than that of the transistor M12 in the channel formation region.

In the case where the In-M oxide semiconductor is used for the channel formation regions of the transistor M12 and the transistor M0, the ratio of the number of M atoms to the number of In atoms in the channel formation region of the transistor M12 is preferably higher than that in the channel formation region of the transistor M0.

In the case where the In-M-Zn oxide semiconductor is used for the channel formation regions of the transistor M12 and the transistor M0, the ratio of the number of M atoms to the number of In atoms in the channel formation region of the transistor M12 is preferably higher than that in the channel formation region of the transistor M0.

When the transistor M12 has such a structure, the voltage holding circuit 11b can hold a potential for a long time.

<Voltage Holding Circuit 11c>

Figure 5A:
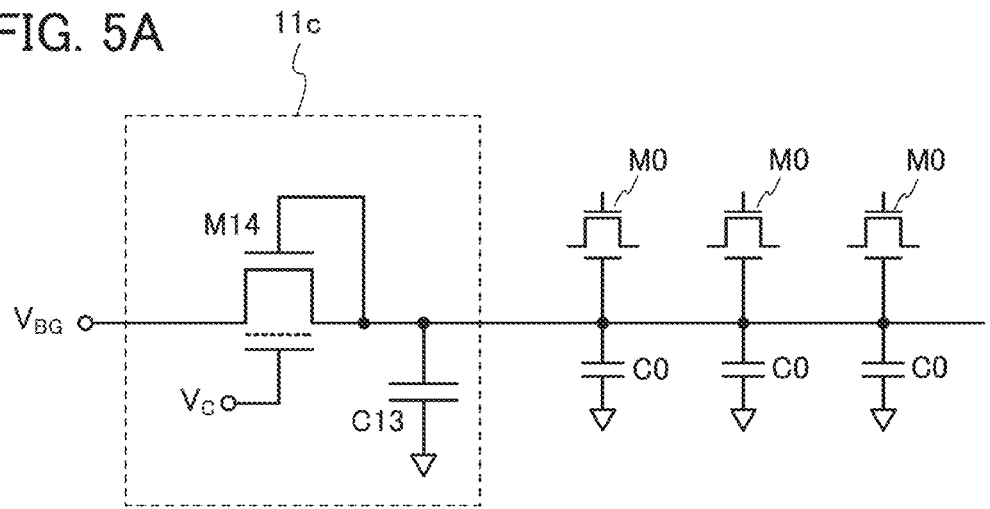
FIGS. 5A and 5B are circuit diagrams each illustrating a configuration example of a voltage holding circuit.

A voltage holding circuit 11c illustrated in FIG. 5A includes a transistor M14 and a capacitor C13. A first terminal of the transistor M14 is electrically connected to a first gate of the transistor M14, a first terminal of the capacitor C13, and the second gates of the transistors M0. A second terminal of the transistor M14 is electrically connected to the voltage generation circuit 12 and supplied with the potential $V_{BG}$.

The transistor M14 includes a first gate and a second gate. In the transistor M14, the first gate and the second gate preferably overlap with each other in a region with a semiconductor layer provided therebetween. The transistor M14 includes a first gate insulating film between the first gate and the semiconductor layer and a second gate insulating film between the second gate and the semiconductor layer. Note that in the following description, the transistor M14 is an n-channel transistor.

The transistor M14 includes a charge accumulation layer in the second gate insulating film. In each of FIGS. 5A and 5B, the charge accumulation layer is denoted by the dotted line in the symbol of the transistor.

When a potential $V_C$ is applied to the second gate of the transistor M14, charge can be injected into the charge accumulation layer. For example, when the potential $V_C$ that is a positive potential is applied, negative charge can be injected into the charge accumulation layer.

By the negative charge injected into the charge accumulation layer, $V_{th}$ of the transistor M14 can be shifted in the positive direction. As a result, the cutoff current of the transistor M14 can be reduced, and the transistor M14 can hold the potential applied to the second gates of the transistors M0 for a long time.

A specific example of the charge accumulation layer will be described later in Embodiment 3.

The transistor M14 may have the same characteristics as the transistor M11 of the voltage holding circuit 11a in order to reduce the cutoff current.

The channel length of the transistor M14 is preferably longer than that of the transistor M0. In the case where the channel length of the transistor M0 is less than 1 μm, for example, the channel length of the transistor M14 is greater than or equal to 1 μm, preferably greater than or equal to 3 μm, further preferably greater than or equal to 5 μm, and still further preferably greater than or equal to 10 μm.

An OS transistor or a transistor including a wide bandgap semiconductor in a channel formation region is preferably used as the transistor M14.

The transistor M14 preferably includes a semiconductor having a wider bandgap than that of the transistor M0 in a channel formation region. The transistor M0 preferably includes a semiconductor having higher electron mobility than that of the transistor M14 in the channel formation region.

In the case where the In-M oxide semiconductor is used for the channel formation regions of the transistor M14 and the transistor M0, the ratio of the number of M atoms to the number of In atoms in the channel formation region of the transistor M14 is preferably higher than that in the channel formation region of the transistor M0.

In the case where the In-M-Zn oxide semiconductor is used for the channel formation regions of the transistor M14 and the transistor M0, the ratio of the number of M atoms to the number of In atoms in the channel formation region of the transistor M14 is preferably higher than that in the channel formation region of the transistor M0.

When the transistor M14 has such a structure, the voltage holding circuit 11c can hold a potential for a long time, and the circuit 10 can hold a potential for a long time.

Figure 5B:
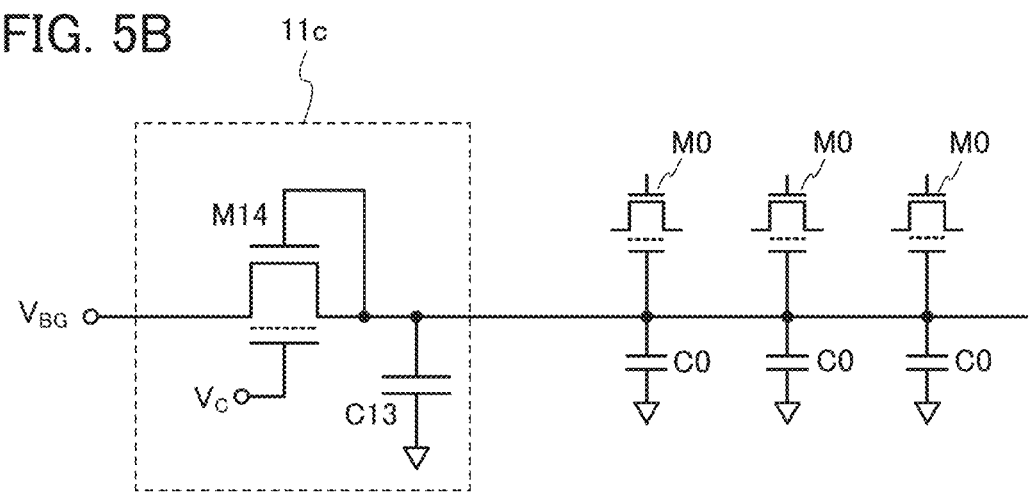

Note that the above-described charge accumulation layer may be provided in the transistor M0. FIG. 5B is a circuit diagram in that case. With such a structure, the cutoff current of the transistor M0 can be further reduced, and power consumption of the semiconductor device including the transistor M0 can be reduced.

Next, the voltage generation circuit 12 is described in detail with reference to FIG. 6 and FIGS. 7A to 7C.

Figure 6:
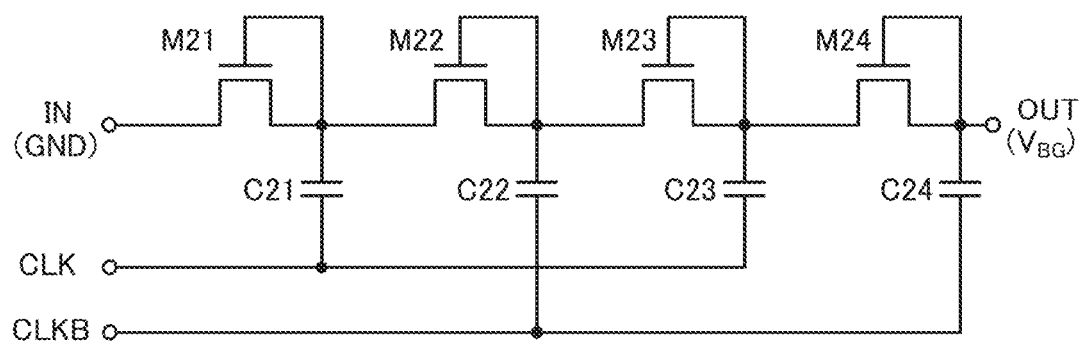
FIG. 6 is a circuit diagram illustrating a configuration example of a voltage generation circuit.
Figure 7A:
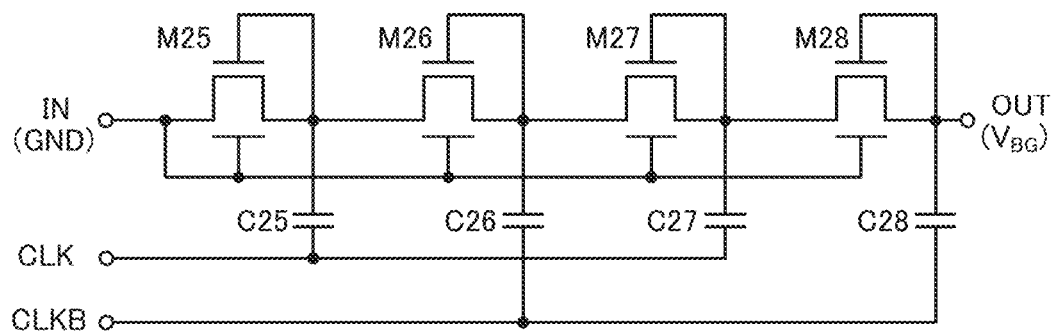
FIGS. 7A to 7C are circuit diagrams each illustrating a configuration example of a voltage generation circuit.
Figure 7B:
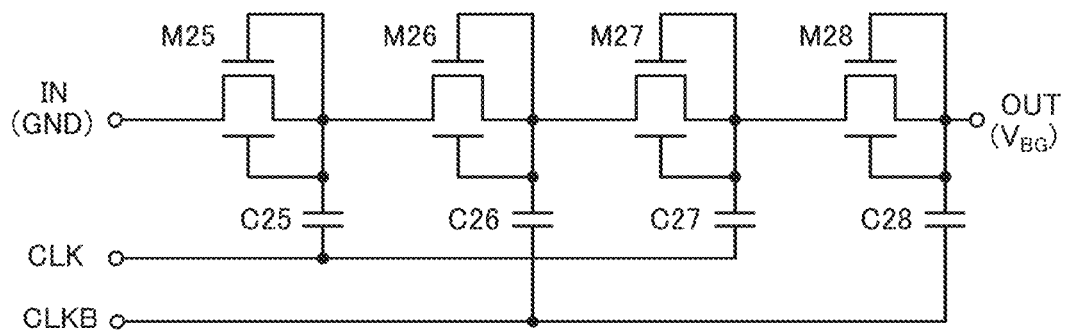
Figure 7C:
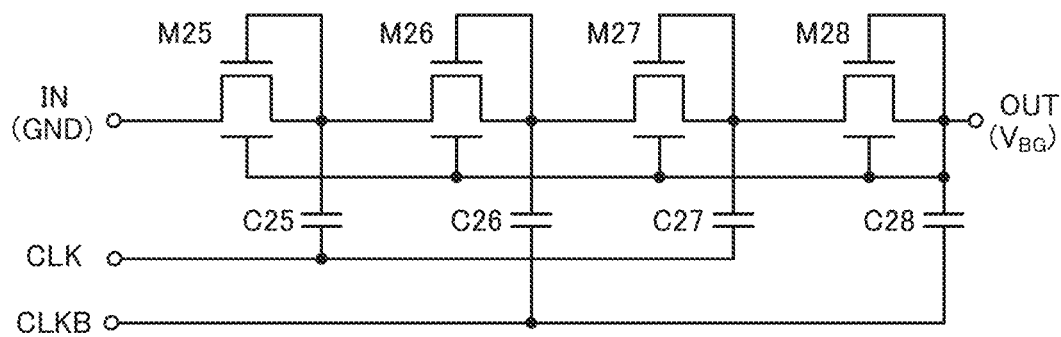

FIG. 6 illustrates a voltage generation circuit 12a as an example of the voltage generation circuit 12. FIGS. 7A, 7B, and 7C illustrate a voltage generation circuit 12b, a voltage generation circuit 12c, and a voltage generation circuit 12d, respectively as examples of the voltage generation circuit 12. These circuits are step-down charge pumps, GND is input to an input terminal IN, and $V_{BG}$ that is a negative potential is output from an output terminal OUT. Here, the number of stages of a basic circuit in the charge pump is four; however, the present invention is not limited thereto, and the charge pump may be formed with a basic circuit having any number of stages.

<Voltage Generation Circuit 12a>

As illustrated in FIG. 6, the voltage generation circuit 12a includes transistors M21 to M24 and capacitors C21 to C24. Note that in the following description, the transistors M21 to M24 are n-channel transistors.

The transistors M21 to M24 are connected in series between the input terminal IN and the output terminal OUT, and each has a structure in which a gate and a first terminal are connected so that the transistor functions as a diode. The capacitors C21 to C24 are connected to the gates of the transistors M21 to M24, respectively.

A signal CLK is input to the first terminals of the capacitors C21 and C23 in the odd-numbered stages, and a signal CLKB is input to the first terminals of the capacitors C22 and C24 in the even-numbered stages. The signal CLKB is an inverted clock signal obtained by phase inversion of the signal CLK.

The voltage generation circuit 12a has a function of stepping down GND input to the input terminal IN to generate $V_{BG}$. The voltage generation circuit 12a can generate a negative potential only by the supply of the signals CLK and CLKB.

The voltage generation circuit 12 may include a transistor having a first gate and a second gate. FIGS. 7A to 7C illustrate circuit diagrams in that case.

<Voltage Generation Circuit 12b>

As illustrated in FIG. 7A, the voltage generation circuit 12b includes transistors M25 to M28 and capacitors C25 to C28. Note that in the following description, the transistors M25 to M28 are n-channel transistors.

The transistors M25 to M28 each include a first gate and a second gate. In each of the transistors M25 to M28, the first gate and the second gate preferably overlap with each other in a region with a semiconductor layer provided therebetween.

The transistors M25 to M28 are connected in series between the input terminal IN and the output terminal OUT, and each has a structure in which a first gate and a first terminal are connected so that the transistor functions as a diode. The capacitors C25 to C28 are connected to the first gates of the transistors M25 to M28, respectively.

The signal CLK is input to the first terminals of the capacitors C25 and C27 in the odd-numbered stages, and the signal CLKB is input to the first terminals of the capacitors C26 and C28 in the even-numbered stages. The signal CLKB is an inverted clock signal obtained by phase inversion of the signal CLK.

The voltage generation circuit 12b has a function of stepping down GND input to the input terminal IN to generate $V_{BG}$. The voltage generation circuit 12b can generate a negative potential only by the supply of the signals CLK and CLKB.

In the voltage generation circuit 12b, the transistors M25 to M28 are each provided with the second gate, and voltage is applied to the second gates to control $V_{th}$ of the transistors M25 to M28. In the voltage generation circuit 12b, the second gates of the transistors M25 to M28 are connected to the input terminal IN.

The second gates of the transistors M25 to M28 are connected to the input terminal IN where the voltage is the highest in the voltage generation circuit 12b. That is, voltage higher than that applied to a source is applied to the second gates of the transistors M25 to M28. This can lower $V_{th}$ of the transistors M25 to M28 as compared with the case of not applying the voltage to the second gates, increasing current driving characteristics of the transistors M25 to M28. As a result, the voltage generation circuit 12b can step down the voltage with a small number of stages; thus, the number of stages can be reduced. Accordingly, the voltage generation circuit 12b can be reduced in size, leading to lower power consumption.

<Voltage Generation Circuit 12c>

In the voltage generation circuit 12c illustrated in FIG. 7B, the second gates of the transistors M25 to M28 are connected to the respective first gates of the transistors. The other components are the same as those of the voltage generation circuit 12b.

In the voltage generation circuit 12c, the same voltage is applied to the first gates and the second gates of the transistors M25 to M28; accordingly, the on-state current is increased as compared with the case of not applying the voltage to the second gates. As a result, the voltage generation circuit 12c can step down the voltage with a small number of stages; thus, the number of stages can be reduced. Accordingly, the voltage generation circuit 12c can be reduced in size.

<Voltage Generation Circuit 12d>

In the voltage generation circuit 12d illustrated in FIG. 7C, the second gates of the transistors M25 to M28 are connected to the output terminal OUT. The other components are the same as those of the voltage generation circuit 12b.

The voltage generation circuit 12d has a structure in which a reduction in leakage current of the transistors M25 to M28 is emphasized as compared with the voltage generation circuits 12b and 12c. The second gates of the transistors M25 to M28 are connected to the output terminal OUT where the voltage is the lowest in the voltage generation circuit 12d. The voltage lower than those applied to sources is applied to the second gates of the transistors M25 to M28; thus, $V_{th}$ of the transistors M25 to M28 in the voltage generation circuit 12d can be further increased as compared with the voltage generation circuits 12b and 12c. This can reduce reverse current of the diode-connected transistors M25 to M28, preventing leakage of charges from the capacitors C25 to C28. Accordingly, capacitance values of the capacitors C25 to C28 can be lowered, so that the voltage generation circuit 12d can be reduced in size.

When the circuit 10 has such a structure, a semiconductor device capable of holding data for a long time can be provided. In addition, a semiconductor device capable of reducing power consumption can be provided.

Embodiment 2

In this embodiment, application examples of the circuit 10 described in Embodiment 1 are described with reference to FIGS. 8A and 8B, FIGS. 9A and 9B, FIG. 10, and FIGS. 11A and 11B.

<Nonvolatile Memory>

Figure 8A:
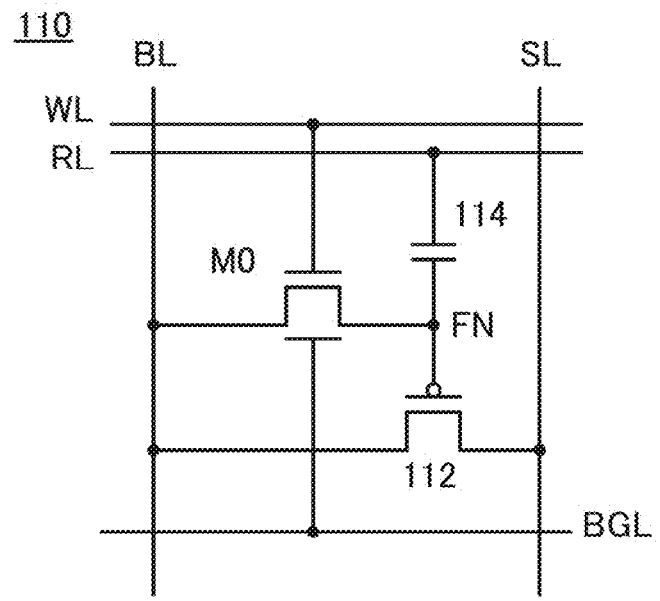
FIGS. 8A and 8B are circuit diagrams each illustrating a configuration example of a nonvolatile memory.

FIG. 8A illustrates a circuit configuration of a memory cell 110 functioning as a memory element.

The memory cell 110 illustrated in FIG. 8A includes the transistor M0 including the first and second gates, a transistor 112, a capacitor 114, a node FN, a wiring BL, a wiring SL, a wiring WL, a wiring RL, and a wiring BGL.

In the memory cell 110 illustrated in FIG. 8A, the first gate of the transistor M0 is electrically connected to the wiring WL, the second gate of the transistor M0 is electrically connected to the wiring BGL, one of a source and a drain of the transistor M0 is electrically connected to the wiring BL, and the other of the source and the drain of the transistor M0 is electrically connected to the node FN.

In the memory cell 110 illustrated in FIG. 8A, a gate of the transistor 112 is electrically connected to the node FN, one of a source and a drain of the transistor 112 is electrically connected to the wiring BL, and the other of the source and the drain of the transistor 112 is electrically connected to the wiring SL.

In the memory cell 110 illustrated in FIG. 8A, a first terminal of the capacitor 114 is electrically connected to the wiring RL, and a second terminal of the capacitor 114 is electrically connected to the node FN.

The transistor M0 preferably has low off-state current. For example, the off-state current of the transistor M0 is preferably lower than or equal to $10^{-18}$ A/µm, further preferably lower than or equal to $10^{-21}$ A/µm, and still further preferably lower than or equal to $10^{-24}$ A/µm. An OS transistor can be used as a transistor having low off-state current.

The transistor 112 preferably has little variation in threshold voltage. Here, transistors with little variation in threshold voltage refer to transistors fabricated in the same process to have an acceptable threshold voltage difference of 100 mV or less, and are specifically transistors including single crystal silicon in channels.

The memory cell 110 utilizes a characteristic in which the charge of the node FN can be held, so that data can be written, held, and read as follows.

Writing and holding of data will be described. First, a potential is applied to the wiring WL so that the transistor M0 is turned on. Accordingly, the potential of the wiring BL is applied to the node FN. That is, predetermined charge is supplied to a node FN (data writing). Here, charge for applying either of two different potential levels (hereinafter referred to as an L level and an H level) is supplied. After that, the transistor M0 is turned off, so that the charge supplied to the node FN is held (data holding).

Since the off-state current of the transistor M0 is extremely low, the charge of the gate of the transistor M0 is held for a long time.

Next, reading of data will be described. An appropriate potential (reading potential) is applied to the wiring RL while a predetermined potential (constant potential) is applied to the wiring SL, so that the potential of the wiring BL varies depending on the amount of charge held in the gate of the transistor 112. In general, in the case where the transistor 112 is a p-channel transistor, an apparent threshold voltage $V_{th\_H}$ when the H level is supplied to the node FN is lower than an apparent threshold voltage $V_{th\_L}$ when the L level is supplied to the node FN. Here, the apparent threshold voltage refers to the potential of the wiring RL that is needed to turn on the transistor 112. Thus, when the potential of the wiring RL is set to a potential $V_0$ that is between $V_{th\_H}$ and $V_{th\_L}$, charge supplied to the gate of the transistor 112 can be determined. For example, in the case where the L level is supplied in data writing, the transistor 112 is turned on when the potential of the wiring RL is $V_0$ ($<V_{th\_L}$). In the case where the H level is supplied in data writing, the transistor 112 remains in an off state even when the potential of the wiring RL is set to $V_0$ ($>V_{th\_H}$). Therefore, the held data can be read by determining the potential of the wiring BL.

Note that although the transistor 112 is a p-channel transistor in the above description, one embodiment of the present invention is not limited thereto, and the transistor 112 might be an n-channel transistor.

Figure 8B:
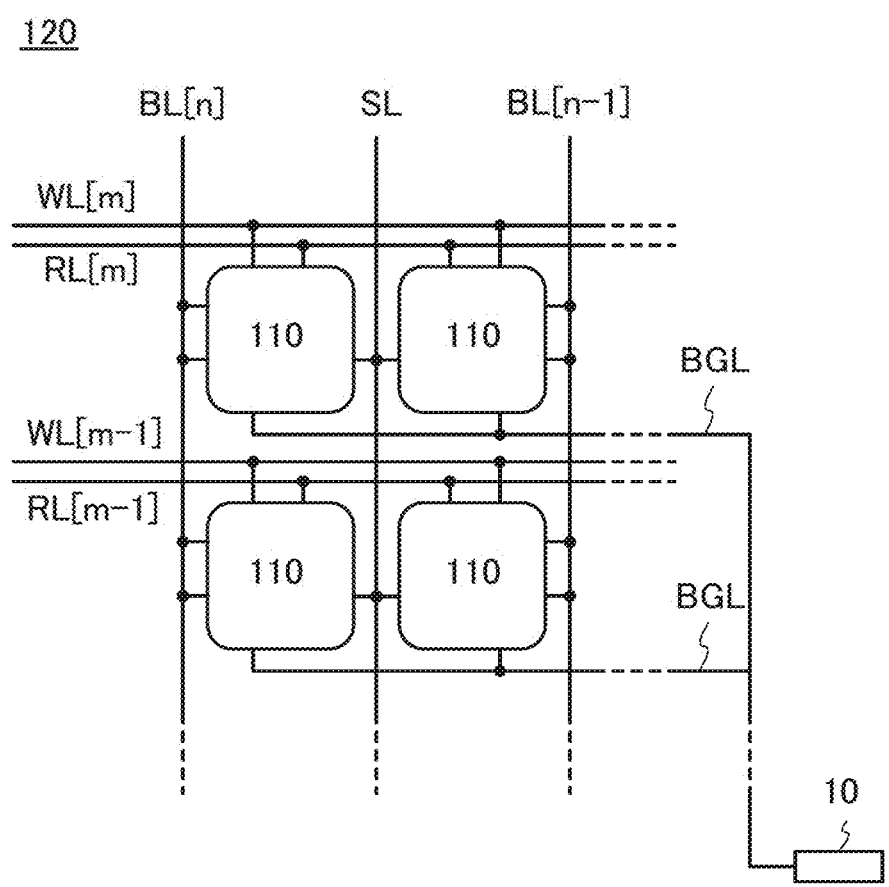

FIG. 8B illustrates a circuit configuration of a memory device 120 including the memory cells 110 arranged in a matrix and the circuit 10 described in Embodiment 1. The memory device 120 functions as a nonvolatile memory.

The memory device 120 includes the memory cells 110 arranged in a matrix of m rows and n columns. Here, m and n are each a natural number of 2 or more. The memory cells 110 provided in an m-th row are electrically connected to wirings WL[m] and RL[m], and the memory cells 110 provided in an n-th column are electrically connected to a wiring BL[n] and the wiring SL.

The second gates of the transistors M0 included in the memory cells 110 are electrically connected to the circuit 10 through the wirings BGL. In other words, the circuit 10 has a function of controlling the second gates of the transistors M0 included in all the memory cells.

When the circuit 10 controls the second gate of the transistor M0, the transistor M0 can have appropriate $V_{th}$ and can be prevented from being normally-on. Consequently, the off-state current of the transistor M0 can be reduced, and the transistor M0 can hold charge written to the node FN.

When the memory device 120 has such a structure, a memory device capable of holding data for a long time even after the memory device is powered off can be provided.

<DRAM>

Figure 9A:
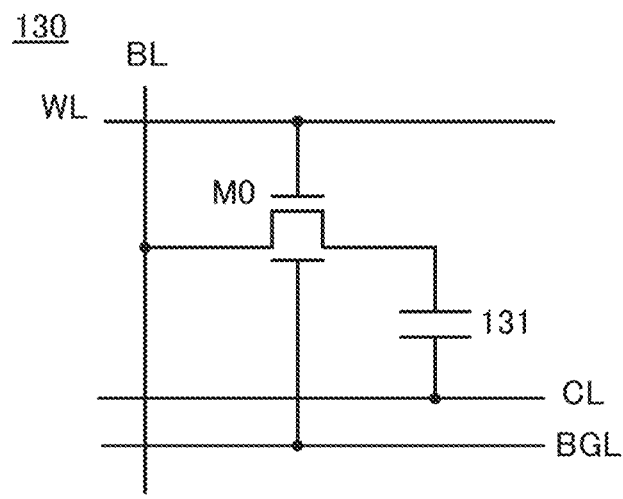
FIGS. 9A and 9B are circuit diagrams each illustrating a configuration example of a DRAM.

FIG. 9A illustrates a circuit configuration of a memory cell 130 functioning as a memory element.

The memory cell 130 illustrated in FIG. 9A includes the transistor M0 including the first and second gates, a capacitor 131, the wiring BL, the wiring WL, a wiring CL, and the wiring BGL.

In the memory cell 130 illustrated in FIG. 9A, the first gate of the transistor M0 is electrically connected to the wiring WL, the second gate of the transistor M0 is electrically connected to the wiring BGL, one of the source and the drain of the transistor M0 is electrically connected to the wiring BL, and the other of the source and the drain of the transistor M0 is electrically connected to a first terminal of the capacitor 131. A second terminal of the capacitor 131 is electrically connected to the wiring CL.

The transistor M0 preferably has low off-state current. For example, the off-state current of the transistor M0 is preferably lower than or equal to $10^{-18}$ A/µm, further preferably lower than or equal to $10^{-21}$ A/µm, and still further preferably lower than or equal to $10^{-24}$ A/µm. An OS transistor can be used as a transistor having low off-state current.

The wiring WL has a function of supplying signals for controlling the on/off state of the transistor M0, and the wiring BL has a function of writing charge to the capacitor 131 through the transistor M0. By turning off the transistor M0 after charge is written to the capacitor 131, the charge written to the capacitor 131 can be held.

Since the charge written to the capacitor 131 leaks to the outside through the transistor M0, operation of rewriting (refreshing) the charge written to the capacitor 131 at regular intervals is needed. However, the refresh frequency is low because the off-state current of the transistor M0 is extremely low and the amount of charge that leaks from the capacitor 131 is small.

Figure 9B:
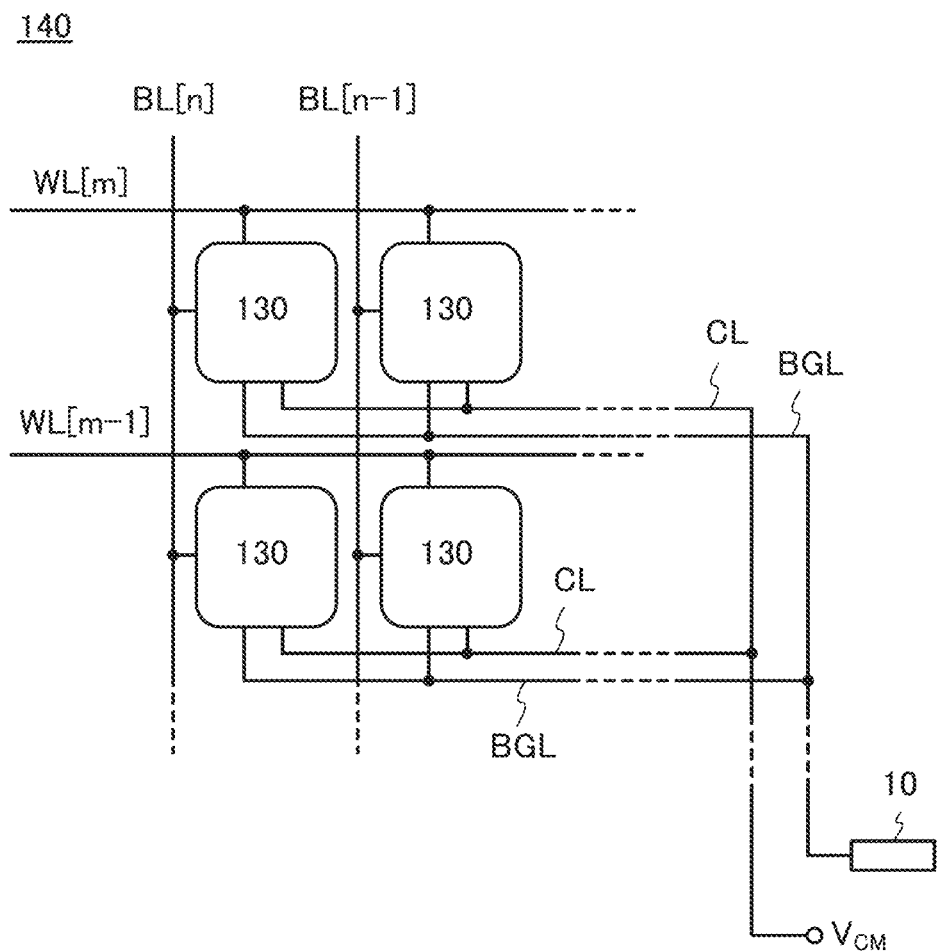

FIG. 9B illustrates a circuit configuration of a memory device 140 including the memory cells 130 arranged in a matrix and the circuit 10 described in Embodiment 1. The memory device 140 functions as a DRAM.

The memory device 140 includes the memory cells 130 arranged in a matrix of m rows and n columns. The memory cells 130 provided in the m-th row are electrically connected to the wiring WL[m], and the memory cells 130 provided in the n-th column are electrically connected to the wiring BL[n]. The wiring CL is electrically connected to a terminal $V_{CM}$ for applying a constant low potential.

The second gates of the transistors M0 included in the memory cells 130 are electrically connected to the circuit 10 through the wirings BGL. In other words, the circuit 10 has a function of controlling the second gates of the transistors M0 included in all the memory cells.

When the circuit 10 controls the second gate of the transistor M0, the transistor M0 can have appropriate $V_{th}$ and can be prevented from being normally-on. Consequently, the off-state current of the transistor M0 can be reduced, and the transistor M0 can hold charge written to the capacitor 131.

When the memory device 140 has such a structure, a memory device capable of operating at low power with infrequent refresh operation can be provided.

<Register>

Figure 10:
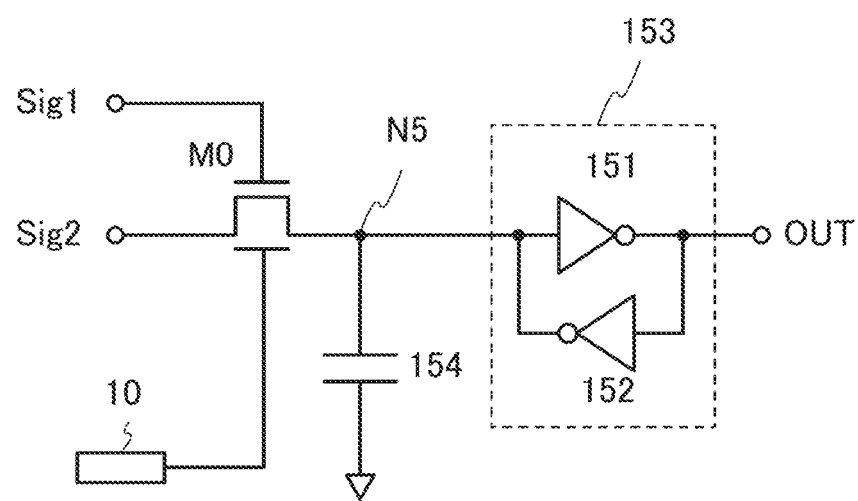
FIG. 10 is a circuit diagram illustrating a configuration example of a register.

FIG. 10 illustrates a configuration example of a 1-bit register circuit 150.

The register circuit 150 includes the transistor M0 including the first and second gates, a capacitor 154, a node N5, and a flip-flop circuit 153.

The flip-flop circuit 153 includes inverters 151 and 152. The inverter 151 whose direction is opposite to the direction of the inverter 152 is connected in parallel with the inverter 152, and a node to which an output side of the inverter 151 is connected corresponds to an output terminal OUT.

The second gate of the transistor M0 is electrically connected to the circuit 10, the first gate of the transistor M0 is electrically connected to an input terminal Sig1, one of the source and the drain of the transistor M0 is electrically connected to an input terminal Sig2, and the other of the source and the drain of the transistor M0 is electrically connected to the node N5.

A first terminal of the capacitor 154 is electrically connected to the node N5, and a constant low potential is applied to a second terminal of the capacitor 154. The ground potential may be applied as the low potential. The node N5 is electrically connected to the flip-flop circuit 153.

The transistor M0 preferably has low off-state current. For example, the off-state current of the transistor M0 is preferably lower than or equal to $10^{-18}$ A/μm, further preferably lower than or equal to $10^{-21}$ A/μm, still further preferably lower than or equal to $10^{-24}$ A/μm. An OS transistor can be used as a transistor having low off-state current.

The register circuit 150 stores and outputs data with input signals from the input terminals Sig1 and Sig2. For example, when high-level voltages are input from the input terminals Sig1 and Sig2, the transistor M0 is turned on, so that a high-level voltage is input to the node N5. Consequently, a low-level voltage obtained by inversion in the inverter 151 is output from the output terminal OUT of the register circuit 150, and at the same time, data of the low-level voltage is stored in the flip-flop circuit 153. In contrast, when a low-level voltage is input from the input terminal Sig2, a high-level voltage is output from the output terminal OUT similarly, and data of the high-level voltage is stored in the flip-flop circuit 153.

The capacitor 154 has a function of holding the voltage of the node N5.

The register circuit 150 can hold the potential of the node N5 even when supply of power supply voltage is stopped by turning off the transistor M0 after a potential is applied from the input terminal Sig2 to the node N5. This is because the off-state current of the transistor M0 is extremely low. In other words, by using the register circuit 150, it is possible to provide a memory device that can hold data even after supply of power supply voltage is stopped.

The circuit 10 has a function of supplying signals for controlling the second gate of the transistor M0. When the circuit 10 controls the second gate of the transistor M0, the transistor M0 can have appropriate $V_{th}$ and can be prevented from being normally-on. Consequently, the off-state current of the transistor M0 can be reduced, and the transistor M0 can hold charge written to the node N5.

Note that in this embodiment, a simple configuration of two inverter circuits is described as an example of the flip-flop circuit 153; however, one embodiment of the present invention is not limited thereto, and a clocked inverter capable of performing clock operation or a configuration in which a NAND circuit and an inverter are combined can be used as appropriate. For example, a known flip-flop circuit such as an RS flip-flop circuit, a JK flip-flop circuit, a D flip-flop circuit, or a T flip-flop circuit can be used as appropriate.

<Display Device>

Figure 11A:
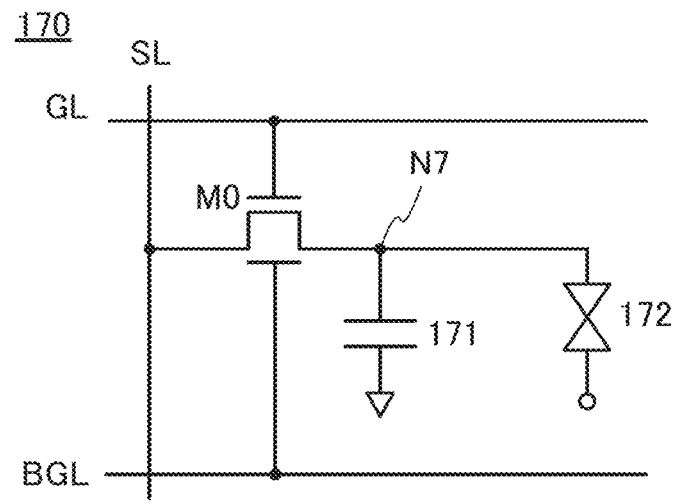
FIGS. 11A and 11B are circuit diagrams each illustrating a configuration example of a display device.
Figure 11B:
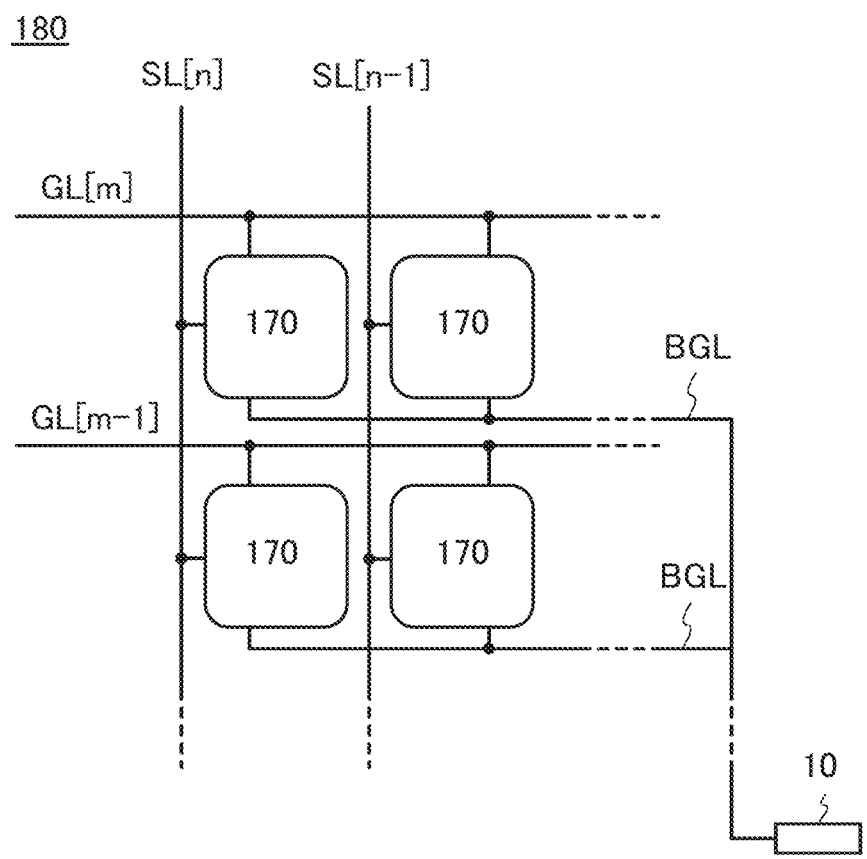

FIGS. 11A and 11B each illustrate an example in which the circuit 10 in Embodiment 1 is used in a display device.

FIG. 11A illustrate a structure example of a pixel 170 that can be used in a display device. The pixel 170 includes the transistor M0 including the first and second gates, a capacitor 171, a display element 172, a node N7, a wiring GL, the wiring SL, and the wiring BGL.

The first gate of the transistor M0 is electrically connected to the wiring GL, the second gate of the transistor M0 is electrically connected to the wiring BGL, one of the source and the drain of the transistor M0 is electrically connected to the wiring SL, and the other of the source and the drain of the transistor M0 is electrically connected to the node N7.

A first terminal of the capacitor 171 is electrically connected to the node N7, and a constant low potential is applied to a second terminal of the capacitor 171.

The capacitor 171 may be provided as needed. In the case where parasitic capacitance of an electrode, a wiring, or the like can be used as capacitance needed to drive the pixel 170, the capacitor 171 may be omitted.

The transistor M0 preferably has low off-state current. For example, the off-state current of the transistor M0 is preferably lower than or equal to $10^{-18}$ A/μm, further preferably lower than or equal to $10^{-21}$ A/μm, still further preferably lower than or equal to $10^{-24}$ A/μm. An OS transistor can be used as a transistor having low off-state current.

A first terminal of the display element 172 is electrically connected to the node N7, and a constant low potential is applied to a second terminal of the display element 172. The ground potential may be applied as the low potential. A dielectric element whose optical characteristics are changed when voltage is applied to its electrodes at opposite ends can be used as the display element 172. For example, a liquid crystal element or an element used for electronic paper or the like, such as an electrophoretic element or a twisting ball element, can be used.

The wiring GL has a function of supplying signals for controlling the on/off state of the transistor M0, and the wiring SL has a function of supplying voltage applied to the display element 172 through the transistor M0.

Since the off-state current of the transistor M0 is extremely low, when the transistor M0 is turned off, the node N7 can hold voltage applied immediately before turning off the transistor M0. While the voltage of the node N7 is held, the display element 172 can maintain its display state.

The pixel 170 can hold the voltage of the node N7 for a long time. Thus, the optical characteristics of the display element 172 can be unchanged even when supply of power supply voltage is stopped. For example, even in the case where a liquid crystal element that cannot store data, such as a twisted nematic (TN) liquid crystal, is used, the element can be always maintained in a state in which voltage is applied. Consequently, it is possible to exclude rewrite operation or it is possible to reduce the frequency of rewrite operation markedly.

FIG. 11B illustrates the circuit configuration of a display device 180 including the pixels 170 arranged in a matrix and the circuit 10 described in Embodiment 1.

The display device 180 includes the pixels 170 arranged in a matrix of m rows and n columns. The pixels 170 provided in the m-th row are electrically connected to a wiring GL[m], and the pixels 170 provided in the n-th column are electrically connected to a wiring SL[n].

The second gates of the transistors M0 included in the pixels 170 are electrically connected to the circuit 10 through the wirings BGL. In other words, the circuit 10 has a function of controlling the second gates of the transistors M0 included in all the pixels.

When the circuit 10 controls the second gate of the transistor M0, the transistor M0 can have appropriate $V_{th}$ and can be prevented from being normally-on. Consequently, the off-state current of the transistor M0 can be reduced, and the transistor M0 can hold charge written to the node N7.

The circuit 10 can control and hold $V_{th}$ of the transistors M0 in the pixels 170 connected to the circuit 10 at optimal levels and can temporarily change $V_{th}$ so that the transistors M0 are set as normally-on transistors. When m×n transistors connected to the circuit 10 are temporarily changed into normally-on transistors, the voltage (i.e., display images) stored in the pixels can be refreshed at the same time by one signal.

When the display device 180 has such a structure, a display device capable of operating at low power with infrequent rewrite operation can be provided. In addition, a display device including a plurality of pixels that can easily perform refresh operation can be obtained. Furthermore, a display device capable of displaying an image even when supply of power is stopped can be obtained.

Embodiment 3

In this embodiment, structures of the OS transistors used in any of the above embodiments are described.
<Oxide Semiconductor>
First, an oxide semiconductor that can be used for an OS transistor is described.

An oxide semiconductor preferably contains at least indium or zinc. In particular, indium and zinc are preferably contained. Here, the case where an oxide semiconductor contains indium, an element M, and zinc is considered.

First, preferred ranges of the atomic ratio of indium, the element M, and zinc contained in an oxide semiconductor according to the present invention are described with reference to FIGS. 12A to 12C. Note that the proportion of oxygen atoms is not shown in FIGS. 12A to 12C. The terms of the atomic ratio of indium, the element M, and zinc contained in the oxide semiconductor are denoted by [In], [M], and [Zn], respectively.

In FIGS. 12A to 12C, broken lines indicate a line where the atomic ratio [In]:[M]:[Zn] is $(1+\alpha):(1-\alpha):1$ (where $-1 \le \alpha \le 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$ (where $\beta \ge 0$), a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

Dashed-double dotted lines indicate a line where the atomic ratio [In]:[M]:[Zn] is $(1+\gamma):2:(1-\gamma)$ (where $-1 \le \gamma \le 1$). The oxide semiconductor shown in FIGS. 12A to 12C with an atomic ratio of [In]:[M]:[Zn]=0:2:1 or an atomic ratio which is in the neighborhood is likely to have a spinel crystal structure.

FIGS. 12A and 12B show examples of the preferred ranges of the atomic ratio of indium, the element M, and zinc contained in an oxide semiconductor in one embodiment of the present invention.

Figure 13:
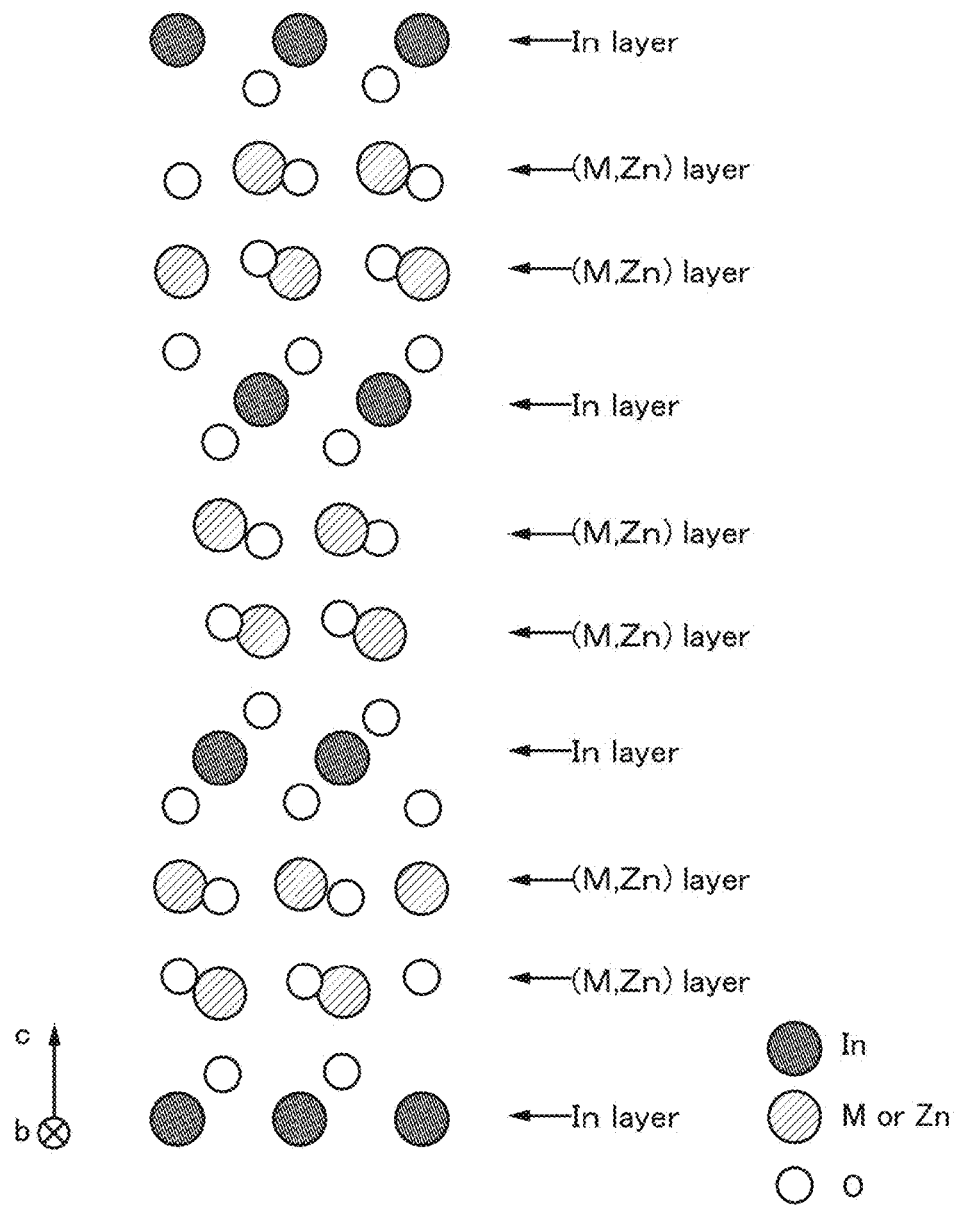
FIG. 13 illustrates a crystal structure of $InMZnO_4$.

FIG. 13 illustrates an example of the crystal structure of InMZnO$_4$ whose atomic ratio [In]:[M]:[Zn] is 1:1:1. The crystal structure illustrated in FIG. 13 is InMZnO$_4$ observed from a direction parallel to a b-axis. Note that a metal element in a layer that contains M, Zn, and oxygen (hereinafter, this layer is referred to as an "(M,Zn) layer") in FIG. 13 represents the element M or zinc. In that case, the proportion of the element M is the same as the proportion of zinc. The element M and zinc can be replaced with each other, and their arrangement is random.

InMZnO$_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 13.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide semiconductor whose atomic ratio [In]:[M]:[Zn] is 1:1:2 has a layered structure that contains one In layer for every three (M,Zn) layers. In other words, if [Zn] is higher than [In] and [M], the proportion of the (M,Zn) layer to the In layer becomes higher when the oxide semiconductor is crystallized.

Note that in the case where the number of (M,Zn) layers with respect to one In layer is not an integer in the oxide semiconductor, the oxide semiconductor might have plural kinds of layered structures where the number of (M,Zn) layers with respect to one In layer is an integer. For example, in the case of [In]:[M]:[Zn]=1:1:1.5, the oxide semiconductor might have the following layered structures: a layered structure of one In layer for every two (M,Zn) layers and a layered structure of one In layer for every three (M,Zn) layers.

For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; therefore, an oxide semiconductor having a high content of indium has higher carrier mobility than that of an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 12C), insulation performance becomes better.

Accordingly, an oxide semiconductor in one embodiment of the present invention preferably has an atomic ratio represented by a region A in FIG. 12A. With the atomic ratio, a layered structure with high carrier mobility and a few grain boundaries is easily obtained.

A region B in FIG. 12B represents an atomic ratio of [In]:[M]:[Zn]=4:2:3 or 4:2:4.1 and the vicinity thereof. The vicinity includes an atomic ratio of [In]:[M]:[Zn]=5:3:4. An oxide semiconductor with an atomic ratio represented by the region B is an excellent oxide semiconductor that has particularly high crystallinity and high carrier mobility.

Note that conditions where a layered structure of an oxide semiconductor is formed are not uniquely determined by the atomic ratio. There is a difference in the degree of difficulty in forming a layered structure among atomic ratios. Even with the same atomic ratio, whether a layered structure is formed or not depends on a formation condition. Therefore, the regions illustrated in FIGS. 12A to 12C show atomic ratios at which a layered structure of an oxide semiconductor can be formed; boundaries of the regions A to C are not clear.

<Transistor Structure 1>

Figure 14A:
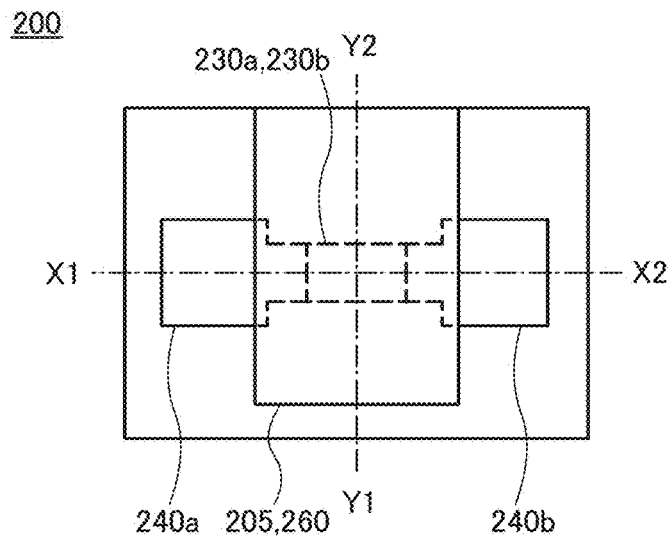
FIG. 14A is a top view and FIGS. 14B and 14C are cross-sectional views illustrating a structure example of a transistor.
Figure 14B:
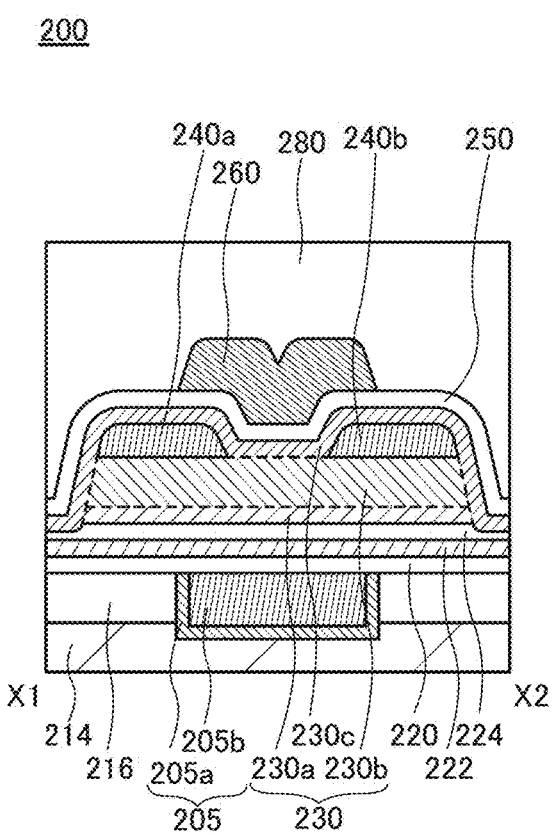
Figure 14C:
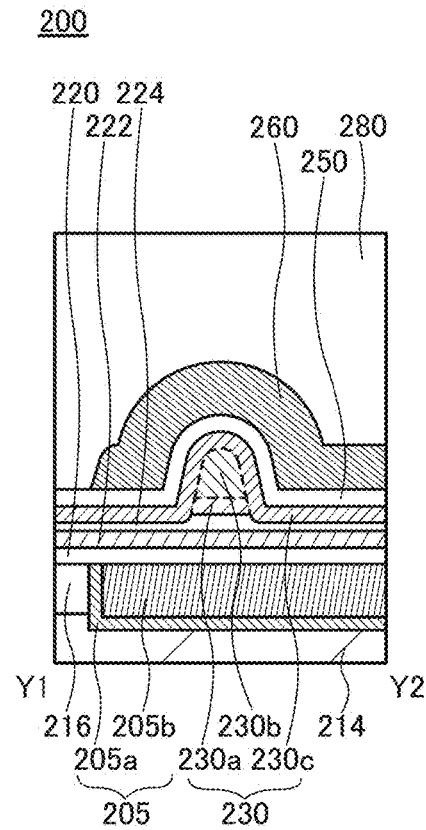

FIGS. 14A to 14C are a top view and cross-sectional views of a transistor 200. FIG. 14A is a top view. FIG. 14B is a cross-sectional view taken along the dashed-dotted line X1-X2 in FIG. 14A. FIG. 14C is a cross-sectional view taken along the dashed-dotted line Y1-Y2 in FIG. 14A. Note that for simplification of the drawing, some components are not illustrated in the top view in FIG. 14A.

The transistor 200 includes a conductor 205 (conductors 205a and 205b) and a conductor 260 that function as gate electrodes, insulators 220, 222, 224, and 250 that function as gate insulating layers, an oxide semiconductor 230 (oxide semiconductors 230a, 230b, and 230c), a conductor 240a that functions as one of a source and a drain, a conductor 240b that functions as the other of the source and the drain, and an insulator 280 that includes excess oxygen.

The oxide semiconductor 230 includes the oxide semiconductor 230a, the oxide semiconductor 230b over the oxide semiconductor 230a, and the oxide semiconductor 230c over the oxide semiconductor 230b. Note that the oxide semiconductor 230b functions as a channel formation region because when the transistor 200 is turned on, current flows mainly in the oxide semiconductor 230b. Although current sometimes flows in regions in the vicinity of the interfaces (mixed regions in some cases) between the oxide semiconductor 230b and the oxide semiconductors 230a and 230c, the other regions of the oxide semiconductors 230a and 230c function as insulators.

The conductor 205 is formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

For example, a conductor having a barrier property against hydrogen, e.g., tantalum nitride, may be used as the conductor 205a, and tungsten, which has high conductivity, may be stacked thereover as the conductor 205b. The use of the combination of the materials can suppress diffusion of hydrogen into the oxide semiconductor 230 while conductivity of a wiring is ensured. Note that a two-layer structure of the conductor 205a and the conductor 205b is illustrated in FIGS. 14A to 14C; however, the structure of the conductor 205 is not limited thereto, and a single-layer structure or a stacked-layer structure of three or more layers may be used.

Each of the insulators 220 and 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). In the case where such an insulator containing excess oxygen is provided in contact with an oxide semiconductor in the transistor 200, oxygen vacancies in the oxide semiconductor can be compensated. Note that the insulators 220 and 224 are not necessarily formed of the same material.

The insulator 222 preferably has a single-layer structure or a stacked-layer structure formed using an insulator containing silicon oxide, silicon oxynitride, silicon nitride oxide, aluminum oxide, hafnium oxide, tantalum oxide, zirconium oxide, lead zirconate titanate (PZT), strontium titanate ($SrTiO_3$), $(Ba,Sr)TiO_3$ (BST), or the like. Aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

Note that the insulator 222 may have a stacked-layer structure of two or more layers. In this case, the stacked layers are not necessarily formed of the same material but may be formed of different materials.

In the case where the insulator 222 including a high-k material is provided between the insulator 220 and the insulator 224, the insulator 222 can be negatively charged. That is, the insulator 222 can function as the charge accumulation layer in the voltage holding circuit 11c described in Embodiment 1.

For example, in the case where the insulator 220 and the insulator 224 are formed using silicon oxide and the insulator 222 is formed using a material having a lot of electron trap states such as hafnium oxide, aluminum oxide, or tantalum oxide, the state where the potential of the conductor 205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide semiconductor in the transistor 200 to the conductor 205. At this time, some of the moving electrons are trapped by the electron trap states of the insulator 222.

In the transistor in which a necessary amount of electrons is trapped by the electron trap states of the insulator 222, $V_{th}$ is shifted in the positive direction. By controlling the voltage of the conductor 205, the amount of electrons to be trapped can be controlled, and thus $V_{th}$ can be controlled.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging.

Furthermore, $V_{th}$ can be controlled by appropriate adjustment of the thicknesses of the insulators 220, 222, and 224. A transistor having low leakage current in an off state can be provided. The thicknesses of the insulators 220, 222, and 224 are preferably reduced because $V_{th}$ can be easily controlled by the conductor 205. For example, each of the thicknesses of the insulators 220, 222, and 224 is less than or equal to 50 nm, preferably less than or equal to 30 nm, further preferably less than or equal to 10 nm, and still further preferably less than or equal to 5 nm.

The oxide semiconductor 230a, the oxide semiconductor 230b, and the oxide semiconductor 230c are formed using metal oxide such as In-M-Zn oxide. In—Ga oxide or In—Zn oxide may be used as the oxide semiconductor 230.

The energy level of the conduction band minimum of each of the oxide semiconductors 230a and 230c is closer to the vacuum level than that of the oxide semiconductor 230b. Typically, a difference in the energy level between the conduction band minimum of the oxide semiconductor 230b and the conduction band minimum of each of the oxide semiconductors 230a and 230c is preferably greater than or equal to 0.15 eV or greater than or equal to 0.5 eV and less than or equal to 2 eV or less than or equal to 1 eV. That is, a difference in the electron affinity between each of the oxide semiconductors 230a and 230c and the oxide semiconductor 230b is preferably greater than or equal to 0.15 eV or greater than or equal to 0.5 eV and less than or equal to 2 eV or less than or equal to 1 eV.

The energy gap of the oxide semiconductor 230b is preferably greater than or equal to 2 eV and further preferably greater than or equal to 2.5 eV and less than or equal to 3.0 eV. Furthermore, the energy gap of each of the oxide semiconductors 230a and 230c is preferably greater than or equal to 2 eV, further preferably greater than or equal to 2.5 eV, and still further preferably greater than or equal to 2.7 eV and less than or equal to 3.5 eV. The energy gap of each of the oxide semiconductors 230a and 230c is preferably greater than that of the oxide semiconductor 230b. For example, a difference in the energy gap between the oxide semiconductor 230a and the oxide semiconductor 230b is preferably greater than or equal to 0.15 eV or greater than or equal to 0.5 eV and less than or equal to 2 eV or less than or equal to 1 eV. Similarly, a difference in the energy gap between the oxide semiconductor 230c and the oxide semiconductor 230b is preferably greater than or equal to 0.15 eV or greater than or equal to 0.5 eV and less than or equal to 2 eV or less than or equal to 1 eV.

The thickness of each of the oxide semiconductors 230a, 230b, and 230c is greater than or equal to 3 nm and less than or equal to 200 nm, preferably greater than or equal to 3 nm and less than or equal to 100 nm, further preferably greater than or equal to 3 nm and less than or equal to 60 nm.

When the carrier density of an oxide semiconductor is reduced, the negative shift of the threshold voltage of a transistor can be suppressed or the off-state current of the transistor can be reduced. A state with a low impurity concentration and a low density of defect states is referred to as a highly purified intrinsic or substantially highly purified intrinsic state. A highly purified intrinsic or substantially highly purified intrinsic oxide semiconductor has few carrier generation sources, and thus can have a low carrier density.

A highly purified intrinsic or substantially highly purified intrinsic oxide semiconductor is preferably used as the oxide semiconductors 230a and 230c. For example, the carrier density of the oxide semiconductors 230a and 230c is lower than $8\times10^{11}/cm^3$, preferably lower than $1\times10^{11}/cm^3$, further preferably lower than $1\times10^{10}/cm^3$, and greater than or equal to $1\times10^{-9}/cm^3$.

In contrast, when the carrier density of the oxide semiconductor is increased, the field-effect mobility of the transistor can be increased in some cases. In order to increase the carrier density of the oxide semiconductor, the impurity concentration in the oxide semiconductor is slightly increased or the density of defect states in the oxide semiconductor is increased. For example, an oxide semiconductor in which the impurity concentration is slightly increased or the density of defect states is increased in the range where a favorable on/off ratio is obtained in the $V_{GS}$-$I_{DS}$ characteristics of the transistor can be regarded as substantially intrinsic.

The carrier density of the oxide semiconductor 230b is preferably higher than that of the oxide semiconductors 230a and 230c. The carrier density of the oxide semiconductor 230b is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

The density of defect states in a mixed layer formed at an interface between the oxide semiconductors 230a and 230b or an interface between the oxide semiconductors 230b and 230c is preferably made low.

Specifically, when the oxide semiconductors 230a and 230b or the oxide semiconductors 230b and 230c contain the same element (as a main component) in addition to oxygen, a mixed layer with a low density of defect states can be formed. For example, in the case where the oxide semiconductor 230b is an In—Ga—Zn oxide semiconductor, it is preferable to use an In—Ga—Zn oxide semiconductor, a Ga—Zn oxide semiconductor, gallium oxide, or the like as each of the oxide semiconductors 230a and 230c.

At this time, the oxide semiconductor 230b serves as a main carrier path. Since the density of defect states at the interface between the oxide semiconductors 230a and 230b and the interface between the oxide semiconductors 230b and 230c can be made low, the influence of interface scattering on carrier conduction is small, and high on-state current can be obtained.

When an electron is trapped in a trap state, the trapped electron behaves like fixed charge; thus, $V_{th}$ of a transistor is shifted in the positive direction. The oxide semiconductors 230a and 230c can make the trap state apart from the oxide semiconductor 230b. This structure can prevent the positive shift of $V_{th}$ of the transistor.

A material whose conductivity is sufficiently lower than that of the oxide semiconductor 230b is used for the oxide semiconductors 230a and 230c. In that case, the oxide semiconductor 230b, the interface between the oxide semiconductors 230b and 230a, and the interface between the oxide semiconductors 230b and 230c mainly function as a channel region. For example, an oxide semiconductor with high insulation performance and any of the atomic ratios represented by the region C in FIG. 12C is used as the oxide semiconductors 230a and 230c. Note that the region C in FIG. 12C represents the atomic ratio of [In]:[M]:[Zn]=0:1:0 or the vicinity thereof.

In the case where an oxide semiconductor with any of the atomic ratios represented by the region A in FIG. 12A is used as the oxide semiconductor 230b, it is particularly preferable to use an oxide semiconductor with [M]/[In] of greater than or equal to 1, preferably greater than or equal to 2 as each of the oxide semiconductors 230a and 230c. In addition, it is suitable to use an oxide semiconductor with sufficiently high insulation performance and [M]/([Zn]+[In]) of greater than or equal to 1 as the oxide semiconductor 230c.

Here, in the transistor 200 illustrated in FIGS. 14A to 14C and the like, the conductor 260 is referred to as a top gate and the conductor 205 is referred to as a bottom gate in some cases. Alternatively, the conductor 260 is referred to as a front gate and the conductor 205 is referred to as a back gate in some cases.

The oxide semiconductor 230c has lower crystallinity than the oxide semiconductor 230b in some cases. The oxide semiconductor 230b preferably includes a CAAC-OS which is described later. When the crystallinity of the oxide semiconductor 230c is reduced, the oxide semiconductor 230c has higher oxygen permeability; thus, oxygen is easily supplied from the insulator positioned above the oxide semiconductor 230c to the oxide semiconductor 230b in some cases. Here, the oxide semiconductor 230c may be an amorphous oxide semiconductor or an amorphous-like oxide semiconductor (a-like OS) which is described later.

The oxide semiconductor 230a may include a CAAC-OS. The oxide semiconductor 230a preferably has higher crystallinity than the oxide semiconductor 230c.

The insulator 250 can have a single-layer structure or a stacked-layer structure formed using an insulator containing silicon oxide, silicon oxynitride, silicon nitride oxide, aluminum oxide, hafnium oxide, tantalum oxide, zirconium oxide, lead zirconate titanate (PZT), strontium titanate (SrTiO$_3$), (Ba,Sr)TiO$_3$ (BST), or the like. Aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

As the insulator 250, like the insulator 224, an oxide insulator that contains oxygen in excess of the stoichiometric composition is preferably used. When such an insulator containing excess oxygen is provided in contact with the oxide semiconductor 230, oxygen vacancies in the oxide semiconductor 230 can be reduced.

As the insulator 250, an insulating film formed of aluminum oxide, aluminum oxynitride, hafnium oxide, hafnium oxynitride, silicon nitride, or the like, which has barrier properties against oxygen and hydrogen, can be used. The insulator 250 formed of such a material functions as a layer that prevents release of oxygen from the oxide semiconductor 230 and entry of impurities such as hydrogen from the outside.

Note that the insulator 250 may have a stacked-layer structure similar to that of the insulator 220, the insulator 222, and the insulator 224. When the insulator 250 includes an insulator in which a necessary amount of electrons is trapped by electron trap states, $V_{th}$ of the transistor 200 can be shifted in the positive direction. The transistor 200 having the structure is a normally-off transistor that is in a non-conduction state (also referred to as an off state) even when the gate voltage is 0 V.

In addition to the insulator 250, a barrier film may be provided between the oxide semiconductor 230 and the conductor 260 in the semiconductor device illustrated in FIGS. 14A to 14C. The oxide semiconductor 230c may have a barrier property.

For example, an insulating film containing excess oxygen is provided in contact with the oxide semiconductor 230 and covered by a barrier film, whereby the composition of the oxide semiconductor can be almost the same as the stoichiometric composition or can be in a supersaturated state containing more oxygen than that in the stoichiometric composition. It is also possible to prevent entry of impurities such as hydrogen into the oxide semiconductor 230.

One of the conductor 240a and the conductor 240b functions as a source electrode and the other functions as a drain electrode.

Any of metals such as aluminum, titanium, chromium, nickel, copper, yttrium, zirconium, molybdenum, silver, tantalum, and tungsten, or an alloy containing any of the metals as its main component can be used for the conductors 240a and 240b. Although a single-layer structure is illustrated in the drawings, a stacked-layer structure of two or more layers may be used.

For example, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

The conductor 260 functioning as a gate electrode can be formed using, for example, a metal selected from aluminum, chromium, copper, tantalum, titanium, molybdenum, and tungsten, an alloy containing any of these metals as its component, or an alloy containing any of these metals in combination. Alternatively, one or both of manganese and zirconium may be used. Alternatively, a semiconductor typified by polycrystalline silicon doped with an impurity element such as phosphorus, or a silicide such as nickel silicide may be used.

For example, a two-layer structure where a titanium film is stacked over an aluminum film may be used. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. Alternatively, an alloy film or a nitride film that contains aluminum and one or more elements selected from titanium, tantalum, tungsten, molybdenum, chromium, neodymium, and scandium may be used.

The conductor 260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 260 can have a stacked-layer structure of the above light-transmitting conductive material and the above metal.

When a conductive material having a high work function is used for the conductor 260, $V_{th}$ of the transistor 200 can be increased and the cutoff current of the transistor 200 can be reduced. A conductive material whose work function is preferably greater than or equal to 4.8 eV, further preferably greater than or equal to 5.0 eV, still further preferably greater than or equal to 5.2 eV, yet further preferably greater than or equal to 5.4 eV, and yet still further preferably greater than or equal to 5.6 eV is used for the conductor 260. Examples of a conductive material having a high work function include molybdenum, molybdenum oxide, platinum (Pt), platinum (Pt) silicide, nickel (Ni) silicide, indium tin oxide, and In—Ga—Zn oxide to which nitrogen is added.

The insulator 280 is provided over the transistor 200. The insulator 280 preferably includes an insulator containing oxygen in excess of that in the stoichiometric composition. That is, in the insulator 280, a region containing oxygen in excess of that in the stoichiometric composition (hereinafter also referred to as excess-oxygen region) is preferably formed. In particular, in the case of using an oxide semiconductor in the transistor 200, when an insulator including an excess-oxygen region is provided as an interlayer film or the like in the vicinity of the transistor 200, oxygen vacancies in the transistor 200 are reduced, whereby the reliability can be improved.

As the insulator including the excess-oxygen region, specifically, an oxide material that releases part of oxygen by heating is preferably used. An oxide material that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 280 covering the transistor 200 may function as a planarization film that covers a roughness thereunder.

<Transistor Structure 2>

Figure 15A:
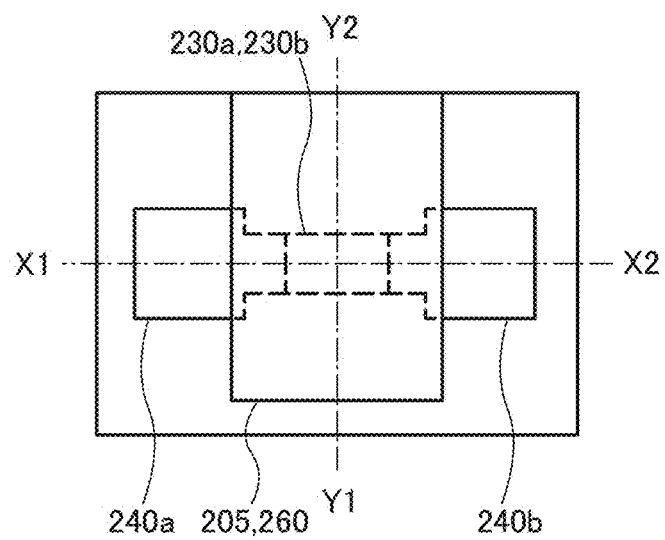
FIG. 15A is a top view and FIGS. 15B and 15C are cross-sectional views illustrating a structure example of a transistor.
Figure 15B:
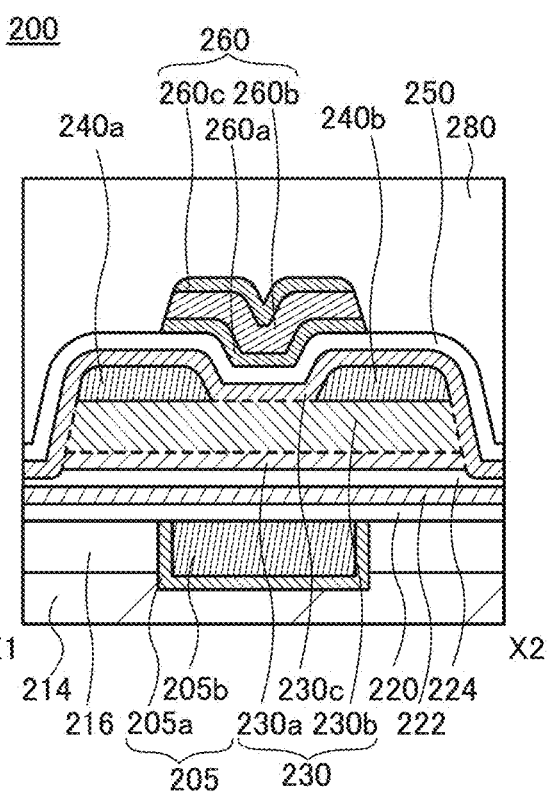
Figure 15C:
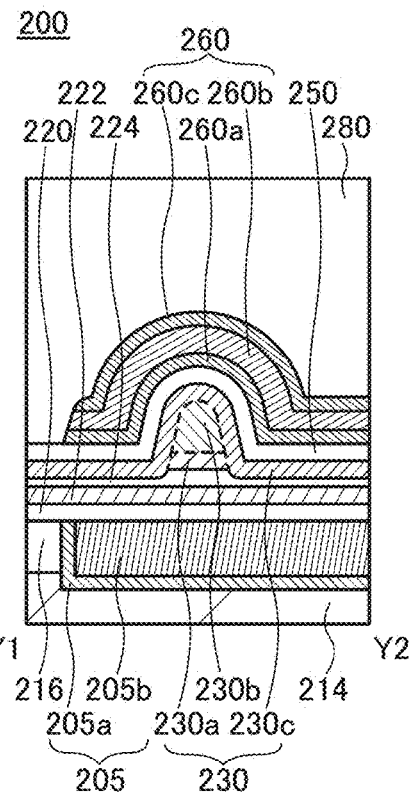

FIGS. 15A to 15C illustrate an example of a structure that can be used for the transistor 200. FIG. 15A illustrates a top surface of the transistor 200. For simplification of the figure, some films are omitted in FIG. 15A. FIG. 15B is a cross-sectional view taken along the dashed-dotted line X1-X2 in FIG. 15A, and FIG. 15C is a cross-sectional view taken along the dashed-dotted line Y1-Y2 in FIG. 15A.

Note that in the transistor 200 in FIGS. 15A to 15C, components having the same function as the components in the transistor 200 in FIGS. 14A to 14C are denoted by the same reference numerals.

In the structure illustrated in FIGS. 15A to 15C, the conductor 260 functioning as the gate electrode includes a conductor 260a, a conductor 260b, and a conductor 260c.

The conductor 260a is formed by a thermal CVD method, an MOCVD method, or an atomic layer deposition (ALD) method. In particular, the conductor 260a is preferably formed by an ALD method. When the conductor 260a is formed by an ALD method or the like, plasma damage to the insulator 250 can be reduced. In addition, the conductor 260a is preferably formed by an ALD method or the like because coverage thereof can be improved. Thus, the highly reliable transistor 200 can be provided.

The conductor 260b is formed using a material having high conductivity, such as tantalum, tungsten, copper, or aluminum. Furthermore, the conductor 260c formed over the conductor 260b is preferably formed using a conductor that is not easily oxidized, such as tungsten nitride. In the case where the insulator 280 is formed using an oxide material from which oxygen is released, the conductor 260 can be prevented from being oxidized by the released oxygen.

Thus, the oxidation of the conductor 260 can be prevented, and oxygen released from the insulator 280 can be supplied to the oxide semiconductor 230 efficiently.

When the conductor 260c having a large contact area with the insulator 280 including the excess-oxygen region is formed using a conductor that is not easily oxidized, it is possible to suppress absorption of excess oxygen in the insulator 280 by the conductor 260. Furthermore, when the conductor 260b is formed using a conductor having high conductivity, the transistor 200 with low power consumption can be provided.

<Transistor Structure 3>

Figure 16A:
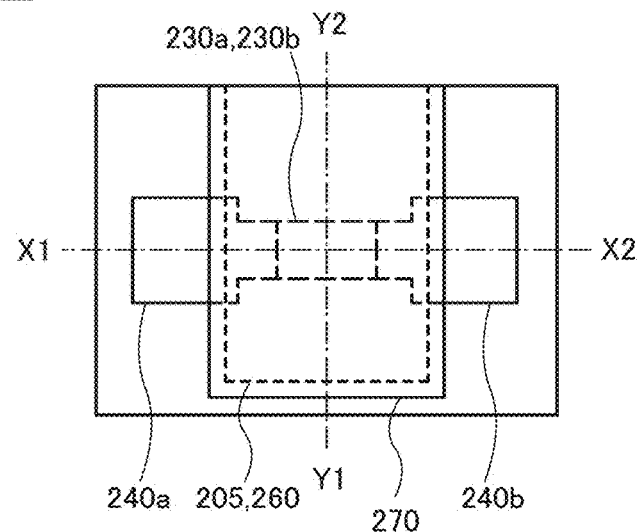
FIG. 16A is a top view and FIGS. 16B and 16C are cross-sectional views illustrating a structure example of a transistor.
Figure 16B:
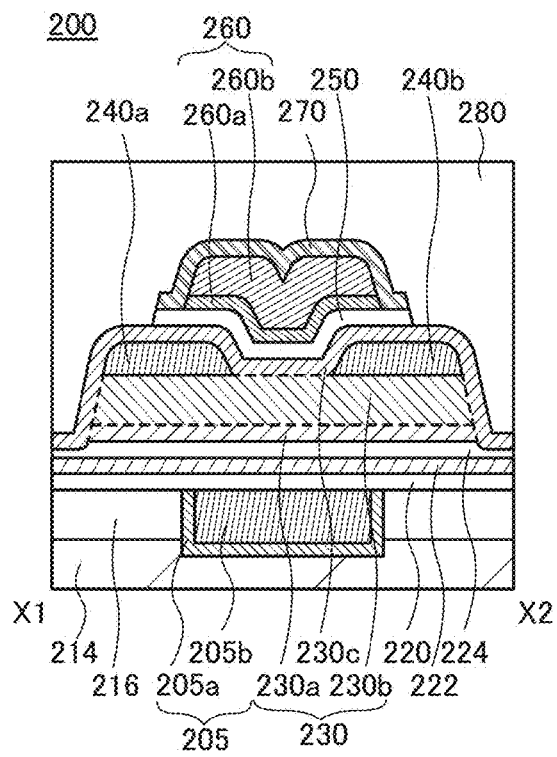
Figure 16C:
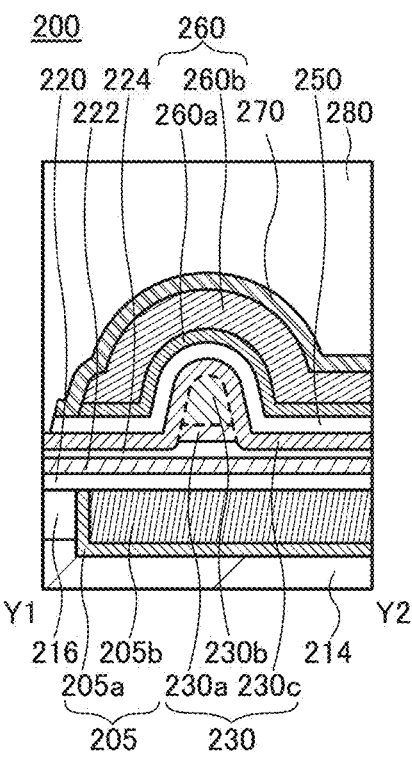

FIGS. 16A to 16C illustrate an example of a structure that can be used for the transistor 200. FIG. 16A illustrates a top surface of the transistor 200. For simplification of the figure, some films are omitted in FIG. 16A. FIG. 16B is a cross-sectional view taken along the dashed-dotted line X1-X2 in FIG. 16A, and FIG. 16C is a cross-sectional view taken along the dashed-dotted line Y1-Y2 in FIG. 16A.

Note that in the transistor 200 in FIGS. 16A to 16C, components having the same function as the components in the transistor 200 in FIGS. 14A to 14C are denoted by the same reference numerals.

The structure illustrated in FIGS. 16A to 16C is a stacked-layer structure in which the conductor 260 functioning as the gate electrode includes the conductor 260a and the conductor 260b. An insulator 270 is formed over the conductor 260 functioning as the gate electrode.

The conductor 260a is formed by a thermal CVD method, an MOCVD method, or an ALD method. In particular, the conductor 260a is preferably formed by an ALD method. When the conductor 260a is formed by an ALD method or the like, plasma damage to the insulator 250 can be reduced. In addition, the conductor 260a is preferably formed by an ALD method or the like because coverage thereof can be improved. Thus, the highly reliable transistor 200 can be provided.

The conductor 260b is formed using a material having high conductivity, such as tantalum, tungsten, copper, or aluminum.

The insulator 270 is provided to cover the conductor 260. In the case where the insulator 280 is formed using an oxide material from which oxygen is released, the insulator 270 is formed using a substance having a barrier property against oxygen to prevent the conductor 260 from being oxidized by the released oxygen.

For example, the insulator 270 can be formed using metal oxide such as aluminum oxide. The insulator 270 is formed to a thickness with which the oxidation of the conductor 260 is prevented. For example, the thickness of the insulator 270 is set greater than or equal to 1 nm and less than or equal to 10 nm, preferably greater than or equal to 3 nm and less than or equal to 7 nm.

Thus, the oxidation of the conductor 260 can be prevented, and oxygen released from the insulator 280 can be supplied to the oxide semiconductor 230 efficiently.

<Transistor Structure 4>

Figure 17A:
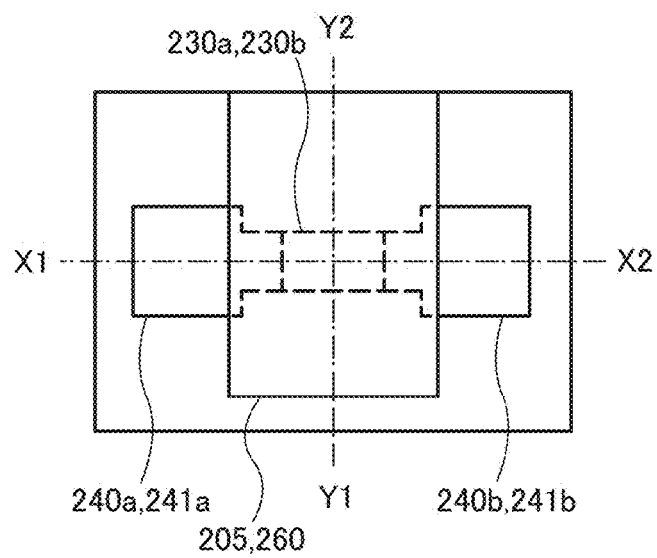
FIG. 17A is a top view and FIGS. 17B and 17C are cross-sectional views illustrating a structure example of a transistor.
Figure 17B:
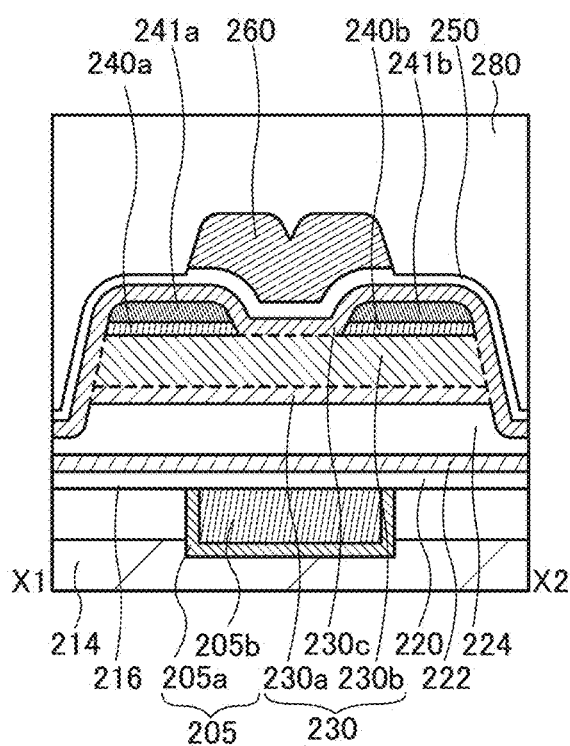
Figure 17C:
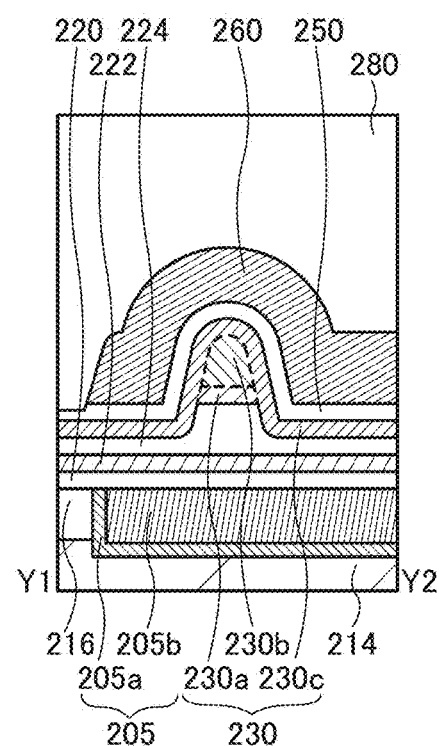

FIGS. 17A to 17C illustrate an example of a structure that can be used for the transistor 200. FIG. 17A illustrates a top surface of the transistor 200. For simplification of the figure, some films are omitted in FIG. 17A. FIG. 17B is a cross-sectional view taken along the dashed-dotted line X1-X2 in FIG. 17A, and FIG. 17C is a cross-sectional view taken along the dashed-dotted line Y1-Y2 in FIG. 17A.

Note that in the transistor 200 in FIGS. 17A to 17C, components having the same function as the components in the transistor 200 in FIGS. 14A to 14C are denoted by the same reference numerals.

In the structure illustrated in FIGS. 17A to 17C, conductors functioning as a source and a drain each have a stacked-layer structure. The conductors 240a and 240b are preferably formed using a conductor having high adhesion to the oxide semiconductor 230b, and conductors 241a and 241b are preferably formed using a material having high conductivity. The conductors 240a and 240b are preferably formed by an ALD method. When the conductors 240a and 240b are formed by an ALD method or the like, coverage can be improved.

For example, in the case where metal oxide containing indium is used for the oxide semiconductor 230b, titanium nitride or the like is used for the conductors 240a and 240b. When a material having high conductivity, such as tantalum, tungsten, copper, or aluminum, is used for the conductors 241a and 241b, the transistor 200 with high reliability and low power consumption can be provided.

As illustrated in FIG. 17C, in the transistor 200 in the channel width direction, the oxide semiconductor 230b is covered with the conductor 260. By the existence of a projection of the insulator 224, the side surfaces of the oxide semiconductor 230b can be covered with the conductor 260. For example, it is preferable that at the side surfaces of the oxide semiconductor 230b, the bottom surface of the conductor 260 be positioned closer to a substrate than the bottom surface of the oxide semiconductor 230b by adjusting the shape of the projection of the insulator 224. That is, the transistor 200 has a structure in which the oxide semiconductor 230b can be electrically surrounded by an electric field of the conductors 205 and 260. As described above, a structure in which the oxide semiconductor 230b is electrically surrounded by an electric field of a conductor is referred to as a surrounded channel (s-channel) structure. In the transistor 200 with the s-channel structure, a channel can be formed in the whole (bulk) of the oxide semiconductor 230b. In the s-channel structure, the drain current of the transistor is increased, so that a larger amount of on-state current (current which flows between the source and the drain when the transistor is on) can be obtained. Furthermore, the entire channel formation region of the oxide semiconductor 230b can be depleted by the electric field of the conductor 205 and the conductor 260. Accordingly, the off-state current of the transistor with the s-channel structure can be further reduced. When the channel width is shortened, the effects of the s-channel structure to increase the on-state current and reduce the off-state current can be enhanced.

<Transistor Structure 5>

Figure 18A:
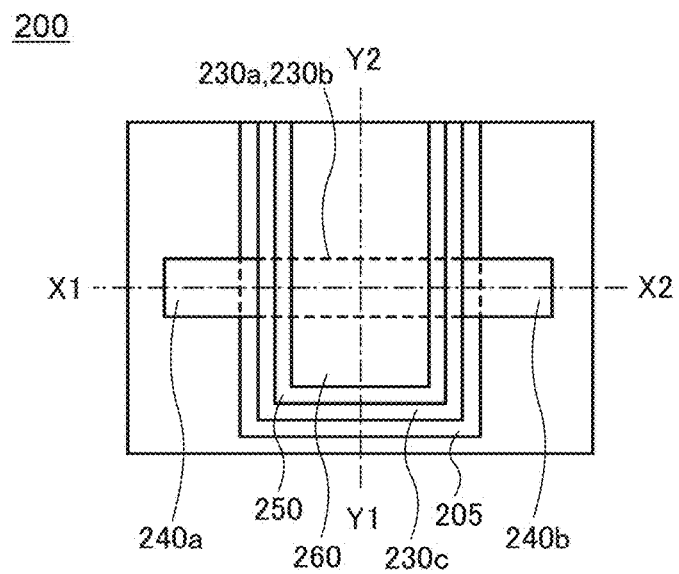
FIG. 18A is a top view and FIGS. 18B and 18C are cross-sectional views illustrating a structure example of a transistor.
Figure 18B:
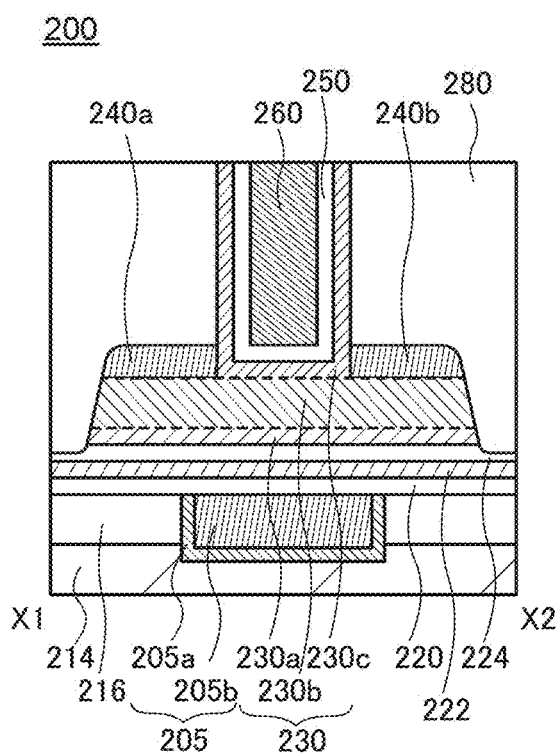
Figure 18C:
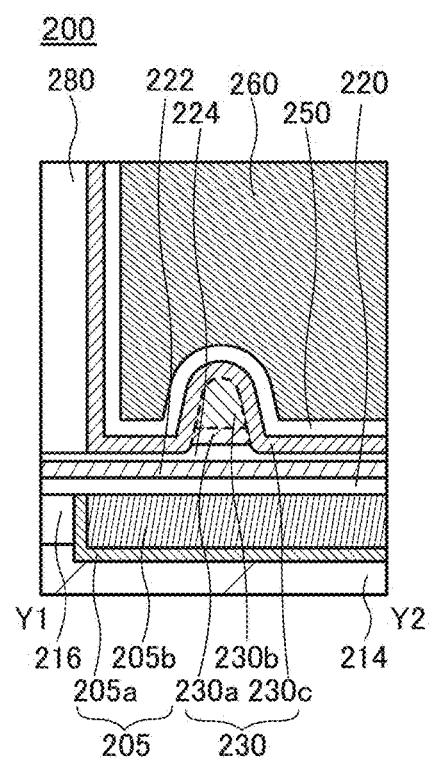

FIGS. 18A to 18C illustrate an example of a structure that can be used for the transistor 200. FIG. 18A illustrates a top surface of the transistor 200. For simplification of the figure, some films are omitted in FIG. 18A. FIG. 18B is a cross-sectional view taken along the dashed-dotted line X1-X2 in FIG. 18A, and FIG. 18C is a cross-sectional view taken along the dashed-dotted line Y1-Y2 in FIG. 18A.

Note that in the transistor 200 in FIGS. 18A to 18C, components having the same function as the components in the transistor 200 in FIGS. 14A to 14C are denoted by the same reference numerals.

The oxide semiconductor 230c, the insulator 250, and the conductor 260 are formed in an opening formed in the insulator 280.

Since the transistor 200 illustrated in FIGS. 18A to 18C has a structure in which the conductors 240a and 240b hardly overlap with the conductor 260, the parasitic capacitance added to the conductor 260 can be reduced. Thus, the transistor 200 with a high operation frequency can be provided.

<Transistor Structure 6>

Figure 19A:
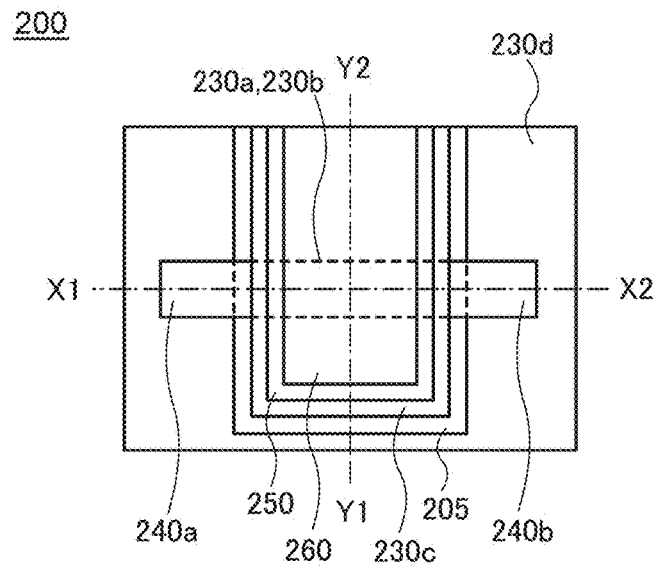
FIG. 19A is a top view and FIGS. 19B and 19C are cross-sectional views illustrating a structure example of a transistor.
Figure 19B:
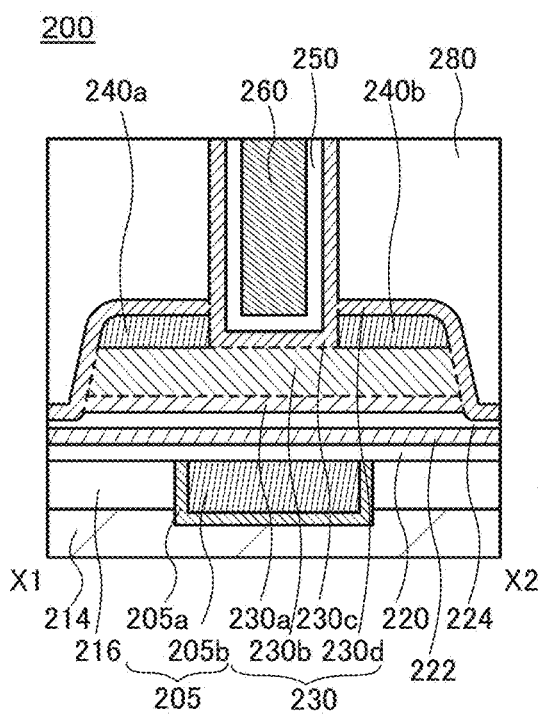
Figure 19C:
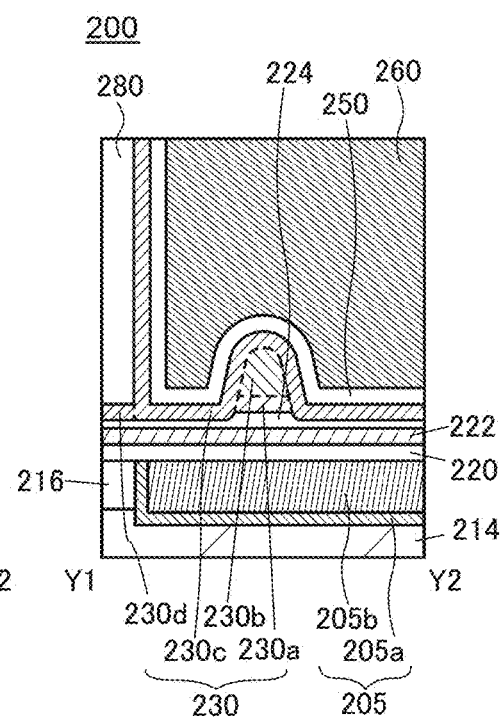

FIGS. 19A to 19C illustrate an example of a structure that can be used for the transistor 200. FIG. 19A illustrates a top surface of the transistor 200. For simplification of the figure, some films are omitted in FIG. 19A. FIG. 19B is a cross-sectional view taken along the dashed-dotted line X1-X2 in FIG. 19A, and FIG. 19C is a cross-sectional view taken along the dashed-dotted line Y1-Y2 in FIG. 19A.

Note that in the transistor 200 in FIGS. 19A to 19C, components having the same function as the components in the transistor 200 in FIGS. 14A to 14C are denoted by the same reference numerals.

In the transistor 200 illustrated in FIGS. 19A to 19C, the oxide semiconductor 230c, the insulator 250, and the conductor 260 are formed in the opening formed in the insulator 280.

Since the transistor 200 illustrated in FIGS. 19A to 19C has a structure in which the conductors 240a and 240b hardly overlap with the conductor 260, the parasitic capacitance added to the conductor 260 can be reduced. Thus, the transistor 200 with a high operation frequency can be provided.

The oxide semiconductor 230d is provided between the oxide semiconductor 230b and the insulator 280 including the excess-oxygen region. Thus, generation of a shallow level in the vicinity of a channel formed in the oxide semiconductor 230b is suppressed as compared with the case where the oxide semiconductor 230b is directly in contact with the insulator 280 as illustrated in FIGS. 18A to 18C. Consequently, a highly reliable semiconductor device can be provided.

Embodiment 4

In this embodiment, one embodiment of a semiconductor device is described with reference to FIG. 20, FIG. 21, FIGS. 22A and 22B, and FIGS. 23A and 23B.

Figure 20:
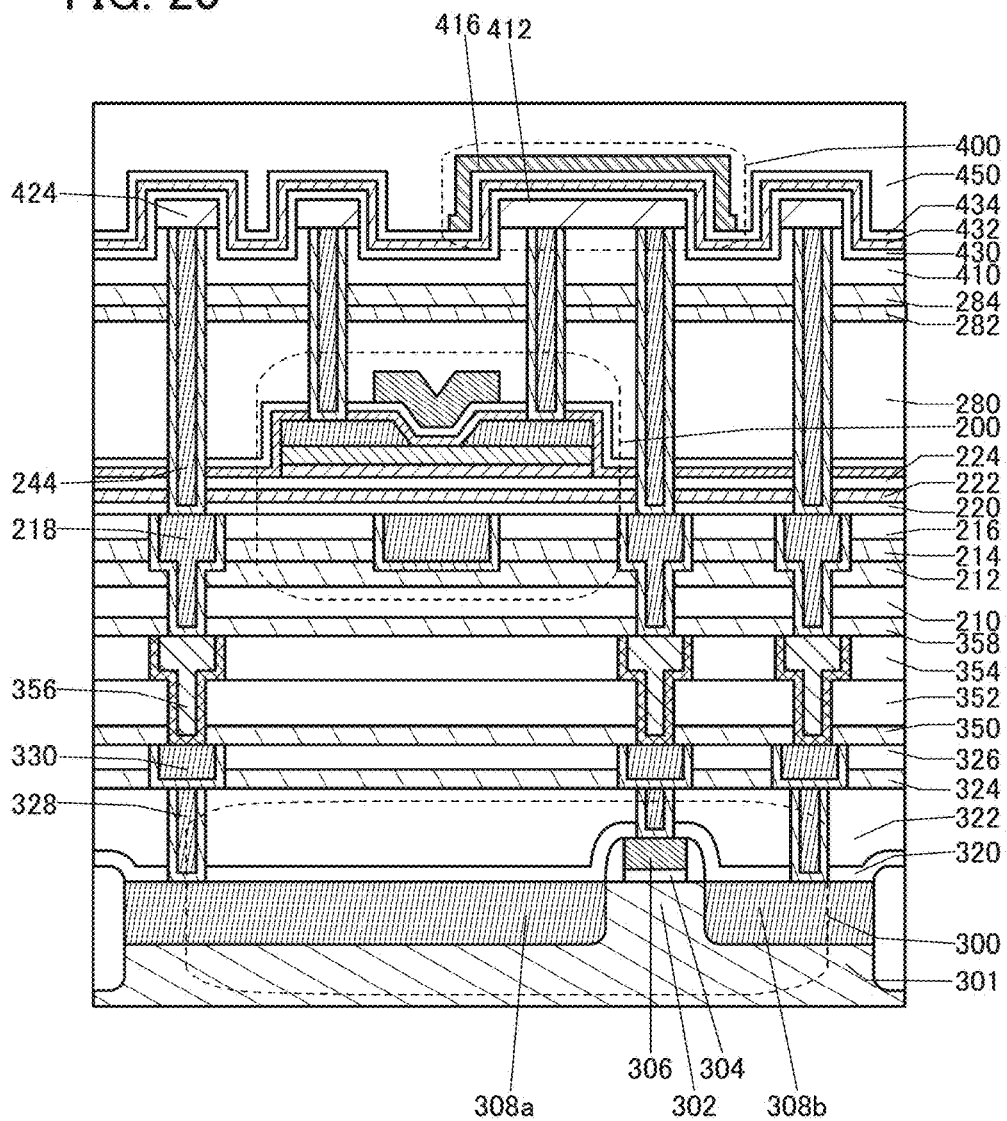
FIG. 20 is a cross-sectional view illustrating a structure example of a semiconductor device.
Figure 21:
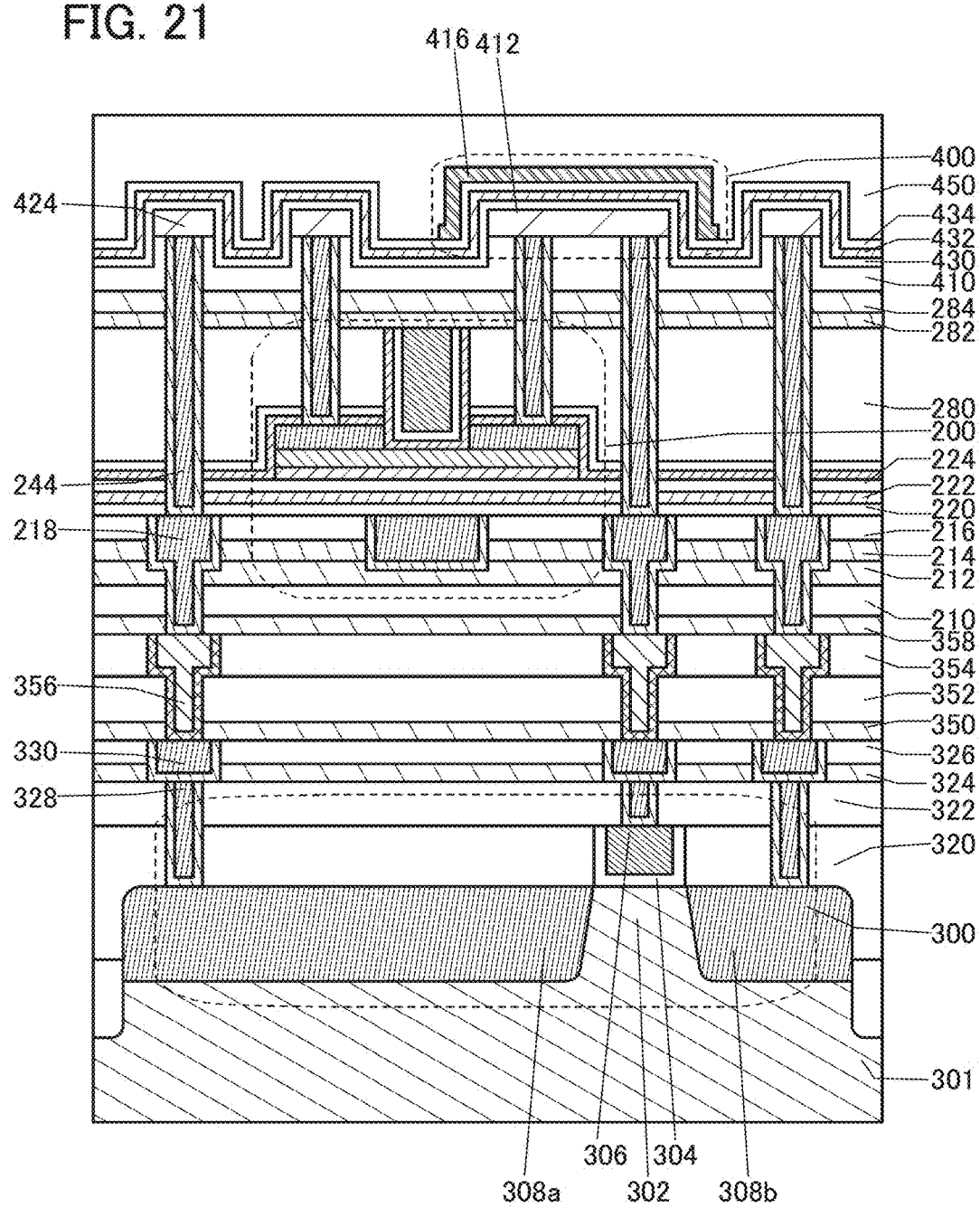
FIG. 21 is a cross-sectional view illustrating a structure example of a semiconductor device.
Figure 22A:
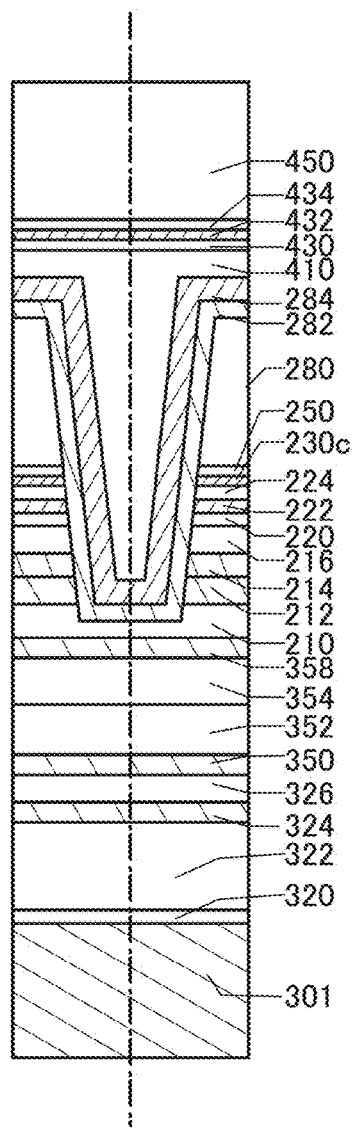
FIGS. 22A and 22B are cross-sectional views illustrating a structure example of a semiconductor device.
Figure 22B:
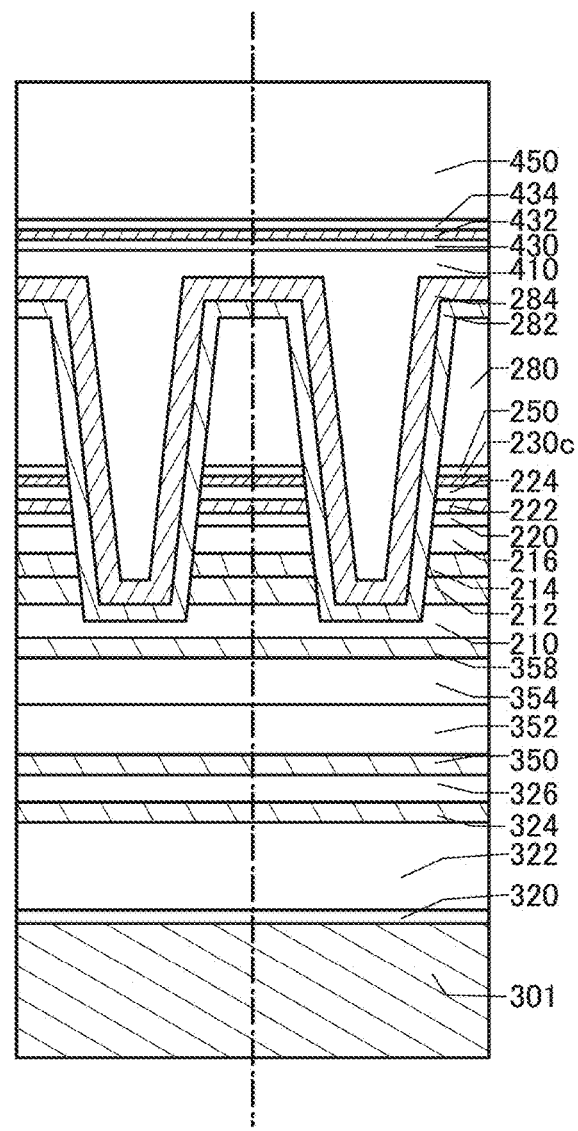

Examples of a semiconductor device of one embodiment of the present invention are illustrated in FIG. 20, FIG. 21, FIGS. 22A and 22B, and FIGS. 23A and 23B. FIGS. 22A and 22B illustrate end portions of regions where the semiconductor devices illustrated in FIG. 20 and FIG. 21 are formed.

<Structure of Semiconductor Device>

The semiconductor device of one embodiment of the present invention includes a transistor 300, the transistor 200, and a capacitor 400 as illustrated in FIG. 20. The transistor 200 is provided over the transistor 300, and the capacitor 400 is provided over the transistor 300 and the transistor 200.

The transistor 300 is provided over a substrate 301 and includes a conductor 306, an insulator 304, a semiconductor region 302 that is a part of the substrate 301, and low-resistance regions 308a and 308b functioning as a source region and a drain region.

The transistor 300 may be a p-channel transistor or an n-channel transistor.

It is preferable that a region of the semiconductor region 302 where a channel is formed, a region in the vicinity thereof, the low-resistance regions 308a and 308b functioning as a source region and a drain region, and the like contain silicon, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs, GaAlAs, or the like.

The low-resistance regions 308a and 308b contain an element which imparts n-type conductivity, such as arsenic or phosphorus, or an element which imparts p-type conductivity, such as boron, in addition to a semiconductor material used for the semiconductor region 302.

The conductor 306 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a stack including metal materials such as tungsten and aluminum as the conductor. In particular, tungsten is preferable in terms of heat resistance.

Note that the transistor 300 illustrated in FIG. 20 is just an example and is not limited to the structure illustrated therein; an appropriate transistor may be used in accordance with a circuit configuration or a driving method.

An insulator 320, an insulator 322, an insulator 324, and an insulator 326 are stacked sequentially and cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 functions as a planarization film for eliminating a level difference caused by the transistor 300 or the like underlying the insulator 322. A top surface of the insulator 322 may be planarized by planarization treatment using a chemical mechanical polishing (CMP) method or the like to increase the level of planarity.

The insulator 324 is preferably formed using, for example, a film having a barrier property that prevents hydrogen or impurities from diffusing from the substrate 301, the transistor 300, or the like into a region where the transistor 200 is formed.

As an example of the film having a barrier property against hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that suppresses hydrogen diffusion is preferably provided between the transistor 200 and the transistor 300. Specifically, the film that suppresses hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$ in TDS analysis in the range of 50° C. to 500° C., for example.

Note that the dielectric constant of the insulator 326 is preferably lower than that of the insulator 324. For example, the relative dielectric constant of the insulator 326 is preferably lower than 4, more preferably lower than 3. For example, the relative dielectric constant of the insulator 324 is preferably 0.7 times or less that of the insulator 326, more preferably 0.6 times or less that of the insulator 326. In the case where a material with a low dielectric constant is used as an interlayer film, the parasitic capacitance between wirings can be reduced.

A conductor 328, a conductor 330, and the like that are electrically connected to the capacitor 400 or the transistor 200 are embedded in the insulator 320, the insulator 322, the insulator 324, and the insulator 326. Note that the conductor 328 and the conductor 330 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

Furthermore, the conductor 328 and the conductor 330 preferably include a conductor having a barrier property against hydrogen. The conductor having a barrier property against hydrogen is formed particularly in an opening of the insulator 324 having a barrier property against hydrogen. In such a structure, the transistor 300 and the transistor 200 can be separated by a barrier layer, so that diffusion of hydrogen from the transistor 300 into the transistor 200 can be suppressed.

Note that as the conductor having a barrier property against hydrogen, tantalum nitride may be used, for example. By stacking tantalum nitride and tungsten, which has high conductivity, diffusion of hydrogen from the transistor 300 can be suppressed while the conductivity of a wiring is ensured. In this case, a tantalum nitride layer having a barrier property against hydrogen is preferably in contact with the insulator 324 having a barrier property against hydrogen.

A wiring layer may be provided over the insulator 326 and the conductor 330. For example, in FIG. 20, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to that used for forming the conductor 328 and the conductor 330.

In addition, the conductor 356 is preferably formed using a low-resistance conductive material such as aluminum or copper. The use of a low-resistance conductive material can reduce wiring resistance. Note that in the case where copper is used for the conductor 356, a conductor that suppresses diffusion of copper and the conductor 356 are preferably stacked. The conductor that suppresses diffusion of copper is preferably formed using, for example, tantalum, an alloy containing tantalum such as tantalum nitride, ruthenium, or an alloy containing ruthenium.

For example, the insulator 350 is preferably formed using an insulator that suppresses diffusion of copper or that has barrier properties against oxygen and hydrogen. For a film that suppresses diffusion of copper, silicon nitride can be used, for example. Therefore, the insulator 350 can be formed using a material similar to that used for forming the insulator 324.

It is particularly preferable that a conductor that suppresses diffusion of copper be provided in an opening included in the insulator 350 that suppresses diffusion of copper, and copper be stacked over the conductor that suppresses diffusion of copper. This structure can suppress diffusion of copper into the vicinity of a wiring.

An insulator 358, an insulator 210, an insulator 212, and an insulator 214 are stacked sequentially over the insulator 354. A substance that suppresses diffusion of copper or that has barrier properties against oxygen and hydrogen is preferably used for one or all of the insulator 358, the insulator 210, the insulator 212, and the insulator 214.

The insulator 358 and the insulator 212 are preferably formed using, for example, a film that suppresses diffusion of copper from a region where the substrate 301 or the transistor 300 is formed or the like into a region where the transistor 200 is formed, or a film having a barrier property that suppresses diffusion of hydrogen or impurities from the region where the substrate 301 or the transistor 300 is formed or the like into the region where the transistor 200 is formed. Therefore, the insulator 358 and the insulator 212 can be formed using a material similar to that used for forming the insulator 324.

The insulator 210 can be formed using a material similar to that used for forming the insulator 320. For example, a silicon oxide film, a silicon oxynitride film, or the like can be used as the insulator 210.

As the insulator 214, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from the oxide semiconductor in the transistor 200 can be suppressed. Therefore, aluminum oxide is suitably used as a protective film for the transistor 200.

An insulator 216 is provided over the insulator 214. The insulator 216 can be formed using a material similar to that used for forming the insulator 320. For example, a silicon oxide film, a silicon oxynitride film, or the like can be used as the insulator 216.

A conductor 218 and the like are embedded in the insulator 358, the insulator 210, the insulator 212, the insulator 214, and the insulator 216. Note that the conductor 218 functions as a plug or a wiring that is electrically connected to the capacitor 400 or the transistor 300. The conductor 218 can be formed using a material similar to that used for forming the conductor 328 and the conductor 330.

In particular, the conductor 218 in a region in contact with the insulator 358, the insulator 212, and the insulator 214 is preferably a conductor that suppresses diffusion of copper or that has barrier properties against oxygen, hydrogen, and water. In such a structure, the transistor 300 and the transistor 200 can be completely separated by a layer that suppresses diffusion of copper or that has barrier properties against oxygen, hydrogen, and water. That is, diffusion of copper from the conductor 356 or diffusion of hydrogen from the transistor 300 into the transistor 200 can be suppressed.

The transistor 200 and the insulator 280 are provided over the insulator 214. Note that the transistor 200 illustrated in FIG. 20 is just an example and is not limited to the structure illustrated therein; an appropriate transistor may be used in accordance with a circuit configuration or a driving method.

An insulator 282, an insulator 284, and an insulator 410 are stacked sequentially over the insulator 280. A conductor 244 and the like are embedded in the insulator 220, the insulator 222, the insulator 224, the insulator 280, the insulator 282, the insulator 284, and the insulator 410. Note that the conductor 244 functions as a plug or a wiring that is electrically connected to the capacitor 400, the transistor 200, or the transistor 300. The conductor 244 can be formed using a material similar to that used for forming the conductor 328 and the conductor 330.

Note that a substance having barrier properties against oxygen and hydrogen is preferably used for one or both of the insulator 282 and the insulator 284. Thus, the insulator 282 can be formed using a material similar to that used for forming the insulator 214. The insulator 284 can be formed using a material similar to that used for forming the insulator 212. The insulator 410 can be formed using an insulator similar to that of the insulator 210.

As the insulator 282, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from the oxide semiconductor in the transistor 200 can be suppressed. Therefore, aluminum oxide is suitably used as a protective film for the transistor 200.

The insulator 284 is preferably formed using, for example, a film having a barrier property that prevents hydrogen or impurities from diffusing from a region where the capacitor 400 is formed into a region where the transistor 200 is formed. Therefore, the insulator 284 can be formed using a material similar to that used for forming the insulator 324.

As an example of the film having a barrier property against hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that suppresses hydrogen diffusion is preferably provided between the transistor 200 and the transistor 300. Specifically, the film that suppresses hydrogen diffusion is a film from which hydrogen is less likely to be released.

Therefore, a structure can be obtained in which the transistor 200 and the insulator 280 including the excess-oxygen region are positioned between a stacked-layer structure of the insulator 210, the insulator 212, and the insulator 214 and a stacked-layer structure of the insulator 282, the insulator 284, and the insulator 410. The insulator 212, the insulator 214, the insulator 282, and the insulator 284 have a barrier property that suppresses diffusion of oxygen or impurities such as hydrogen and water.

Oxygen released from the insulator 280 and the transistor 200 can be prevented from diffusing into the layer where the capacitor 400 is formed or the layer where the transistor 300 is formed. Furthermore, impurities such as hydrogen and water can be prevented from diffusing from a layer over the insulator 282 and a layer under the insulator 214 into the transistor 200.

That is, oxygen can be efficiently supplied from the excess-oxygen region of the insulator 280 to the oxide semiconductor in the transistor 200, so that oxygen vacancies can be reduced. Moreover, oxygen vacancies can be prevented from being formed by impurities in the oxide semiconductor in the transistor 200. Thus, the oxide semiconductor in the transistor 200 can be an oxide semiconductor with a low density of defect states and stable characteristics. That is, a change in electrical characteristics of the transistor 200 can be suppressed and the reliability can be improved.

FIGS. 22A and 22B are each a cross-sectional view in the vicinity of a scribe line.

For example, as illustrated in FIG. 22A, an opening is provided in the insulator 212, the insulator 214, the insulator 216, the insulator 220, the insulator 222, the insulator 224, and the insulator 280 in the vicinity of a region overlapping with a scribe line (shown by the dashed-dotted line in FIG. 22A) formed in an edge of a memory cell including the transistor 200. The insulator 282 and the insulator 284 are provided to cover the side surfaces of the insulator 212, the insulator 214, the insulator 216, the insulator 220, the insulator 222, the insulator 224, and the insulator 280. Therefore, in the opening, the insulator 282 is in contact with the insulator 212 and the insulator 214. At this time, by forming the insulator 214 and the insulator 282 using the same material and the same method, adhesion therebetween can be increased.

In the structure, the transistor 200 and the insulator 280 can be enclosed with the insulator 212, the insulator 214, the insulator 282, and the insulator 284. The insulator 212, the insulator 214, the insulator 282, and the insulator 284 have a function of suppressing diffusion of oxygen, hydrogen, and water, and therefore, entry and diffusion of hydrogen or water from the side surfaces of the transistor 200 and the insulator 280 into the transistor 200 can be prevented even when the semiconductor device described in this embodiment is subjected to scribing.

Furthermore, in the structure, excess oxygen in the insulator 280 can be prevented from diffusing into the outside of the insulator 282 and the insulator 214. Accordingly, excess oxygen in the insulator 280 is efficiently supplied to the oxide semiconductor in the transistor 200. The oxygen can reduce oxygen vacancies in the oxide semiconductor in the transistor 200. Thus, the oxide semiconductor in the transistor 200 can be an oxide semiconductor with a low density of defect states and stable characteristics. That is, a change in electrical characteristics of the transistor 200 can be suppressed and the reliability can be improved.

In another example, as illustrated in FIG. 22B, openings may be provided in the insulator 212, the insulator 214, the insulator 216, the insulator 220, the insulator 222, the insulator 224, and the insulator 280 so that a scribe line (shown by the dashed-dotted line in FIG. 22B) is positioned between the openings. When the plurality of openings are formed, the transistor 200 can be enclosed tightly. Thus, the oxide semiconductor in the transistor 200 can be an oxide semiconductor with a low density of defect states and stable characteristics. That is, a change in electrical characteristics of the transistor 200 can be suppressed and the reliability can be improved.

FIG. 20 is described again. The capacitor 400 and a conductor 424 are provided over the insulator 410. The capacitor 400 is provided over the insulator 410 and includes a conductor 412, an insulator 430, an insulator 432, an insulator 434, and a conductor 416. Note that the conductor 424 functions as a plug or a wiring that is electrically connected to the capacitor 400, the transistor 200, or the transistor 300.

The conductor 412 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 412 is formed concurrently with another component such as a conductor, copper, aluminum, or the like which is a low-resistance metal material may be used.

Note that the conductor 424 can be formed using a material similar to that used for forming the conductor 412 functioning as an electrode of the capacitor.

The insulator 430, the insulator 432, and the insulator 434 are provided over the conductor 424 and the conductor 412. The insulator 430, the insulator 432, and the insulator 434 can be formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride. Although a three-layer structure is illustrated in the drawings, a single-layer structure, a two-layer structure, or a stacked-layer structure of four or more layers may be used.

For example, a material with high dielectric strength such as silicon oxynitride is preferably used for the insulator 430 and the insulator 434. Furthermore, a high dielectric constant (high-k) material such as aluminum oxide is preferably used for the insulator 432. In the capacitor 400 having the structure, a sufficient capacitance can be provided because of a high dielectric constant (high-k) insulator, and the dielectric strength can be increased and the electrostatic breakdown can be suppressed because of an insulator with high dielectric strength.

The conductor 416 is provided over the conductor 412 with the insulator 430, the insulator 432, and the insulator 434 provided therebetween. Note that the conductor 416 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 416 is formed concurrently with another component such as a conductor, copper, aluminum, or the like which is a low-resistance metal material may be used.

For example, as illustrated in FIG. 20, the insulator 430, the insulator 432, and the insulator 434 are provided to cover the top surface and the side surfaces of the conductor 412. Furthermore, the conductor 416 is provided to cover the top surface and the side surfaces of the conductor 412 with the insulator 430, the insulator 432, and the insulator 434 provided therebetween.

That is, a capacitance is formed also on the side surfaces of the conductor 412, so that a capacitance per projected area of a capacitor can be increased. Thus, the semiconductor device can be reduced in area, highly integrated, and miniaturized.

An insulator 450 is provided over the conductor 416 and the insulator 434. The insulator 450 can be formed using a material similar to that used for forming the insulator 320. The insulator 450 covering the capacitor 400 may function as a planarization film that covers a roughness thereunder.

The above is the description of the structure example. With the use of the structure, a change in electrical characteristics can be suppressed and reliability can be improved in a semiconductor device including an OS transistor. Furthermore, an OS transistor with a high on-state current can be provided. Furthermore, an OS transistor with a low off-state current can be provided. Furthermore, a semiconductor device with low power consumption can be provided.

Modification Example 1

FIG. 21 illustrates a modification example of this embodiment. FIG. 21 is different from FIG. 20 in the structures of the transistor 300 and the transistor 200.

In the transistor 300 illustrated in FIG. 21, the semiconductor region 302 (part of the substrate 301) in which a channel is formed includes a projection. Furthermore, the conductor 306 is provided to cover side surfaces and a top surface of the semiconductor region 302 with the insulator 304 provided therebetween (see FIG. 23B). Note that the conductor 306 may be formed using a material for adjusting the work function. The transistor 300 having such a structure is also referred to as a FIN transistor because the projection of the semiconductor substrate is utilized. An insulator functioning as a mask for forming the projection may be provided in contact with a top surface of the projection. Although the case where the projection is formed by processing part of the semiconductor substrate is described here, a semiconductor film having a projection may be formed by processing an SOI substrate.

The transistor 200 illustrated in FIG. 21 has the structure described with reference to FIGS. 18A to 18C. The oxide semiconductor 230c, the insulator 250, and the conductor 260 which are illustrated in FIGS. 18B and 18C are formed in an opening formed in the insulator 280. Since the transistor 200 illustrated in FIG. 21 has a structure in which the conductors 240a and 240b hardly overlap with the conductor 260, the parasitic capacitance added to the conductor 260 can be reduced. Thus, the transistor 200 with a high operation frequency can be provided.

Modification Example 2

Figure 23B:
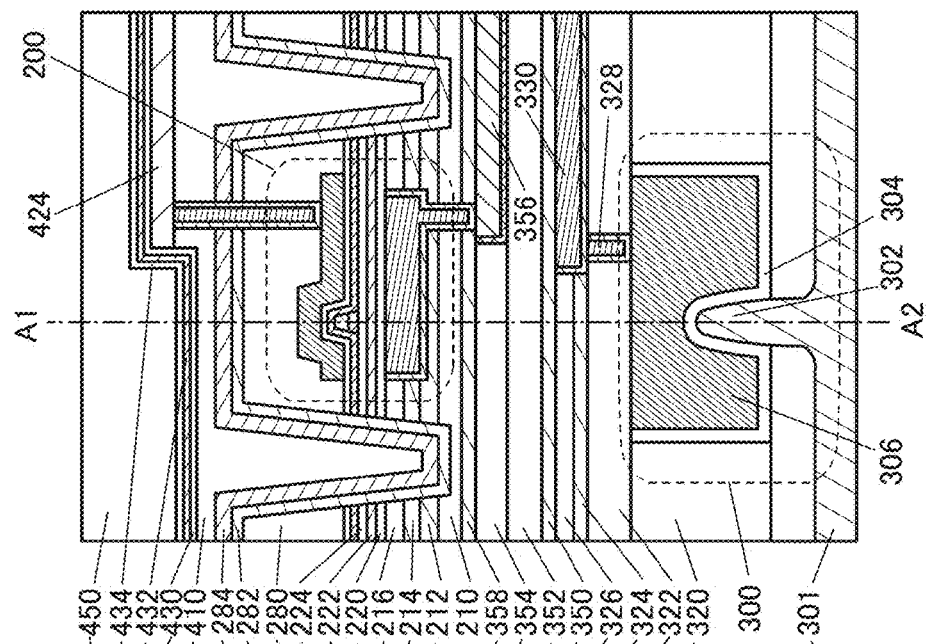
FIGS. 23A and 23B are cross-sectional views illustrating a structure example of a semiconductor device.
Figure 23A:
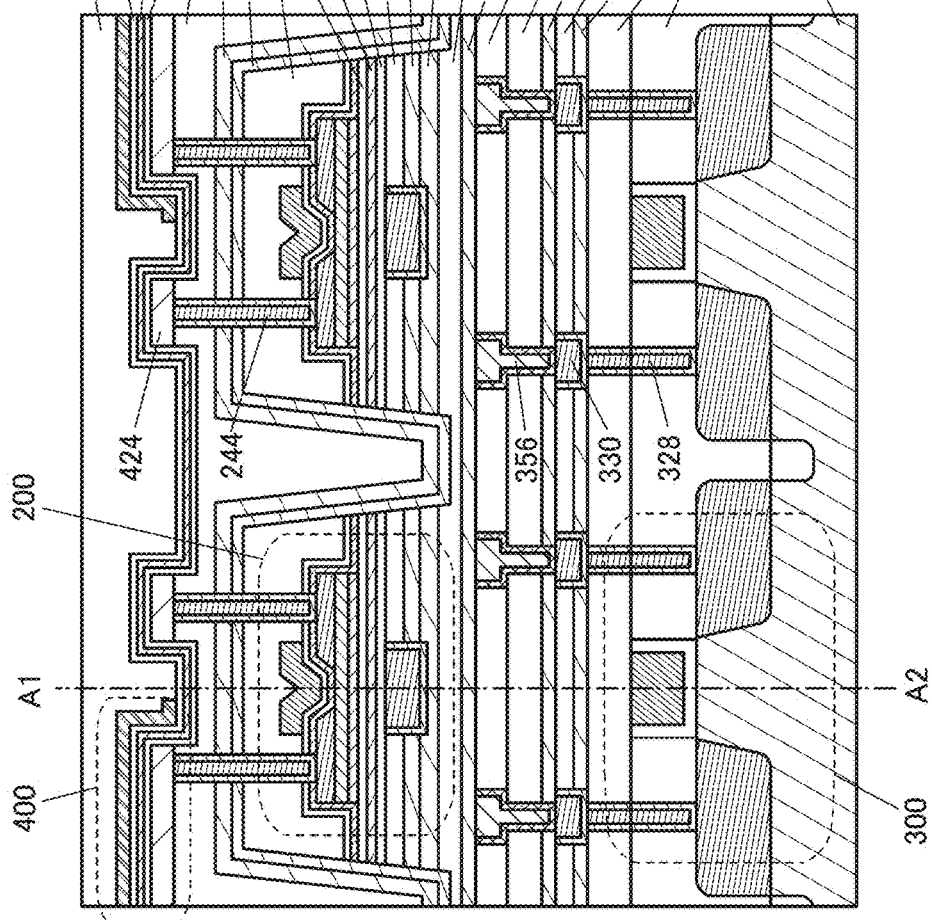

FIGS. 23A and 23B are cross-sectional views of a semiconductor device of one embodiment of the present invention. FIG. 23A is a cross-sectional view of the transistor 200 and the transistor 300 in the channel length direction, and FIG. 23B is a cross-sectional view of the transistor 200 and the transistor 300 in the channel width direction.

In the semiconductor device illustrated in FIGS. 23A and 23B, a groove is provided in the insulator 280 to surround the transistor 200. Because of this groove, the transistor 200 is surrounded by the insulator 284 and the insulator 282. The transistor 200 is surrounded by the insulator including the insulator 212, the insulator 214, the insulator 282, and the insulator 284 in the upward/downward, forward/backward, and leftward/rightward directions. With such a structure, hydrogen and oxygen from various directions can be prevented from diffusing into the transistor 200. As a result, the semiconductor device illustrated in FIGS. 23A and 23B can have high reliability.

Embodiment 5

In this embodiment, a structure of an oxide semiconductor of one embodiment of the present invention is described.
<Structure of Oxide Semiconductor>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is one of oxide semiconductors having a plurality of c-axis aligned crystal parts (also referred to as pellets).

Figure 24A:
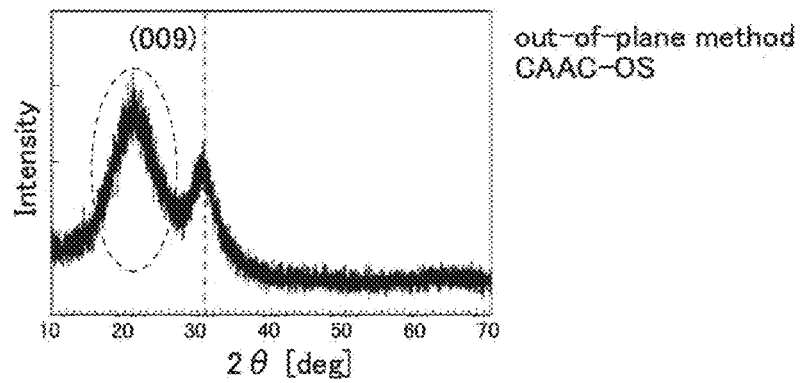
FIGS. 24A to 24E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 24A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure classified into the space group Fd-3m. Therefore, it is preferred that the CAAC-OS do not show the peak at a 2θ of around 36°.

Figure 24B:
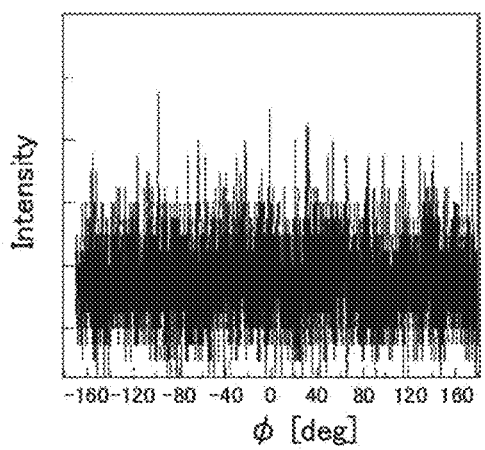
Figure 24C:
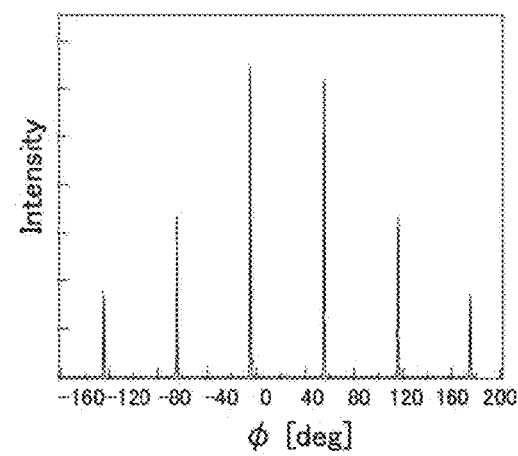

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (ϕ scan) is performed with 2θ fixed at around 56° and with the sample rotated using a normal vector to the sample surface as an axis (ϕ axis), as shown in FIG. 24B, a peak is not clearly observed. In contrast, in the case where single crystal InGaZnO$_4$ is subjected to ϕ scan with 2θ fixed at around 56°, as shown in FIG. 24C, six peaks which are derived from crystal planes equivalent to the (110) plane are observed. Accordingly, the structural analysis using XRD shows that the directions of a-axes and b-axes are irregularly oriented in the CAAC-OS.

Figure 24D:
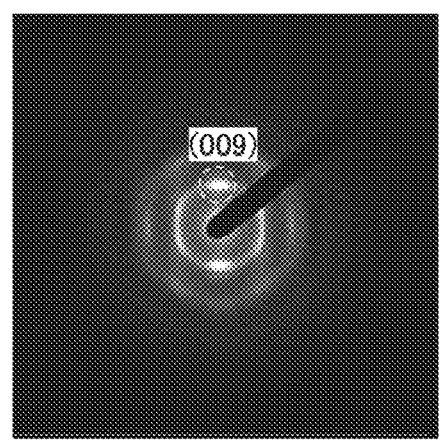
Figure 24E:
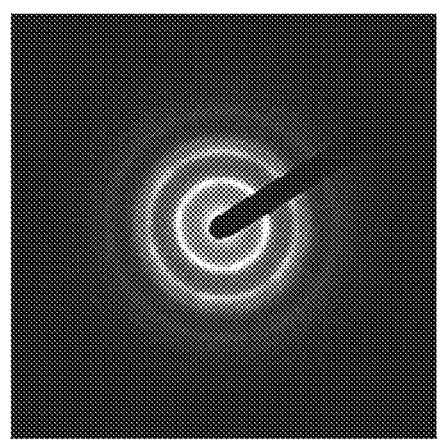

Next, a CAAC-OS analyzed by electron diffraction will be described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 24D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 24E shows a diffraction pattern obtained in such a manner that an electron beam with a probe diameter of 300 nm is incident on the same sample in a direction perpendicular to the sample surface. As shown in FIG. 24E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 24E is considered to be derived from the (010) plane, the (100) plane, and the like of the InGaZnO$_4$ crystal. The second ring in FIG. 24E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 25A:
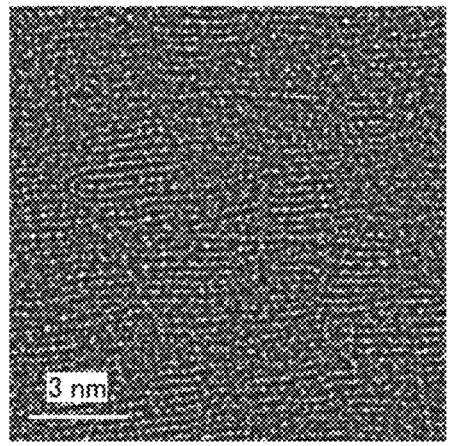
FIGS. 25A to 25E show a cross-sectional TEM image and plan-view TEM images of a CAAC-OS and images obtained through analysis thereof.

FIG. 25A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 25A shows pellets in which metal atoms are arranged in a layered manner. FIG. 25A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 25B:
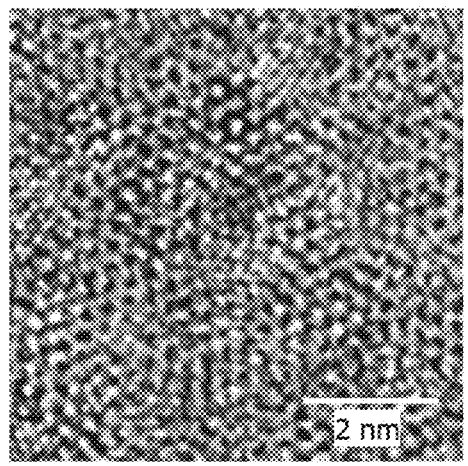
Figure 25C:
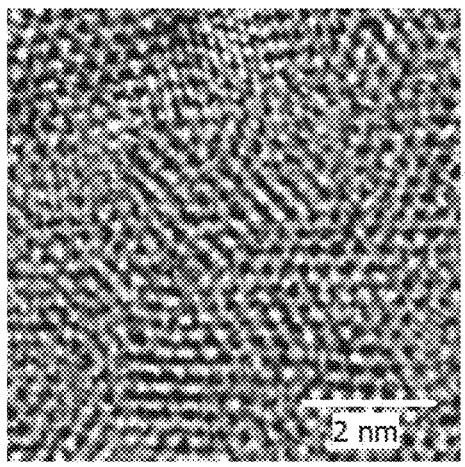
Figure 25D:
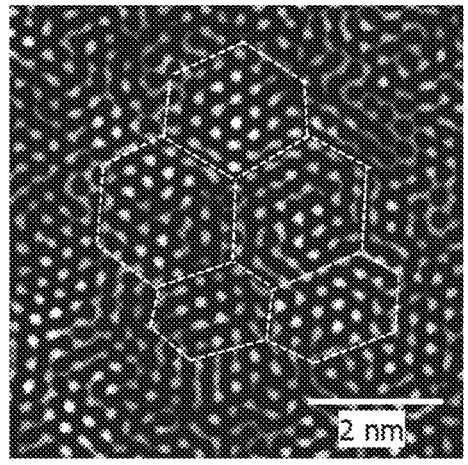
Figure 25E:
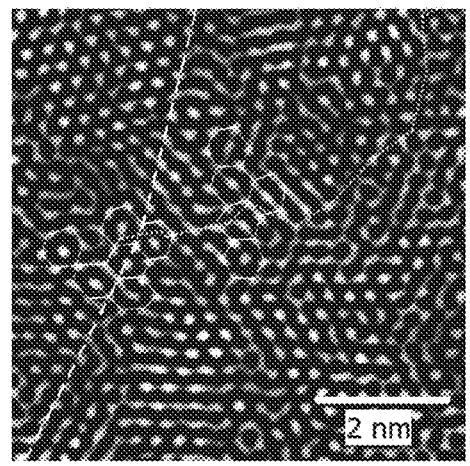

FIGS. 25B and 25C show Cs-corrected high-resolution TEM images of a plane of the CAAC-OS observed from a direction substantially perpendicular to the sample surface. FIGS. 25D and 25E are images obtained through image processing of FIGS. 25B and 25C. The method of image processing is as follows. The image in FIG. 25B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 25D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 25E, a dotted line denotes a portion where the direction of a lattice arrangement changes between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. For example, oxygen vacancy in the oxide semiconductor might serve as a carrier trap or serve as a carrier generation source when hydrogen is captured therein.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 26A:
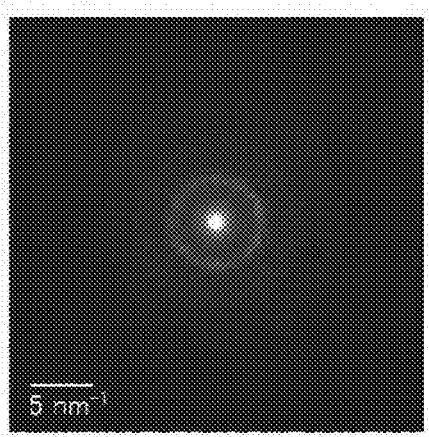
FIGS. 26A to 26D show electron diffraction patterns and a cross-sectional TEM image of an nc-OS.
Figure 26B:
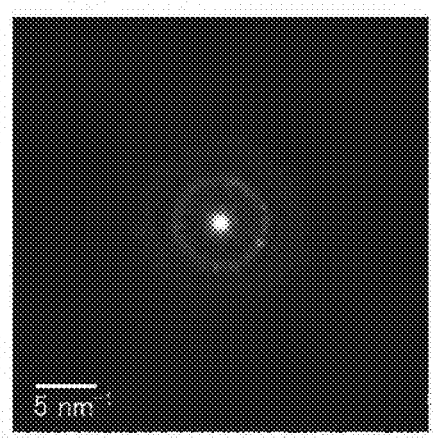

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 26A is observed. FIG. 26B shows a diffraction pattern obtained when an electron beam with a probe diameter of 1 nm is incident on the same sample. As shown in FIG. 26B, a plurality of spots are observed in a ring-like region. In other words, ordering in an nc-OS is not observed with an electron beam with a probe diameter of 50 nm but is observed with an electron beam with a probe diameter of 1 nm.

Figure 26C:
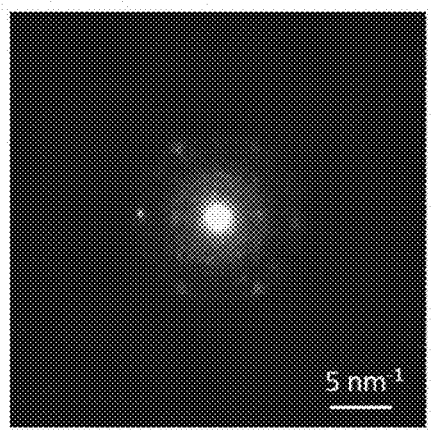

Furthermore, an electron diffraction pattern in which spots are arranged in an approximately regular hexagonal shape is observed in some cases as shown in FIG. 26C when an electron beam with a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 26D:
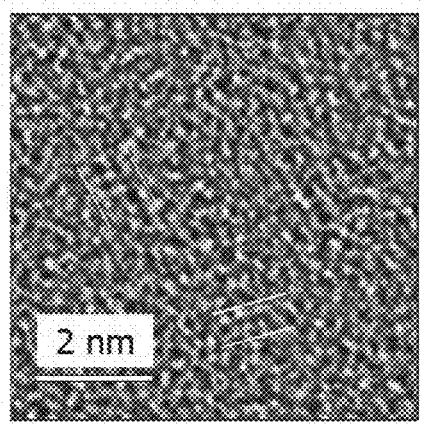

FIG. 26D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 26D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure between those of the nc-OS and the amorphous oxide semiconductor.

FIGS. 27A and 27B are high-resolution cross-sectional TEM images of an a-like OS. FIG. 27A is the high-resolution cross-sectional TEM image of the a-like OS at the start of the electron irradiation. FIG. 27B is the high-resolution cross-sectional TEM image of the a-like OS after the electron (e$^-$) irradiation at $4.3 \times 10^8$ e$^-$/nm$^2$. FIGS. 27A and 27B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 28:
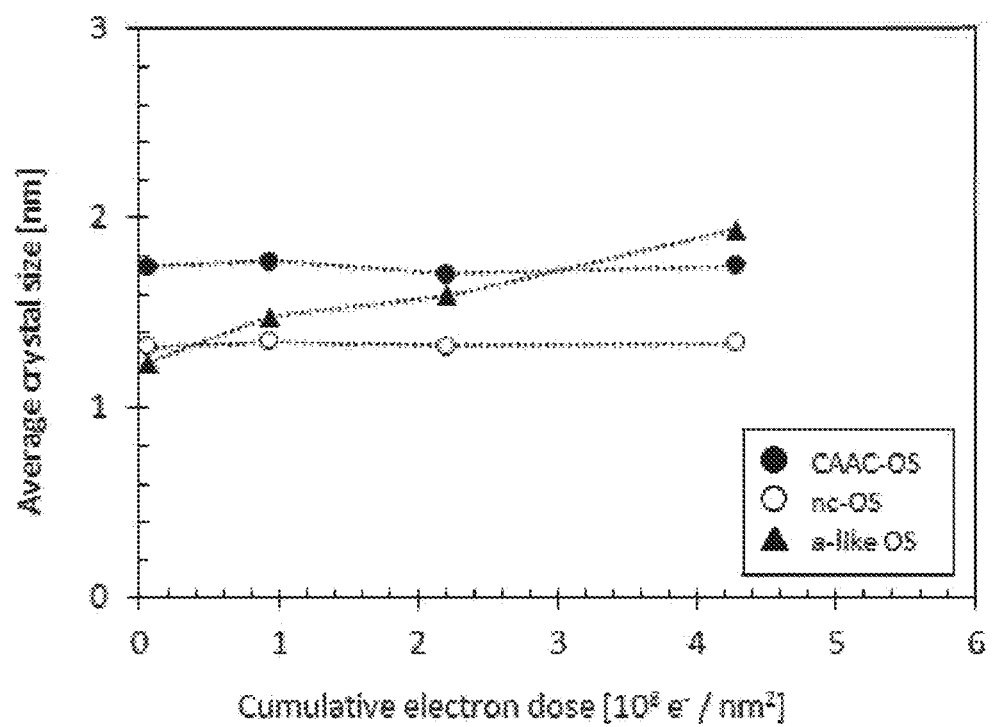
FIG. 28 shows a change in crystal part of an In—Ga—Zn oxide induced by electron irradiation.

FIG. 28 shows change in the average size of crystal parts (at 22 points to 30 points) in each sample. Note that the crystal part size corresponds to the length of a lattice fringe. FIG. 28 indicates that the crystal part size in the a-like OS increases with an increase in the cumulative electron dose in obtaining TEM images, for example. As shown in FIG. 28, a crystal part of approximately 1.2 nm (also referred to as an initial nucleus) at the start of TEM observation grows to a size of approximately 1.9 nm at a cumulative electron (e$^-$) dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. As shown in FIG. 28, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e$^-$/(nm$^2$·s); and the diameter of the irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stacked film including two or more films of an amorphous oxide semiconductor, an a-like OS, an nc-OS, and a CAAC-OS, for example.

Embodiment 6

In this embodiment, a CPU in which the semiconductor device or memory device described in any of the above embodiments can be used will be described.

Figure 29:
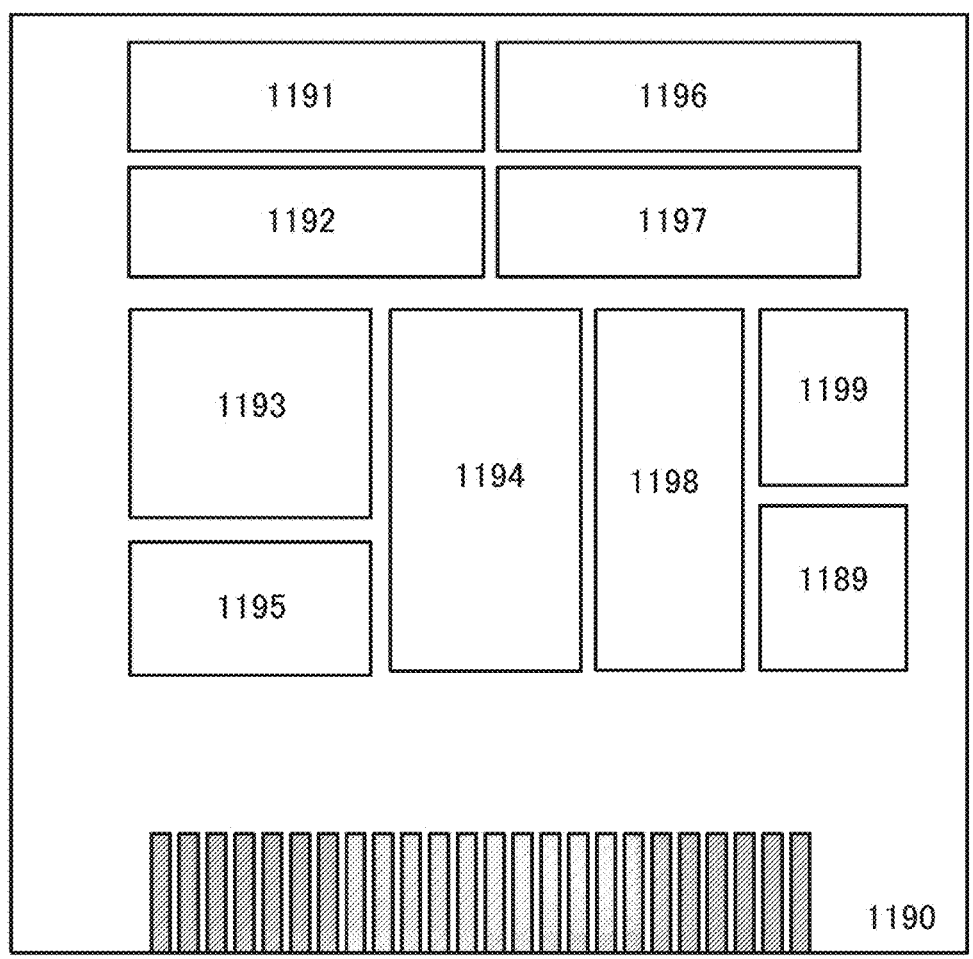
FIG. 29 is a block diagram illustrating a CPU configuration example.

FIG. 29 is a block diagram illustrating a configuration example of a CPU. The CPU illustrated in FIG. 29 includes an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 29 is just an example in which the configuration has been simplified, and an actual CPU may have a variety of configurations depending on the application. For example, the CPU may have the following configuration: a structure including the CPU illustrated in FIG. 29 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 29, a memory cell is provided in the register 1196. For the memory cell of the register 1196, the semiconductor device or memory device described in any of the above embodiments can be used.

In the CPU illustrated in FIG. 29, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped. As a result, the power consumption of the CPU can be reduced.

Embodiment 7

In this embodiment, a programmable logic device (PLD) that can be formed using the memory device or semiconductor device described in any of the above embodiments will be described.

A PLD has a structure in which adequate-scale logic circuits (logic blocks, or programmable logic elements) are electrically connected to each other by a routing resource, and the functions of the logic blocks and the connection between the logic blocks can be changed after manufacture. The functions of the logic blocks and the connection between the logic blocks formed using a routing resource are defined by configuration data, and the configuration data is stored in a register included in each logic block or a register included in the routing resource. A register for storing configuration data is hereinafter referred to as a configuration memory.

Figure 30A:
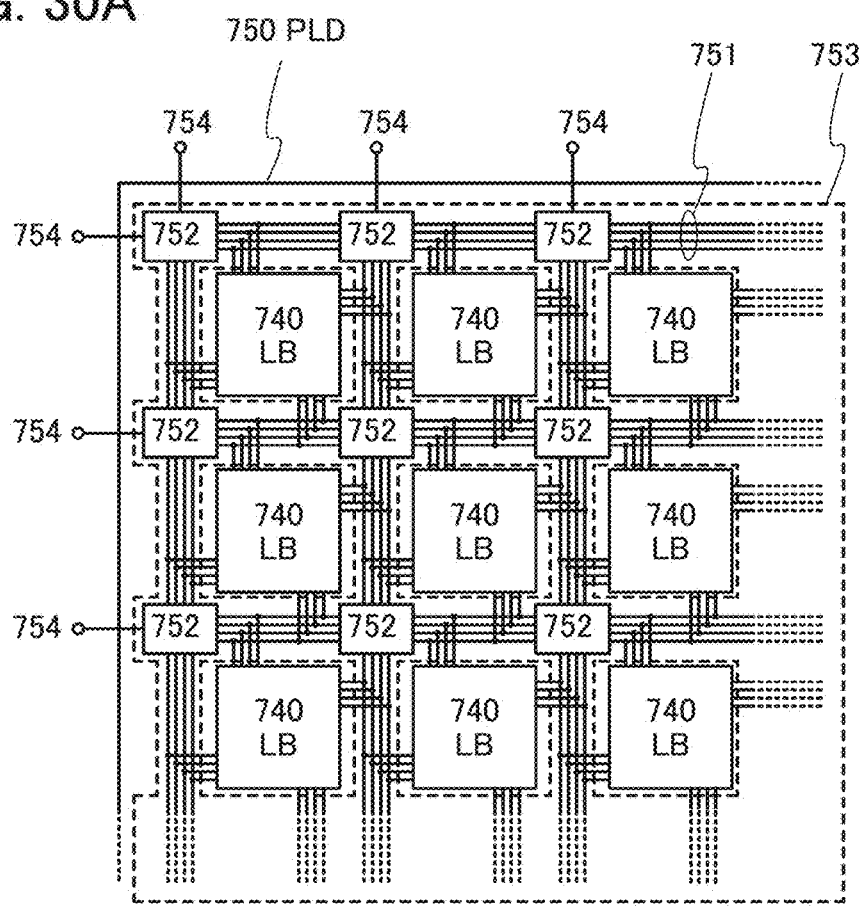
FIGS. 30A and 30B are a block diagram and a circuit diagram illustrating a configuration example of a PLD.

FIG. 30A schematically illustrates part of the structure of a PLD 750. The PLD 750 in FIG. 30A includes a plurality of logic blocks (LB) 740, a wiring group 751 connected to any of the plurality of logic blocks 740, and switch circuits 752 for controlling the connection between the wirings of the wiring group 751. The wiring group 751 and the switch circuits 752 correspond to a routing resource 753.

Figure 30B:
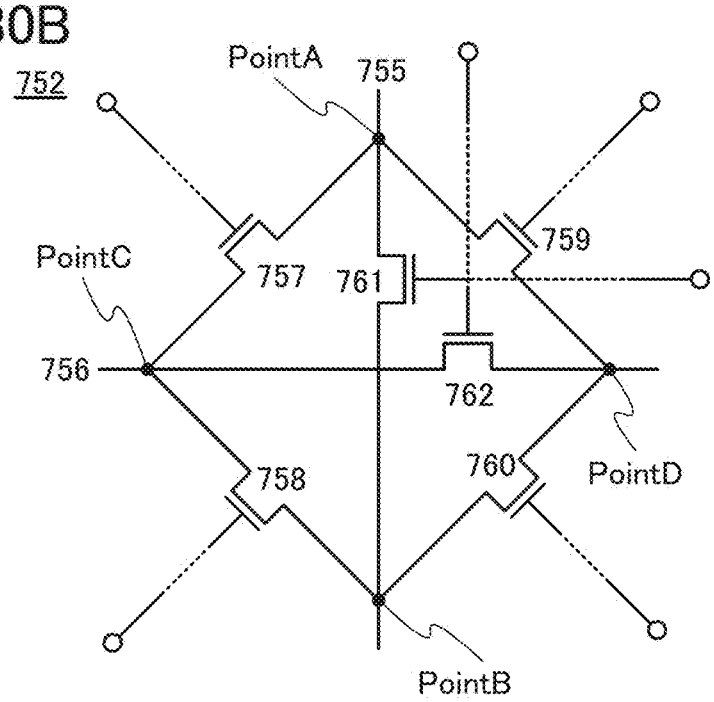

FIG. 30B illustrates a configuration example of the switch circuit 752. The switch circuit 752 in FIG. 30B has a function of controlling connection between a wiring 755 and a wiring 756 included in the wiring group 751. Specifically, the switch circuit 752 includes transistors 757 to 762.

The transistor 757 has a function of controlling electrical connection between a point A of the wiring 755 and a point C of the wiring 756. The transistor 758 has a function of controlling electrical connection between a point B of the wiring 755 and the point C of the wiring 756. The transistor 759 has a function of controlling electrical connection between the point A of the wiring 755 and a point D of the wiring 756. The transistor 760 has a function of controlling electrical connection between the point B of the wiring 755 and the point D of the wiring 756. The transistor 761 has a function of controlling electrical connection between the point A and the point B of the wiring 755. The transistor 762 has a function of controlling electrical connection between the point C and the point D of the wiring 756.

The switch circuits 752 also have a function of controlling electrical connection between the wiring group 751 and terminals 754 of the PLD 750.

Figure 31A:
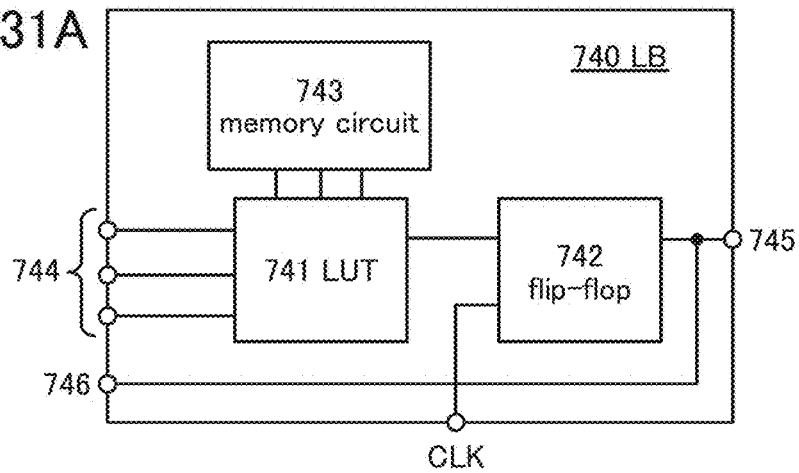
FIGS. 31A to 31C are block diagrams each illustrating a configuration example of a logic block.

FIG. 31A illustrates one mode of the logic block 740. The logic block 740 in FIG. 31A includes a look-up table (LUT) 741, a flip-flop 742, and a memory circuit 743. Logical operation of the LUT 741 is determined in accordance with configuration data in the memory circuit 743. Specifically, one output value of the LUT 741 with respect to input values of a plurality of input signals supplied to input terminals 744 is determined. Then, the LUT 741 outputs a signal including the output value. The flip-flop 742 holds the signal output from the LUT 741 and outputs an output signal corresponding to the signal from a first output terminal 745 and a second output terminal 746 in synchronization with a signal CLK.

Note that the logic block 740 may further include a multiplexer circuit. The multiplexer circuit can select whether the output signal from the LUT 741 goes through the flip-flop 742.

The type of the flip-flop 742 may be determined by configuration data. Specifically, the flip-flop 742 may have a function of any of a D flip-flop, a T flip-flop, a JK flip-flop, and an RS flip-flop, depending on the configuration data.

Figure 31B:
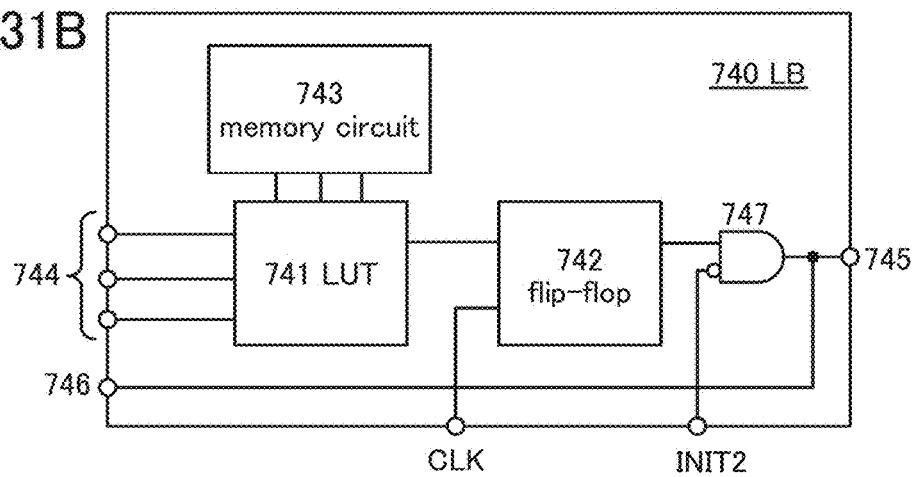

FIG. 31B illustrates another mode of the logic block 740. The logic block 740 in FIG. 31B has a structure in which an AND circuit 747 is added to the logic block 740 in FIG. 31A. To the AND circuit 747, a signal from the flip-flop 742 is supplied as a positive logic input, and the signal INIT2 is supplied as a negative logic input. With such a structure, the potential of a wiring to which a signal output from the logic block 740 is supplied can be initialized. Consequently, flow of a large amount of current between the logic blocks 740 can be prevented, so that breakage of the PLD can be prevented.

Figure 31C:
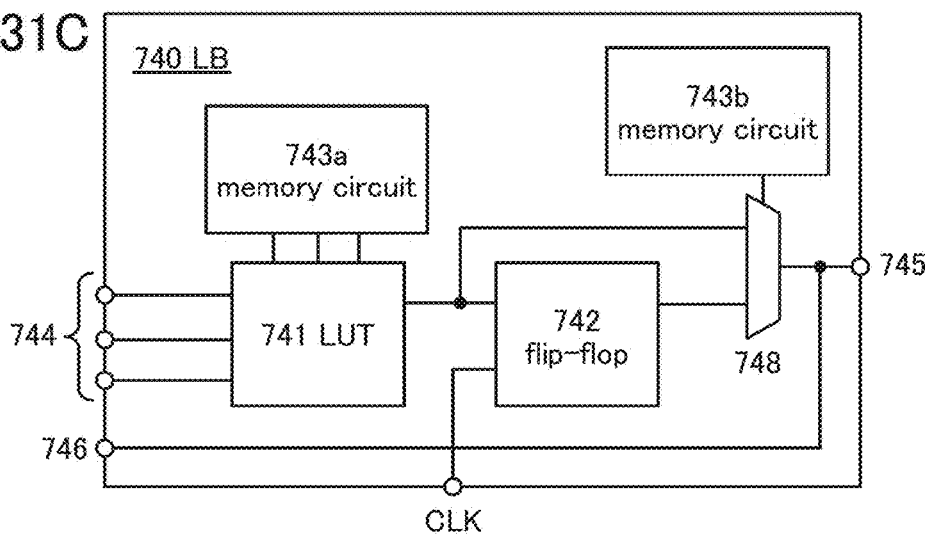

FIG. 31C illustrates another mode of the logic block 740. The logic block 740 in FIG. 31C has a structure in which a multiplexer 748 is added to the logic block 740 in FIG. 31A. The logic block 740 in FIG. 31C includes two memory circuits 743 (memory circuits 743*a* and 743*b*). Logical operation of the LUT 741 is determined in accordance with configuration data in the memory circuit 743*a*. A signal output from the LUT 741 and a signal output from the flip-flop 742 are input to the multiplexer 748. The multiplexer 748 has functions of selecting and outputting one of the two output signals in accordance with configuration data stored in the memory circuit 743*b*. The signal output from the multiplexer 748 is output from the first output terminal 745 and the second output terminal 746.

FIG. 32 illustrates an example of the entire structure of the PLD 750. In FIG. 32, I/O elements 770, phase lock loops (PLL) 771, a RAM 772, and a multiplier 773 are provided in the PLD 750. The I/O elements 770 function as interfaces that control input and output of signals from and to an external circuit of the PLD 750. The PLL 771 has a function of generating the signal CLK. The RAM 772 has a function of storing data used for logic operation. The multiplier 773 corresponds to a logic circuit for multiplication. When the PLD 750 has a function of executing multiplication, the multiplier 773 is not necessarily provided.

The memory circuit or flip-flop included in the logic block 740 can be formed using the semiconductor device or memory device described in any of the above embodiments. With the use of the semiconductor device or memory device described in any of the above embodiments, the logic block 740 can hold data even in a power-off state, leading to a reduction in power consumption.

Embodiment 8

The semiconductor device of one embodiment of the present invention can be used for vehicles such as an automobile, a motorcycle, and a bicycle, aircrafts, ships, and the like. The semiconductor device of one embodiment of the present invention can also be used for electronic devices such as a cellular phone, a wristwatch, a portable game machine, a portable data terminal, an e-book reader, a video camera, a digital still camera, and a goggle-type display (head-mounted display). FIGS. 33A to 33F illustrate specific examples of these electronic devices.

Figure 33A:
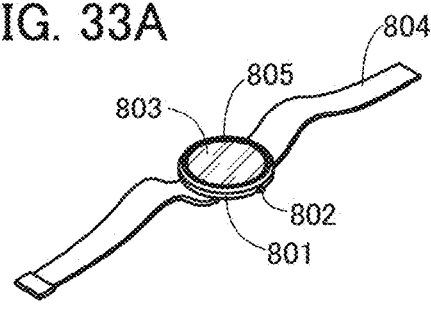
FIGS. 33A to 33F are perspective views illustrating examples of electronic devices.

FIG. 33A illustrates a wristwatch-type terminal, which includes a housing 801, a winder 802, a display portion 803, a belt 804, a sensor portion 805, and the like. The display portion 803 may include a touch panel. A user can input information by using finger touching the touch panel as a pointer.

The sensor portion 805 is configured to acquire information by measuring the surrounding state. For example, a camera, an acceleration sensor, a direction sensor, a pressure sensor, a temperature sensor, a humidity sensor, an illuminance sensor, or a global positioning system (GPS) signal receiving circuit can be used as the sensor portion 805.

For example, when an arithmetic device in the housing 801 determines that the ambient light level measured by an illuminance sensor of the sensor portion 805 is sufficiently higher than the predetermined illuminance, a reflective liquid crystal element is used as a display element of the display portion 803. In the case where the arithmetic device determines that it is dim, an organic EL element is used as a display element of the display portion 803. Thus, image information can be displayed in such a manner that, for example, a reflective display element is used in an environment with strong external light and a self-luminous display element is used in a dim environment. As a result, the power consumption of the electronic device can be reduced.

Figure 33B:
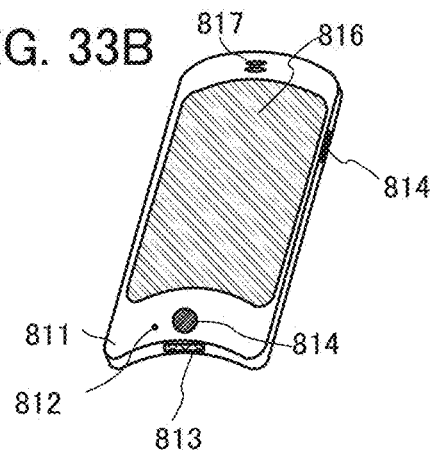

FIG. 33B illustrates a cellular phone, which includes a housing 811, a display portion 816, operation buttons 814, an external connection port 813, a speaker 817, a microphone 812, and the like. When the display portion 816 of the cellular phone illustrated in FIG. 33B is touched with a finger or the like, information can be input. Furthermore, operations such as making a call and inputting a character can be performed by touch on the display portion 816 with a finger or the like. The power can be turned on or off with the operation button 814. In addition, types of images displayed on the display portion 816 can be switched; for example, switching images from a mail creation screen to a main menu screen is performed with the operation button 814.

Figure 33C:
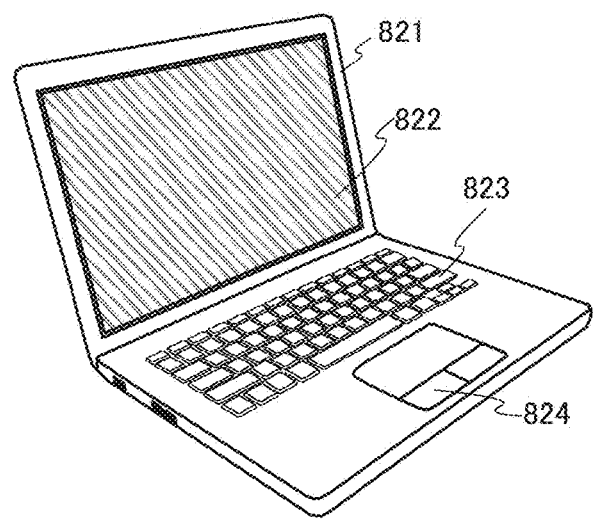

FIG. 33C illustrates a laptop personal computer, which includes a housing 821, a display portion 822, a keyboard 823, a pointing device 824, and the like.

Figure 33D:
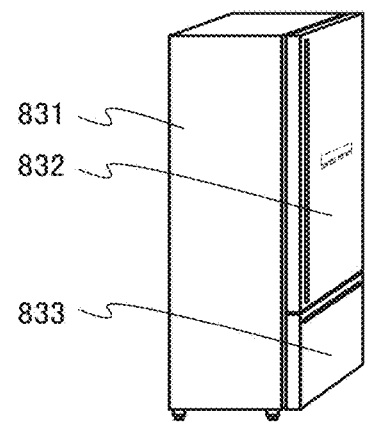

FIG. 33D illustrates an electric refrigerator-freezer, which includes a housing 831, a refrigerator door 832, a freezer door 833, and the like.

Figure 33E:
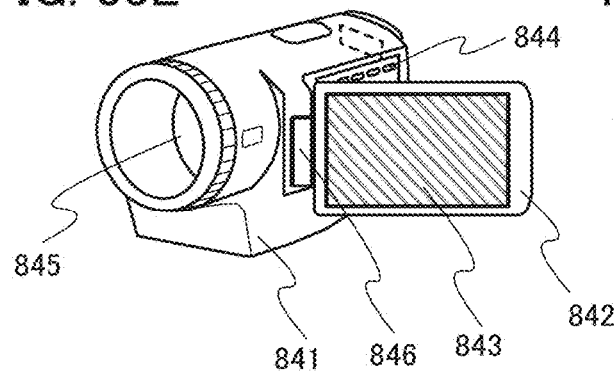

FIG. 33E illustrates a video camera, which includes a first housing 841, a second housing 842, a display portion 843, operation keys 844, a lens 845, a joint 846, and the like. The operation keys 844 and the lens 845 are provided for the first housing 841, and the display portion 843 is provided for the second housing 842. The first housing 841 and the second housing 842 are connected to each other with the joint 846, and the angle between the first housing 841 and the second housing 842 can be changed with the joint 846. Images displayed on the display portion 843 may be switched in accordance with the angle at the joint 846 between the first housing 841 and the second housing 842.

Figure 33F:
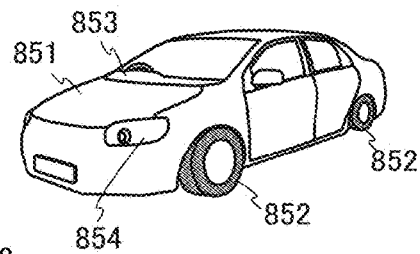
Figure 34A:
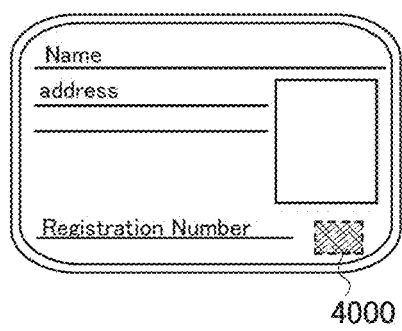
FIGS. 34A to 34F are perspective views illustrating application examples of RF tags.
Figure 34B:
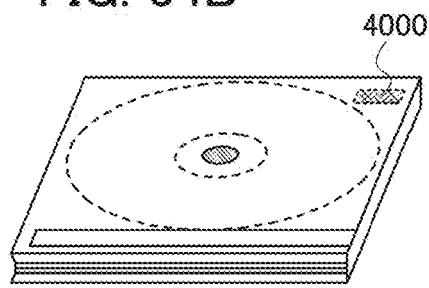
Figure 34C:
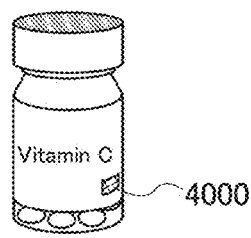
Figure 34D:
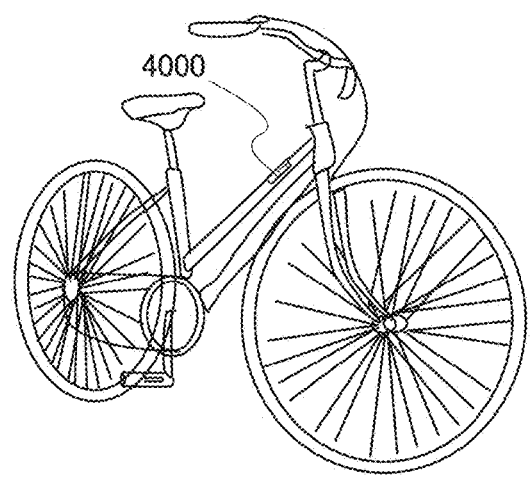
Figure 34E:
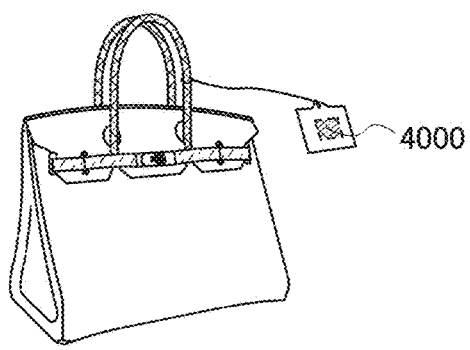
Figure 34F:
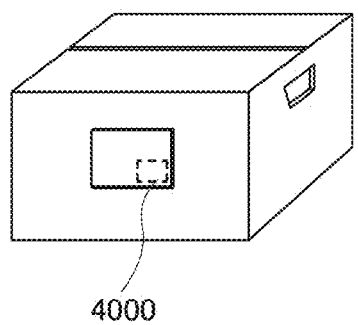

FIG. 33F illustrates an automobile, which includes a car body 851, wheels 852, a dashboard 853, lights 854, and the like.

Embodiment 9

In this embodiment, application examples of an RF tag that can include the semiconductor device of one embodiment of the present invention will be described with reference to FIGS. 34A to 34F. The RF tag is widely used and can be provided for, for example, products such as bills, coins, securities, bearer bonds, documents (e.g., driver's licenses or resident's cards, see FIG. 34A), recording media (e.g., DVD or video tapes, see FIG. 34B), packaging containers (e.g., wrapping paper or bottles, see FIG. 34C), vehicles (e.g., bicycles, see FIG. 34D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 34E and 34F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have a higher level of security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

In this specification and the like, ordinal numbers such as "first", "second", and "third" are used in order to avoid confusion among components. Thus, the terms do not limit the number or order of components. In this specification and the like, a "first" component in one embodiment can be referred to as a "second" component in other embodiments or claims. Furthermore, in this specification and the like, a "first" component in one embodiment can be referred to without the ordinal number in other embodiments or claims.

In this specification and the like, the term such as "electrode" or "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential". The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film", and the term "insulating film" can be changed into the term "insulating layer" in some cases.

In this specification and the like, a switch is in a conductive state (on state) or in a non-conductive state (off state) to determine whether current flows therethrough or not. Alternatively, a switch has a function of selecting and changing a current path. Examples of a switch include an electrical switch and a mechanical switch. That is, any element can be used as a switch as long as it can control current, without limitation to a certain element.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of a mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; or a control circuit) can be connected between X and Y. Note that, for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Example 1

In this example, the transistor 200 in FIGS. 14A to 14C was fabricated, and the transistor characteristics were measured. Transistors with channel lengths of 10 μm and 180 nm were fabricated, and it was found that the transistor with a channel length of 10 μm had low cutoff current.

The transistor 200 was fabricated over a Si wafer.

The insulator 216 was formed using a 120-nm-thick silicon oxide film. The silicon oxide film was formed by a PECVD method.

The conductor 205a was formed using a 5-nm-thick titanium nitride film. The titanium nitride film was formed by a CVD method.

The conductor 205b was formed using a tungsten film. The tungsten film was formed by a CVD method. After the tungsten film was formed, surfaces of the conductors 205a and 205b were planarized by CMP.

The insulator 220 was formed using a 10-nm-thick silicon oxynitride film. The silicon oxynitride film was formed by a PECVD method.

The insulator 222 was formed using a 20-nm-thick hafnium oxide film. The hafnium oxide film was formed by an ALD method.

The insulator 224 was formed using a 30-nm-thick silicon oxynitride film.

The silicon oxynitride film was formed by a PECVD method.

After the insulator 224 was formed, heat treatment at 550° C. was performed in an oxygen atmosphere for one hour.

The oxide semiconductor 230a was formed using a 40-nm-thick In—Ga—Zn oxide film. The oxide semiconductor 230a was formed by a DC sputtering method using a target of an In—Ga—Zn oxide containing In, Ga, and Zn at an atomic ratio of 1:3:4. The sputtering method was performed at a substrate temperature of 200° C. in a mixed gas of argon and oxygen.

The oxide semiconductor 230b was formed using a 20-nm-thick In—Ga—Zn oxide film. The oxide semiconductor 230b was formed by a DC sputtering method using a target of an In—Ga—Zn oxide containing In, Ga, and Zn at an atomic ratio of 1:1:1. The sputtering method was performed at a substrate temperature of 300° C. in a mixed gas of argon and oxygen. The oxide semiconductor 230b was formed using the CAAC-OS film described in the above embodiment.

After the oxide semiconductor 230b was formed, heat treatment at 550° C. was performed in a nitrogen atmosphere for one hour and in an oxygen atmosphere for one hour.

The conductors 240a and 240b were each formed using a 50-nm-thick tungsten film. The tungsten film was formed by a sputtering method.

The oxide semiconductor 230c was formed using a 5-nm-thick In—Ga—Zn oxide film. The oxide semiconductor 230c was formed by a DC sputtering method using a target of an In—Ga—Zn oxide containing In, Ga, and Zn at an atomic ratio of 1:3:2. The sputtering method was performed at a substrate temperature of 200° C. in a mixed gas of argon and oxygen.

The insulator 250 was formed using a 13-nm-thick silicon oxynitride film. The silicon oxynitride film was formed by a PECVD method.

The conductor 260 was formed using a stack including a 30-nm-thick titanium nitride film and a 135-nm-thick tungsten film. The titanium nitride film and the tungsten film were formed by a sputtering method.

The insulator 280 was formed using a stack including a 40-nm-thick aluminum oxide film and an 800-nm-thick silicon oxide film. The 40-nm-thick aluminum oxide film was formed by a sputtering method until a thickness of 30 nm was reached, and then by an ALD method until a thickness of 40 nm was reached. Note that after the aluminum oxide film was formed, heat treatment at 400° C. was performed in an oxygen atmosphere for one hour. The silicon oxide film was formed by a PECVD method. After the silicon oxide film was formed, planarization was performed by a CMP method.

Figure 35:
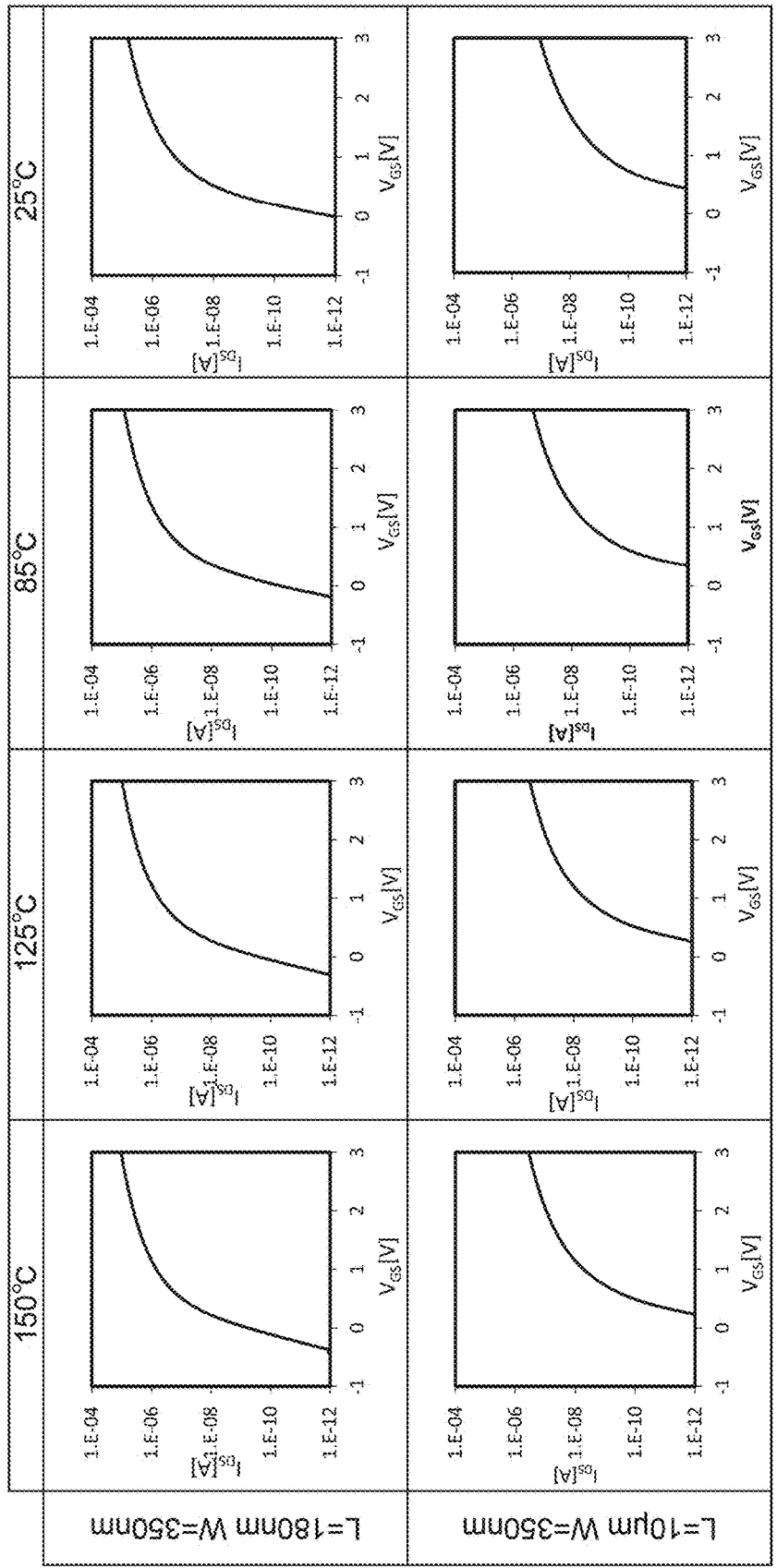
FIG. 35 shows $V_{GS}$-$I_{DS}$ characteristics of fabricated transistors.

FIG. 35 shows the $V_{GS}$-$I_{DS}$ characteristics of the fabricated transistors. The measurement was performed on the transistors with channel lengths L of 180 nm and 10 μm. The measurement temperature was 150° C., 125° C., 85° C., and 25° C., and $V_{DS}$ was 3.3 V.

The results in FIG. 35 show that $V_{th}$ of the transistor with a channel length L of 10 μm is higher than that of the transistor with a channel length L of 180 nm (the $V_{GS}$-$I_{DS}$ curve of the former transistor is shifted in the positive direction).

Figure 36:
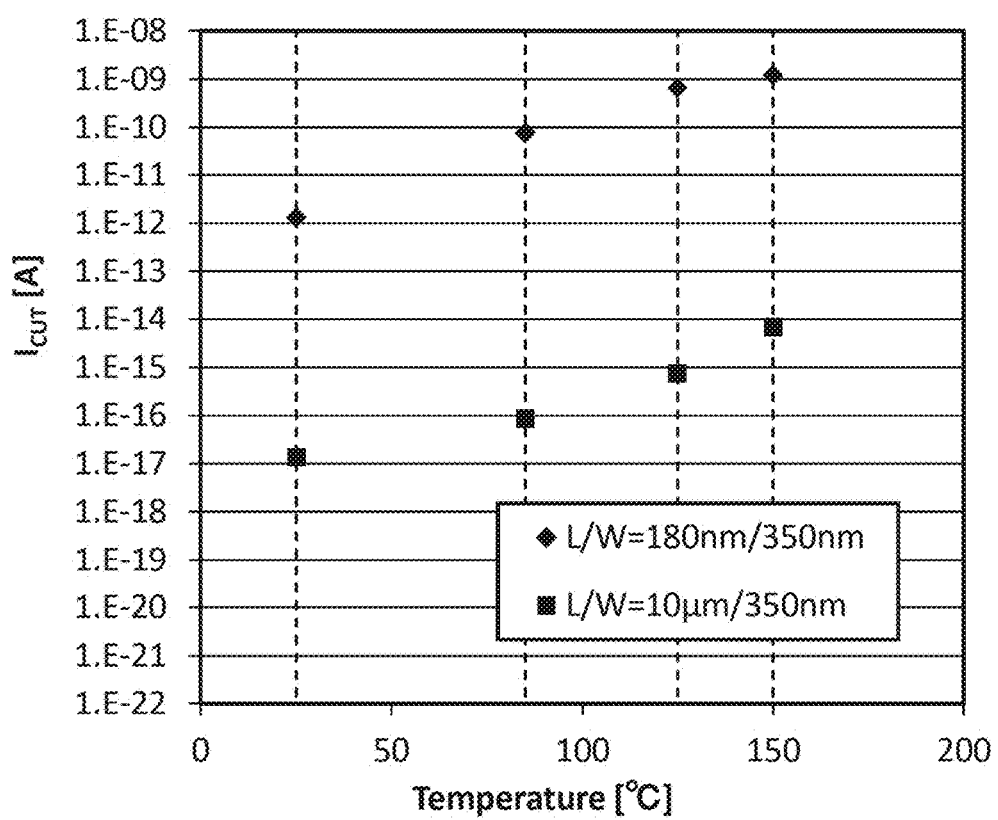
FIG. 36 shows cutoff current of fabricated transistors.

FIG. 36 shows cutoff current calculated from FIG. 35. The horizontal axis represents the measurement temperature, and the vertical axis represents the cutoff current ($I_{CUT}$). Note that the cutoff current of the transistor with a channel length L of 10 μm was calculated by extrapolation of a graph in FIG. 35.

The results in FIG. 36 show that the cutoff current is lower when the channel length is longer.

The above results show that the channel lengths of the transistors M11, M12, and M14 used in the voltage holding circuit in Embodiment 1 are preferably long. In particular, the channel lengths are preferably 10 μm or longer.

Example 2

In this example, device simulation shows that the cutoff current of a transistor including an In—Ga—Zn oxide semiconductor in a channel formation region can be low when the ratio of the number of Ga atoms to the number of In atoms is high.

Figure 37:
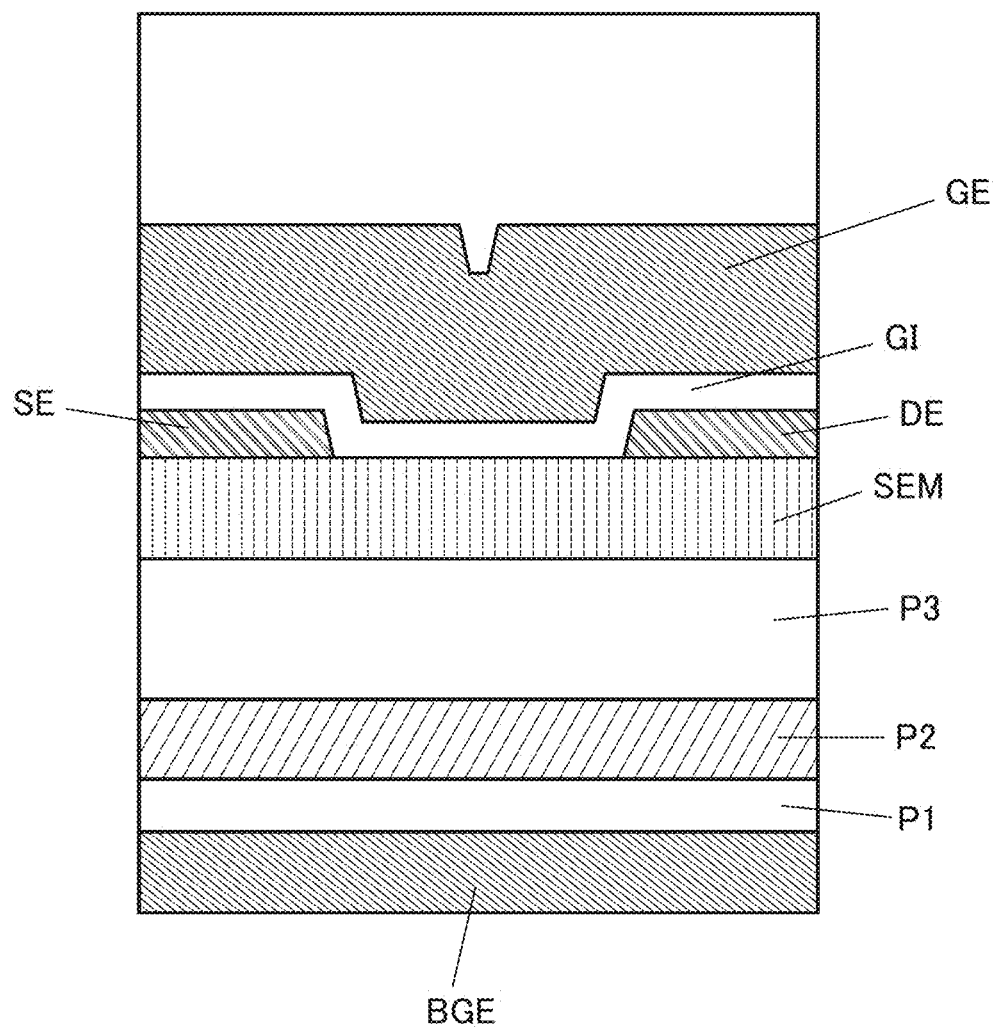
FIG. 37 is a structure of a transistor used in device simulation.

The transistor structure assumed in this device simulation is illustrated in FIG. 37. In FIG. 37, an electrode BGE is a back gate electrode, insulators P1 to P3 are back gate insulators, a semiconductor SEM is a channel formation region, an electrode SE is a source electrode, an electrode DE is a drain electrode, an insulator GI is a gate insulator, and an electrode GE is a gate electrode.

The simulation is performed using device simulation software "Atlas" produced by Silvaco, Inc. The parameters assumed in this device simulation are listed in Table 3. The semiconductor SEM is assumed to be an In—Ga—Zn oxide semiconductor.

TABLE 3

| Size | | L | 10 | μm |
|---|---|---|---|---|
| | | W | 0.35 | μm |
| SEM | IGZO(111) | Electron Affinity | 4.7 | eV |
| | | Band Gap | 3.2 | eV |
| | | Electron Mobility | 10 | cm$^2$/Vs |
| | IGZO(134) | Electron Affinity | 4.5 | eV |
| | | Band Gap | 3.4 | eV |
| | | Electron Mobility | 0.1 | cm$^2$/Vs |
| | IGZO(164) | Electron Affinity | 4.2 | eV |
| | | Band Gap | 3.8 | eV |
| | | Electron Mobility | 0.1 | cm$^2$/Vs |
| | | Permittivity | 15 | |
| | | Donor (Channel) | $1.4 \times 10^{-10}$ | cm$^{-3}$ |
| | | Donor (S/D) | $5 \times 10^{-18}$ | cm$^{-3}$ |
| | | Hole Mobility | 0.01 | cm$^2$/Vs |
| | | Effective DOS (Conduction Band) | $5 \times 10^{-18}$ | cm$^{-3}$ |
| | | Effective DOS (Valence Band) | $5 \times 10^{-18}$ | cm$^{-3}$ |
| | | Thickness | 20 | nm |
| GI | | Thickness | 13 | nm |
| | | Dielectric constant | 4.1 | |
| P1/P2/P3 | | Thickness (P1/P2/P3) | 10/20/30 | nm |
| | | Dielectric constant (P1, P3) | 4.1 | |
| | | Dielectric constant (P2) | 9.3 | |
| GE | | Work Function | 5.0 | eV |
| | | Thickness | 165 | nm |
| BGE | | Work Function | 5.0 | eV |
| | | Thickness | 155 | nm |
| SE, DE | | Work Function (SEM = IGZO(111)) | 4.6 | eV |
| | | Work Function (SEM = IGZO(134)) | 4.5 | eV |
| | | Work Function (SEM = IGZO(164)) | 4.2 | eV |
| | | Thickness | 50 | nm |

In this example, three types of transistors whose semiconductors SEM (IGZO(111), IGZO(134), and IGZO(164)) have different physical property values are assumed.

IGZO(111) is assumed to be a semiconductor layer formed by a sputtering method using an In—Ga—Zn oxide semiconductor target having a ratio of In:Ga:Zn=1:1:1. The bandgap is assumed to be 3.2 eV.

IGZO(134) is assumed to be a semiconductor layer formed by a sputtering method using an In—Ga—Zn oxide semiconductor target having a ratio of In:Ga:Zn=1:3:4. The bandgap is assumed to be 3.4 eV.

IGZO(164) is assumed to be a semiconductor layer formed by a sputtering method using an In—Ga—Zn oxide semiconductor target having a ratio of In:Ga:Zn=1:6:4. The bandgap is assumed to be 3.8 eV.

Figure 38:
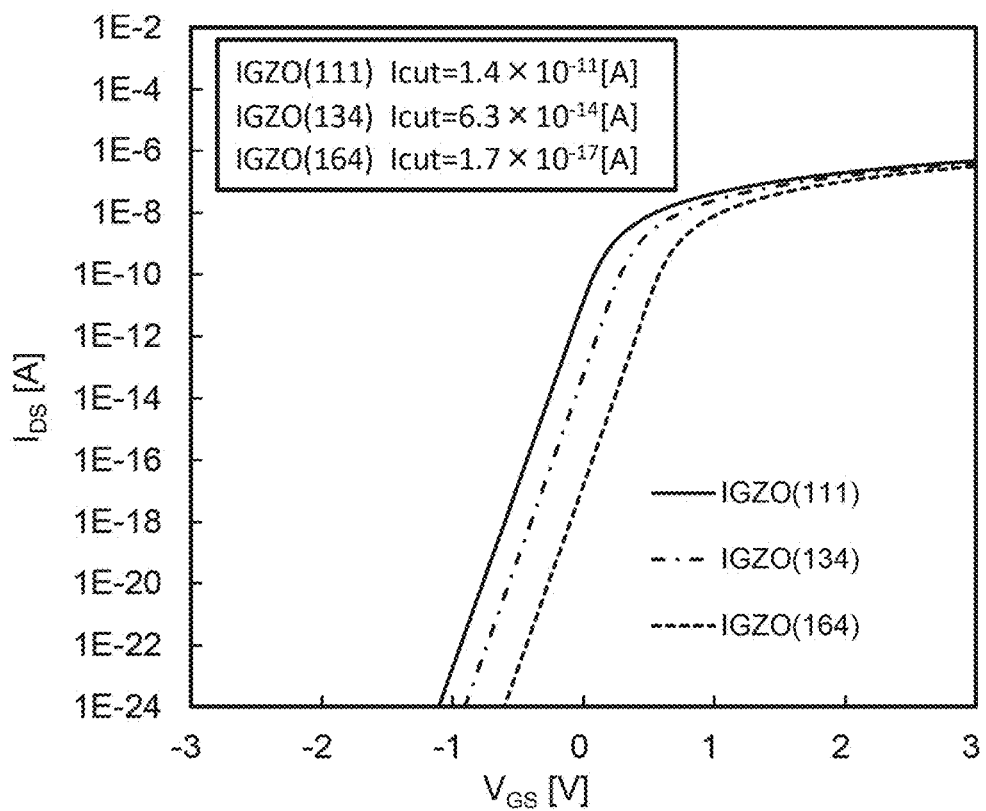
FIG. 38 shows $V_{GS}$-$I_{DS}$ characteristics and cutoff current calculated by device simulation.

The calculation results are shown in FIG. 38. FIG. 38 shows the $V_{GS}$-$I_{DS}$ characteristics of the transistors at $V_{DS}$=3.3 V. The device temperature is assumed to be 150° C. The cutoff current ($I_{CUT}$) calculated from the $V_{GS}$-$I_{DS}$ characteristics is shown in the graph.

The calculation results in FIG. 38 show that as the bandgap of the semiconductor SEM becomes wider and the electron affinity becomes lower, the cutoff current becomes low. That is, the calculation results in FIG. 38 show that in an In—Ga—Zn oxide semiconductor, as the ratio of the number of Ga atoms to the number of In atoms becomes higher, the cutoff current becomes low.

This application is based on Japanese Patent Application serial no. 2015-247680 filed with Japan Patent Office on Dec. 18, 2015, the entire contents of which are hereby incorporated by reference.

What is claimed is:

1. A semiconductor device comprising:
    a first transistor comprising a first gate, a second gate, and a first oxide semiconductor in a channel formation region;
    a second transistor comprising a third gate, a fourth gate, and a second oxide semiconductor in a channel formation region; and
    a circuit configured to generate a negative potential,
    wherein the first gate of the first transistor and the second gate of the first transistor overlap with each other in a region with the first oxide semiconductor of the first transistor between the first gate of the first transistor and the second gate of the first transistor,
    wherein the third gate of the second transistor is electrically connected to one of a source and a drain of the second transistor,
    wherein the one of the source and the drain of the second transistor is electrically connected to the second gate of the first transistor,
    wherein the other of the source and the drain of the second transistor is electrically connected to the circuit,
    wherein the fourth gate of the second transistor is electrically connected to the third gate of the second transistor,
    wherein each of the first oxide semiconductor of the first transistor and the second oxide semiconductor of the second transistor comprises In and Ga, and
    wherein a bandgap of the second oxide semiconductor of the second transistor is wider than a bandgap of the first oxide semiconductor of the first transistor.

2. The semiconductor device according to claim 1, wherein a ratio of a number of Ga atoms to a number of In atoms in the second oxide semiconductor of the second transistor is higher than a ratio of a number of Ga atoms to a number of In atoms in the first oxide semiconductor of the first transistor.

3. A memory device comprising the semiconductor device according to claim 1.

4. An electronic device comprising:
the semiconductor device according to claim 1; and
a display device, a microphone, a speaker, an operation key, or a housing.

5. A semiconductor device comprising:
a first transistor comprising a first gate, a second gate, and a first oxide semiconductor in a channel formation region;
a second transistor comprising a third gate, a fourth gate, and a second oxide semiconductor in a channel formation region;
a third transistor;
a capacitor; and
a circuit configured to generate a negative potential,
wherein the first gate of the first transistor and the second gate of the first transistor overlap with each other in a region with the first oxide semiconductor of the first transistor between the first gate of the first transistor and the second gate of the first transistor,
wherein the third gate of the second transistor is electrically connected to a gate of the third transistor and a first terminal of the capacitor,
wherein one of a source and a drain of the second transistor is electrically connected to the second gate of the first transistor,
wherein the other of the source and the drain of the second transistor is electrically connected to the circuit,
wherein the fourth gate of the second transistor is electrically connected to the third gate of the second transistor,
wherein each of the first oxide semiconductor of the first transistor and the second oxide semiconductor of the second transistor comprises In and Ga, and
wherein a bandgap of the second oxide semiconductor of the second transistor is wider than a bandgap of the first oxide semiconductor of the first transistor.

6. The semiconductor device according to claim 5, wherein the bandgap of the second oxide semiconductor of the second transistor is greater than or equal to 2.2 eV.

7. The semiconductor device according to claim 5, wherein a ratio of a number of Ga atoms to a number of In atoms in the second oxide semiconductor of the second transistor is higher than a ratio of a number of Ga atoms to a number of In atoms in the first oxide semiconductor of the first transistor.

8. A memory device comprising the semiconductor device according to claim 5.

9. An electronic device comprising:
the semiconductor device according to claim 5; and
a display device, a microphone, a speaker, an operation key, or a housing.

10. The semiconductor device according to claim 1, further comprising a capacitor,
wherein a first terminal of the capacitor is electrically connected to the one of the source and the drain of the second transistor.

11. A semiconductor device comprising:
a first transistor comprising a first gate, a second gate, and a first oxide semiconductor in a channel formation region;
a second transistor comprising a third gate, a fourth gate, and a second oxide semiconductor in a channel formation region; and
a circuit configured to generate a negative potential,
wherein the first gate of the first transistor and the second gate of the first transistor overlap with each other in a region with the first oxide semiconductor of the first transistor between the first gate of the first transistor and the second gate of the first transistor,
wherein the third gate of the second transistor is electrically connected to one of a source and a drain of the second transistor,
wherein the one of the source and the drain of the second transistor is electrically connected to the second gate of the first transistor,
wherein the other of the source and the drain of the second transistor is electrically connected to the circuit,
wherein the fourth gate of the second transistor is electrically connected to the third gate of the second transistor, and
wherein each of the first oxide semiconductor of the first transistor and the second oxide semiconductor of the second transistor comprises In and Ga.

12. The semiconductor device according to claim 11, wherein a ratio of a number of Ga atoms to a number of In atoms in the second oxide semiconductor of the second transistor is higher than a ratio of a number of Ga atoms to a number of In atoms in the first oxide semiconductor of the first transistor.

13. A memory device comprising the semiconductor device according to claim 11.

14. An electronic device comprising:
the semiconductor device according to claim 11; and
a display device, a microphone, a speaker, an operation key, or a housing.

15. The semiconductor device according to claim 11, further comprising a capacitor,
wherein a first terminal of the capacitor is electrically connected to the one of the source and the drain of the second transistor.

* * * * *